US010121952B2

(12) United States Patent
Talapin et al.

(10) Patent No.: US 10,121,952 B2
(45) Date of Patent: Nov. 6, 2018

(54) MATERIALS AND METHODS FOR THE PREPARATION OF NANOCOMPOSITES

(71) Applicant: THE UNIVERSITY OF CHICAGO, Chicago, IL (US)

(72) Inventors: Dmitri V. Talapin, Riverside, IL (US); Maksym V. Kovalenko, Zurich (CH); Jong-Soo Lee, Chicago, IL (US); Chengyang Jiang, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 65 days.

(21) Appl. No.: 15/133,494

(22) Filed: Apr. 20, 2016

(65) Prior Publication Data
US 2016/0308107 A1 Oct. 20, 2016

Related U.S. Application Data

(63) Continuation of application No. 13/266,079, filed as application No. PCT/US2010/032246 on Apr. 23, 2010, now Pat. No. 9,346,998.

(60) Provisional application No. 61/264,790, filed on Nov. 28, 2009, provisional application No. 61/214,434, filed on Apr. 23, 2009.

(51) Int. Cl.
| | |
|---|---|
| C01B 19/00 | (2006.01) |
| H01L 35/16 | (2006.01) |
| B82Y 30/00 | (2011.01) |
| B82Y 40/00 | (2011.01) |
| C09K 11/02 | (2006.01) |
| C09K 11/56 | (2006.01) |
| C09K 11/88 | (2006.01) |
| C30B 7/00 | (2006.01) |
| C30B 29/40 | (2006.01) |
| C30B 29/46 | (2006.01) |
| C30B 29/60 | (2006.01) |
| C09D 1/00 | (2006.01) |
| C09D 5/22 | (2006.01) |
| C09D 5/24 | (2006.01) |
| H01B 1/06 | (2006.01) |
| H01B 1/10 | (2006.01) |

(52) U.S. Cl.
CPC .............. *H01L 35/16* (2013.01); *B82Y 30/00* (2013.01); *B82Y 40/00* (2013.01); *C01B 19/002* (2013.01); *C01B 19/007* (2013.01); *C09D 1/00* (2013.01); *C09D 5/22* (2013.01); *C09D 5/24* (2013.01); *C09K 11/025* (2013.01); *C09K 11/562* (2013.01); *C09K 11/565* (2013.01); *C09K 11/883* (2013.01); *C30B 7/00* (2013.01); *C30B 29/40* (2013.01); *C30B 29/46* (2013.01); *C30B 29/60* (2013.01); *H01B 1/06* (2013.01); *H01B 1/10* (2013.01); *C01P 2002/52* (2013.01); *C01P 2002/72* (2013.01); *C01P 2002/84* (2013.01); *C01P 2002/85* (2013.01); *C01P 2004/03* (2013.01); *C01P 2004/04* (2013.01); *C01P 2004/16* (2013.01)

(58) Field of Classification Search
USPC .......................................... 423/508; 252/502
See application file for complete search history.

(56) References Cited

U.S. PATENT DOCUMENTS

| | | |
|---|---|---|
| 5,368,701 A | 11/1994 | Warren et al. |
| 5,578,864 A | 11/1996 | Ochi et al. |
| 6,126,740 A | 10/2000 | Schulz et al. |
| 6,571,028 B1 | 5/2003 | LoCascio et al. |
| 6,611,640 B2 | 8/2003 | LoCasclo et al. |
| 6,697,548 B2 | 2/2004 | LoCascio et al. |
| 6,710,911 B2 | 3/2004 | LoCascio et al. |
| 6,872,450 B2 | 3/2005 | Liu et al. |
| 7,095,959 B2 | 8/2006 | LoCascio et al. |
| 7,110,640 B2 | 9/2006 | LoCascio et al. |
| 7,192,780 B2 | 3/2007 | Liu et al. |
| 7,200,302 B2 | 4/2007 | LoCascio et al. |
| 7,200,318 B2 | 4/2007 | Banin et al. |
| 7,264,874 B2 | 9/2007 | Ryang |
| 7,341,734 B2 | 3/2008 | Gillies et al. |
| 7,348,224 B2 | 3/2008 | Yudasaka et al. |
| 7,399,429 B2 | 7/2008 | Liu et al. |

(Continued)

FOREIGN PATENT DOCUMENTS

| | | |
|---|---|---|
| WO | WO-01/88540 A1 | 11/2001 |
| WO | WO-03/057359 A2 | 7/2003 |

(Continued)

OTHER PUBLICATIONS

Kershaw et al. (Development of IR-Emitting Colloidal II-VI Quantum-Dot Material: Journal of selected topics in quantum electronics, vol. 6, No. 3, Jun. 2000.*

(Continued)

*Primary Examiner* — Monique R Peets
(74) *Attorney, Agent, or Firm* — Marshall, Gerstein & Borun LLP

(57) ABSTRACT

Disclosed herein is an isolable colloidal particle comprising a nanoparticle and an inorganic capping agent bound to the surface of the nanoparticle, a solution of the same, a method for making the same from a biphasic solvent mixture, and the formation of structures and solids from the isolable colloidal particle. The process can yield photovoltaic cells, piezoelectric crystals, thermoelectric layers, optoelectronic layers, light emitting diodes, ferroelectric layers, thin film transistors, floating gate memory devices, imaging devices, phase change layers, and sensor devices.

12 Claims, 32 Drawing Sheets

(56) References Cited

U.S. PATENT DOCUMENTS

| | | |
|---|---|---|
| 7,457,508 B2 | 11/2008 | Chen et al. |
| 7,482,059 B2 | 1/2009 | Peng et al. |
| 7,485,526 B2 | 2/2009 | Mouli et al. |
| 7,517,702 B2 | 4/2009 | Halilov et al. |
| 7,517,718 B2 * | 4/2009 | Mitzi .................... B82Y 30/00 438/93 |
| 7,524,746 B2 | 4/2009 | Locascio et al. |
| 7,572,973 B2 | 8/2009 | Weaver, Jr. et al. |
| 7,602,105 B2 | 10/2009 | Auciello |
| 7,615,400 B2 | 11/2009 | Goto et al. |
| 7,670,907 B2 | 3/2010 | Korber |
| 7,681,290 B2 | 3/2010 | Clingman et al. |
| 7,710,001 B2 | 5/2010 | Morris et al. |
| 7,723,744 B2 | 5/2010 | Gillies et al. |
| 7,754,329 B2 | 7/2010 | Liu et al. |
| 7,758,979 B2 | 7/2010 | Akiyama et al. |
| 7,804,587 B2 | 9/2010 | Sanchez et al. |
| 7,807,520 B2 | 10/2010 | Kimura |
| 7,834,483 B2 | 11/2010 | Kearney-Fischer et al. |
| 7,850,777 B2 | 12/2010 | Peng et al. |
| 7,932,101 B2 | 4/2011 | Lung |
| 7,968,861 B2 | 6/2011 | Burr et al. |
| 7,999,176 B2 | 8/2011 | Flood |
| 8,050,303 B2 | 11/2011 | Spariosu et al. |
| 9,346,998 B2 | 5/2016 | Talapin et al. |
| 2004/0086444 A1 | 5/2004 | Green |
| 2006/0135662 A1 | 6/2006 | Mullen |
| 2007/0042507 A1 | 2/2007 | Tsang et al. |
| 2007/0092606 A1 | 4/2007 | Klar |
| 2007/0095061 A1 | 5/2007 | Borgesen |
| 2007/0103310 A1 | 5/2007 | Hopman et al. |
| 2007/0112088 A1 | 5/2007 | Watanabe |
| 2007/0117668 A1 | 5/2007 | Sowul et al. |
| 2007/0117672 A1 | 5/2007 | Elvins |
| 2007/0117698 A1 | 5/2007 | Adamson |
| 2007/0120877 A1 | 5/2007 | Ito |
| 2007/0143197 A1 | 6/2007 | Ineke et al. |
| 2007/0143227 A1 | 6/2007 | Kranzley et al. |
| 2007/0190670 A1 | 8/2007 | Forest |
| 2008/0012001 A1 | 1/2008 | Gillies |
| 2008/0027190 A1 | 1/2008 | Tonti et al. |
| 2008/0033388 A1 | 2/2008 | Mueller et al. |
| 2008/0038558 A1 | 2/2008 | Landry et al. |
| 2008/0043014 A1 | 2/2008 | Tachi et al. |
| 2008/0049129 A1 | 2/2008 | Meacham |
| 2008/0063652 A1 | 3/2008 | Pykett et al. |
| 2008/0063653 A1 | 3/2008 | Schlom et al. |
| 2008/0063657 A1 | 3/2008 | Powell et al. |
| 2008/0063658 A1 | 3/2008 | Olalde Rangel |
| 2008/0070028 A1 | 3/2008 | Harada et al. |
| 2008/0073710 A1 | 3/2008 | Yamamoto |
| 2008/0073774 A1 | 3/2008 | Yang et al. |
| 2008/0082047 A1 | 4/2008 | Harmon |
| 2008/0085210 A1 | 4/2008 | Griesbach et al. |
| 2008/0085974 A1 | 4/2008 | Sortwell |
| 2008/0095081 A1 | 4/2008 | Legg et al. |
| 2008/0100885 A1 | 5/2008 | Onishi |
| 2008/0105792 A1 | 5/2008 | Zhang et al. |
| 2008/0106040 A1 | 5/2008 | Zielke et al. |
| 2008/0108798 A1 | 5/2008 | Lipovsek et al. |
| 2008/0111947 A1 | 5/2008 | Epstein et al. |
| 2008/0112886 A1 | 5/2008 | Mitragotri et al. |
| 2008/0116079 A1 | 5/2008 | Miyagawa et al. |
| 2008/0121903 A1 | 5/2008 | Hiramatsu et al. |
| 2008/0121955 A1 | 5/2008 | Shieh et al. |
| 2008/0127460 A1 | 6/2008 | Severen et al. |
| 2008/0133660 A1 | 6/2008 | Salesky et al. |
| 2008/0138289 A1 | 6/2008 | Goronkin et al. |
| 2008/0173886 A1 | 7/2008 | Cheon et al. |
| 2008/0191604 A1 | 8/2008 | Morris et al. |
| 2008/0202383 A1 | 8/2008 | Shi |
| 2008/0230750 A1 | 9/2008 | Gillies et al. |
| 2008/0237546 A1 | 10/2008 | LoCasio et al. |
| 2008/0246388 A1 | 10/2008 | Cheon et al. |
| 2008/0277626 A1 | 11/2008 | Yang et al. |
| 2008/0283830 A1 | 11/2008 | Ahn et al. |
| 2009/0002512 A1 | 1/2009 | Suzuki et al. |
| 2009/0002551 A1 | 1/2009 | Yamamoto |
| 2009/0008442 A1 | 1/2009 | Buchanan et al. |
| 2009/0009057 A1 | 1/2009 | Lee et al. |
| 2009/0011922 A1 | 1/2009 | de Rochemont |
| 2009/0014590 A1 | 1/2009 | Ponsart et al. |
| 2009/0014707 A1 | 1/2009 | Lu et al. |
| 2009/0017525 A1 | 1/2009 | Hernandez et al. |
| 2009/0035657 A1 | 2/2009 | Buiel et al. |
| 2009/0064476 A1 | 3/2009 | Cross et al. |
| 2009/0068755 A1 | 3/2009 | Steeves et al. |
| 2009/0072292 A1 | 3/2009 | Shum et al. |
| 2009/0099425 A1 | 4/2009 | Starr et al. |
| 2009/0123763 A1 | 5/2009 | Palazzolo et al. |
| 2009/0137053 A1 | 5/2009 | Kishii et al. |
| 2009/0145813 A1 | 6/2009 | Kim et al. |
| 2009/0151515 A1 | 6/2009 | Veltri |
| 2009/0246900 A1 | 10/2009 | Gilles |
| 2010/0014198 A1 | 1/2010 | Dusang, Jr. et al. |
| 2010/0014205 A1 | 1/2010 | Gerlach |

FOREIGN PATENT DOCUMENTS

| | | |
|---|---|---|
| WO | WO-2005/031802 A2 | 4/2005 |
| WO | WO-2005/110916 A2 | 11/2005 |
| WO | WO-2006/014576 A2 | 2/2006 |
| WO | WO-2006/017125 A2 | 2/2006 |
| WO | WO-2006/084013 A2 | 8/2006 |
| WO | WO-2006/135662 A2 | 12/2006 |
| WO | WO-2007009010 A2 | 1/2007 |
| WO | WO-2007009011 A2 | 1/2007 |
| WO | WO-2007/092606 A2 | 8/2007 |
| WO | WO-2007/095061 A2 | 8/2007 |
| WO | WO-2007/103310 A2 | 9/2007 |
| WO | WO-2007/106770 A2 | 9/2007 |
| WO | WO-2007/112088 A2 | 10/2007 |
| WO | WO-2007/117668 A2 | 10/2007 |
| WO | WO-2007/117672 A2 | 10/2007 |
| WO | WO-2007/117698 A2 | 10/2007 |
| WO | WO-2007/118118 A2 | 10/2007 |
| WO | WO-2007/120877 A2 | 10/2007 |
| WO | WO-2007/137292 A2 | 11/2007 |
| WO | WO-2007/143197 A2 | 12/2007 |
| WO | WO-2007/143227 A2 | 12/2007 |
| WO | WO-2007/147055 A2 | 12/2007 |
| WO | WO-2008/027190 A2 | 3/2008 |
| WO | WO-2008/033388 A2 | 3/2008 |
| WO | WO-2008/039912 A2 | 4/2008 |
| WO | WO-2008/043014 A1 | 4/2008 |
| WO | WO-2008/049129 A1 | 4/2008 |
| WO | WO-2008/057633 A1 | 5/2008 |
| WO | WO-2008/063652 A1 | 5/2008 |
| WO | WO-2008/063653 A1 | 5/2008 |
| WO | WO-2008/063657 A2 | 5/2008 |
| WO | WO-2008/063658 A2 | 5/2008 |
| WO | WO-2008/070028 A2 | 6/2008 |
| WO | WO-2008/073373 A1 | 6/2008 |
| WO | WO-2008/073710 A1 | 6/2008 |
| WO | WO-2008/073774 A1 | 6/2008 |
| WO | WO-2008/082047 A1 | 7/2008 |
| WO | WO-2008/085210 A2 | 7/2008 |
| WO | WO-2008/085974 A2 | 7/2008 |
| WO | WO-2008/094292 A1 | 8/2008 |
| WO | WO-2008/095081 A2 | 8/2008 |
| WO | WO-2008/100885 A1 | 8/2008 |
| WO | WO-2008100276 A2 | 8/2008 |
| WO | WO-2008/105792 A2 | 9/2008 |
| WO | WO-2008/106040 A2 | 9/2008 |
| WO | WO-2008/108798 A2 | 9/2008 |
| WO | WO-2008/111947 A1 | 9/2008 |
| WO | WO-2008/112886 A1 | 9/2008 |
| WO | WO-2008/116079 A1 | 9/2008 |
| WO | WO-2008/127460 A2 | 10/2008 |
| WO | WO-2008/133660 A2 | 11/2008 |
| WO | WO-2009/002512 A1 | 12/2008 |
| WO | WO-2009/002551 A1 | 12/2008 |
| WO | WO-2009/011922 A1 | 1/2009 |
| WO | WO-2009/014590 A2 | 1/2009 |

(56) References Cited

FOREIGN PATENT DOCUMENTS

| WO | WO-2009/014707 A2 | 1/2009 |
|----|-------------------|--------|
| WO | WO-2009/017525 A2 | 2/2009 |
| WO | WO-2009/035657 A1 | 3/2009 |
| WO | WO-2009/099425 A2 | 8/2009 |
| WO | WO-2009/123763 A2 | 10/2009 |
| WO | WO-2009/137053 A1 | 11/2009 |
| WO | WO-2009/145813 A1 | 12/2009 |
| WO | WO-2009/151515 A1 | 12/2009 |
| WO | WO-2010/014198 A1 | 2/2010 |
| WO | WO-2010/014205 A1 | 2/2010 |

OTHER PUBLICATIONS

Corbett, Polyatomic zintl anions of the post-transition elements, Chem. Rev., 85:383-97 (1985).

International Preliminary Report on Patentability, International Application No. PCT/US10/32246, (dated Oct. 25, 2011).

International Search Report and Written Opinion from corresponding International Application No. PCT/US10/32246 (dated Nov. 8, 2010).

Kershaw et al., Development of IR-emitting colloidal II-VI quantum-dot materials, IEEE J. Sel. Topics Quantum Electronics, 6:534-43 (May/Jun. 2000).

Lee et al., Full color emission from II-VI semiconductor quantum dot-polymer composites, Advanced Materials, 12:1102 (2000).

Roof et al., New developments in the coordination chemistry of inorganic selenide and telluride ligands, Chem. Rev., 93:1037-80 (1993).

\* cited by examiner

PbS-AsS$_3^{3-}$-DDAB nanocrystals

CdSe-AsS$_3^{3-}$-DDAB nanocrystals

PbSe-AsS$_3^{3-}$-DDAB NCs

Au-AsS$_3^{3-}$-DDAB NCs

Pd-AsS$_3^{3-}$-DDAB NCs, MCC144

CdSrods-AsS$_3^{3-}$-DDAB

CdSe NCs + Au NCs

AlB$_2$ type structure

MCC101

PbS NCs + Au NCs

NaZn$_{13}$ type structure

MATERIALS AND METHODS FOR THE PREPARATION OF NANOCOMPOSITES

STATEMENT OF GOVERNMENTAL INTEREST

This invention was made with governmental support under grant number DMR-0847535 awarded by the National Science Foundation and grant number DE-AC02-06CH11357 awarded by the Department of Energy. The government has certain rights in the invention.

BACKGROUND OF THE INVENTION

Field of the Disclosure

The disclosure generally relates to materials and methods for the preparation of nanocomposites. More specifically, the disclosure relates to inorganic capped colloidal materials and the methods of depositing these inorganic capped colloidal materials on a substrate to form nanocomposites. Still more specifically, the disclosure relates to the selective deposition and formation of nanocomposites on a substrate.

Brief Description of Related Technology

Nanoscale materials, materials with at least one dimension between about 1 and 1000 nm, have increasingly garnered attention due to their potential electronic, photophysical, chemical, and medicinal effects. The large-scale industrial application of nanoscale materials has generally focused on the formation of nanometer thick films and/or nanometer wide wires. Many of these industrially-applied nanoscale materials display extraordinary electronic and photophysical properties, but more often the materials lack the features that originally drew scientific interest toward nanocrystals, nanorods, and nanowires.

Attempts to incorporate the physical properties of nanocrystals, nanorods, and nanowires into films or bulk solids have led to the self-assembly of ordered nanoarrays. These self-assembled ordered nanoarrays have been produced from stable colloidal solutions of nanomaterials. For example, close-packed nanocrystal films have been made by spin-coating or drop casting of colloidal solutions. Often these films show short range ordering, but forces such as entropy, electrostatics, and van der Waals interactions can cause these materials to self-assemble into superlattices. These techniques have afforded binary superlattices with tunable electronic structures based on the colloidal materials employed in the synthesis.

Though some single-component and binary superlattices exhibit desirable physical and electronic properties, these materials are not robust enough for large scale advanced material applications and their synthesis is not general enough to provide easy production of idealized materials.

A larger-scale approach to the synthesis of solid state materials encompassing nanocrystals is the impregnation and forced crystallization of nanocrystals from melts of inorganic materials. This rapid quenching approach can provide nanocrystalline material in bulk inorganic phases but lacks any methodology for the formation of ordered nanoarrays in the bulk material.

While the synthesis of solid state materials with ordered arrays of nanoscale materials has progressed to the point where nanocrystals can be deposited in ordered arrays on a surface, the use of these ordered arrays are hampered by the insulating ligands generally used in the manufacture of the nanocrystal. The practical use of these nanocrystals has been discovered through the blending of these organic soluble nanocrystals with polymers. See for example U.S. Pat. No. 7,457,508. For example, nanocomposites of nanocrystals and conjugated polymers can yield tunable semiconducting photonic structures, and with unique optical, electrical, magnetic, electrochromic, and chemical properties. See for example U.S. Pat. No. 7,200,318.

The majority of applications wherein these advanced materials would be applicable employ inorganic solids as the functional material. One example of an applicable inorganic solid that incorporates nanoscale materials is the fabrication of inorganic nanocomposites described in U.S. Pat. No. 7,517,718. This methodology involves the codeposition of a nanocrystalline material with an inorganic matrix precursor from a homogeneous hydrazine solution, a technique similar to the deposition of nanocrystalline materials in polymers as described in J. W. Lee et al., *Advanced Materials* 2000, 12, 1102. This methodology fails to provide the selectivity of structure for the synthesis of tunable semiconducting materials, does not prevent the carbon contamination of the synthesized inorganic nanocomposite, and requires a highly toxic, hypergolic solvent. Hence, the industrial applicability of the methodology is limited by material requirements, and the overwhelming health and safety concerns.

Examples of materials and devices applicable to the current invention are described in the following U.S. Pat. Nos. 6,571,028; 6,611,640; 6,710,911; 7,095,959; 6,697,548; 7,110,640; 7,200,302; 6,872,450; 7,192,780; 7,482,059; 7,399,429; 7,341,734; and 7,524,746; the following U.S. patent application Ser. Nos. 11/403,090; 11/484,785; 11/679,746; 11/680,047; 11/680,344; 11/683,880; 11/687,306; 11/747,701; 11/752,748; 11/863,129; 11/866,974; 11/896,549; 11/952,783; 12/048,061; 12/052,380; and 12/350,615; and the following International Patent Applications: PCT/2005/016481; PCT/2005/024131; PCT/2005/024211; PCT/2006/003652; PCT/2006/027124; PCT/2006/027125; PCT/2007/015851; PCT/2007/025235; PCT/2007/063788; PCT/2007/063788; PCT/2007/065951; PCT/2007/065951; PCT/2007/069572; PCT/2007/069572; PCT/2007/071218; PCT/2007/071218; PCT/2007/071218; PCT/2007/072748; PCT/2007/072761; PCT/2007/079688; PCT/2007/079688; PCT/2007/080436; PCT/2007/082066; PCT/2007/085824; PCT/2007/086480; PCT/2007/086819; PCT/2007/086819; PCT/2008/052620; PCT/2008/052620; PCT/2008/053651; PCT/2008/056845; PCT/2008/057681; PCT/2007/003525; PCT/2007/003411; PCT/2007/005589; PCT/2007/007424; PCT/2007/008705; PCT/2007/008721; PCT/2007/008873; PCT/2007/009255; PCT/2007/013152; PCT/2007/013761; PCT/2007/019797; PCT/2007/024305; PCT/2007/024306; PCT/2007/024310; PCT/2007/024312; PCT/2007/024750; PCT/2007/019796; PCT/2007/014705; PCT/2007/014711; PCT/2007/014706; PCT/2007/024320; PCT/2008/007902; PCT/2008/008036; PCT/2008/008822; PCT/2008/007901; PCT/2008/008924; PCT/2008/010651; PCT/2008/013504; PCT/2009/002123; PCT/2009/002796; PCT/2009/001372; PCT/2009/002789; PCT/2009/004345; and PCT/2009/004354; each of which are incorporated by reference herein in their entirety.

SUMMARY OF THE INVENTION

Disclosed herein is a composition and a method for making that composition having a nanoparticle capped with an inorganic capping agent. The method generally includes at least two immiscible solvents and the exchange of an organic capping agent on a nanoparticle with the herein described inorganic capping agent.

Another aspect of the disclosure is a composition made of the nanoparticle and the inorganic capping agent. The composition is isolable, can be purified, and importantly may display approximately the same opto-electronic characteristics as the nanoparticle with an organic capping agent.

Yet another aspect of the disclosure is the deposition of the composition on a substrate. Herein, the composition can be deposited as thin or bulk films by a variety of techniques with short or long range ordering of the nanoparticles. The deposited composition, importantly, displays approximately the same opto-electronic characteristics as the composition in solution.

Still another aspect of the disclosure is the thermal decomposition of the deposited composition to form inorganic matrices with imbedded nanoparticles. The annealed composition has an inorganic matrix that corresponds to the thermal decomposition product of the inorganic capping agent. Additionally, as the annealed composition can be produced from the deposited composition with ordered nanoparticles (arrays), the annealed composition can have ordered arrays of nanoparticles in a solid state matrix. The annealed composition can also, importantly, display approximately the same optical characteristics as the deposited composition.

Additionally, the deposited composition can be thermally treated such that the composition partially or wholly anneals. The formed alloy can have discrete regions with elemental compositions that approximate the nanoparticle and the solid state matrix as made through the above referenced thermal decomposition or the alloy can be annealed to a single phase.

The herein disclosed materials and methods provide a route to new and useful solid state materials that can exhibit for example thermoelectric, piezoelectric, ferroelectric, phase change and electroluminescent characteristics. These solid state materials can be used in devices like photovoltaic cells, piezoelectric crystals, thermoelectric layers, optoelectronic layers, light emitting diodes, ferroelectric layers, thin film transistors, floating gate memory devices, phase change layers, detectors of light, X-ray and gamma radiation, imaging devices, and sensor devices. Uses of and methods of assembling such devices are generally described in U.S. Ser. No. 12/142,454, U.S. Pat. No. 7,348,224, U.S. Ser. No. 12/328,788, U.S. Ser. No. 11/865,325, U.S. Ser. No. 11/864,877, PCT/US2007/018015, U.S. Ser. No. 12/285,158, U.S. Ser. No. 12/108,500, U.S. Ser. No. 11/942,441, PCT/US2008/002246, U.S. Ser. No. 11/584,304, U.S. Ser. No. 12/241,333, U.S. Ser. No. 12/179,807, U.S. Ser. No. 12/155,015, PCT/US2006/022250, U.S. Pat. No. 7,517,702, U.S. Ser. No. 12/050,676, U.S. Ser. No. 12/130,075, U.S. Ser. No. 11/789,344, PCT/KR2007/002885, U.S. Ser. No. 11/704,623, U.S. Ser. No. 11/856,086, U.S. Ser. No. 11/604,746, PCT/US2008/000271, U.S. Pat. No. 7,485,526, U.S. Ser. No. 12/079,088, U.S. Ser. No. 12/032,252, PCT/US2008/005430, U.S. Ser. No. 12/050,284, and U.S. Ser. No. 11/803,261 all of which are incorporated herein by reference. Solid state materials in accordance with the descriptions herein may be used in assembling any of these and similar devices.

Additional features of the invention may become apparent to those skilled in the art from a review of the following detailed description, taken in conjunction with the drawings, the examples, and the appended claims.

BRIEF DESCRIPTION OF THE DRAWING FIGURES

For a more complete understanding of the disclosure, reference should be made to the following detailed description and accompanying drawings wherein:

FIG. 1 is a composite of transmission electron microscope (TEM) images. The top left image (A) is of 8.1 nm CdSe nanocrystals capped with $Sn_2S_6^{4-}$, herein denoted 8.1 nm $CdSe.Sn_2S_6$. The top right image (B) is of 5 nm $Au.Sn_2S_6$ nanocrystals. The bottom left image (C) is of $CdSe.Sn_2S_6$ nanowires, where the CdSe is 2-5 nm by 2-5 μm nanowires. The bottom right image (D) is of $CdSe/CdS.Sn_2S_6$ tetrapods, where the CdSe/CdS is a tetrapod.

FIG. 2 is a composite of TEM images. The top left image (A) is of $PbS.In_2Se_4$ nanocrystals. The top right image (B) is of $Au.In_2Se_4$ nanocrystals. The bottom left image (C) is of $CdSe/CdS.In_2Se_4$ nanorods. The bottom right image (D) is of $CdS.Sn_2S_6$ nanorods.

FIG. 3 is a TEM image of 5 nm $Au.Sn_2S_6$ nanocrystals showing the face-centered cubic superlattice formed from the deposition of the $Au.Sn_2S_6$ nanocrystals on a TEM substrate.

FIG. 4 is a composite of TEM images of 5 nm Au nanocrystals. The left image (A) is of Au.dodecanethiol, that is Au nanocrystals capped with dodecanethiol. The middle image (B) is of a single layer of $Au.Sn_2S_6$ nanocrystals in a cubic arrangement and the right image (C) is of a single layer of $Au.Sn_2S_6$ nanocrystals in a hexagonal arrangement.

FIG. 5 is energy dispersive X-ray (EDX) spectra of (Top) a sample of 4.6 nm $CdSe.Sn_2S_6$ nanocrystals and (bottom) a sample of 5 nm $Au.Sn_2S_6$ nanocrystals. The top spectrum shows an atomic composition of 46.4% Cd, 3.1% Sn, 39.0% Se and 11.5% S, which corresponds to approximately 95% CdSe and 5% $Sn_2S_6$. The bottom spectrum shows an approximate molar ratio of 90.5% Au to 9.5% $Sn_2S_6$.

Figure 9:
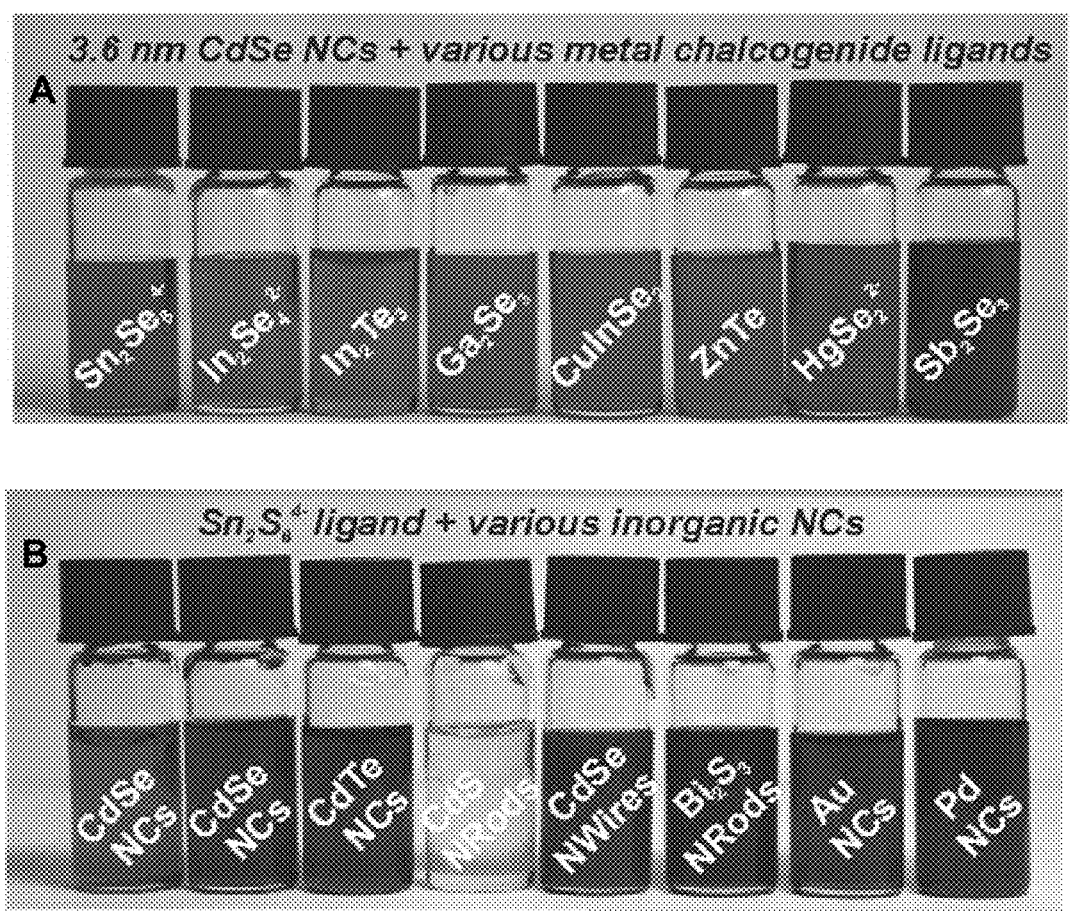

FIG. 9 is photographs of (A, top) stable colloidal solutions of 3.6 nm $CdS.Sn_2Se_6$, 3.6 nm $CdS.In_2Se_4$, 3.6 nm $CdS.In_2Te_3$, 3.6 nm $CdS.Ga_2Se_3$, 3.6 nm $CdS.CuInSe_2$, 3.6 nm $CdS.ZnTe$, 3.6 nm $CdS.HgSe_2^{2-}$, and 3.6 nm $CdS.Sb_2Se_3$; and (B, bottom) stable colloidal solutions of 3.6 nm $CdSe.Sn_2Se_6$, 5.8 nm $CdSe.Sn_2Se_6$, 9 nm $CdTe.Sn_2Se_6$, 5×60 nm (rods) $CdS.Sn_2Se_6$, 25 nm×2-5 μm (wires) $CdS.Sn_2Se_6$, 6 nm×25 nm (rods) $Bi_2S_3.Sn_2Se_6$, 5 nm $Au.Sn_2Se_6$, and 3 nm $Pd.Sn_2Se_6$.

Figure 10:
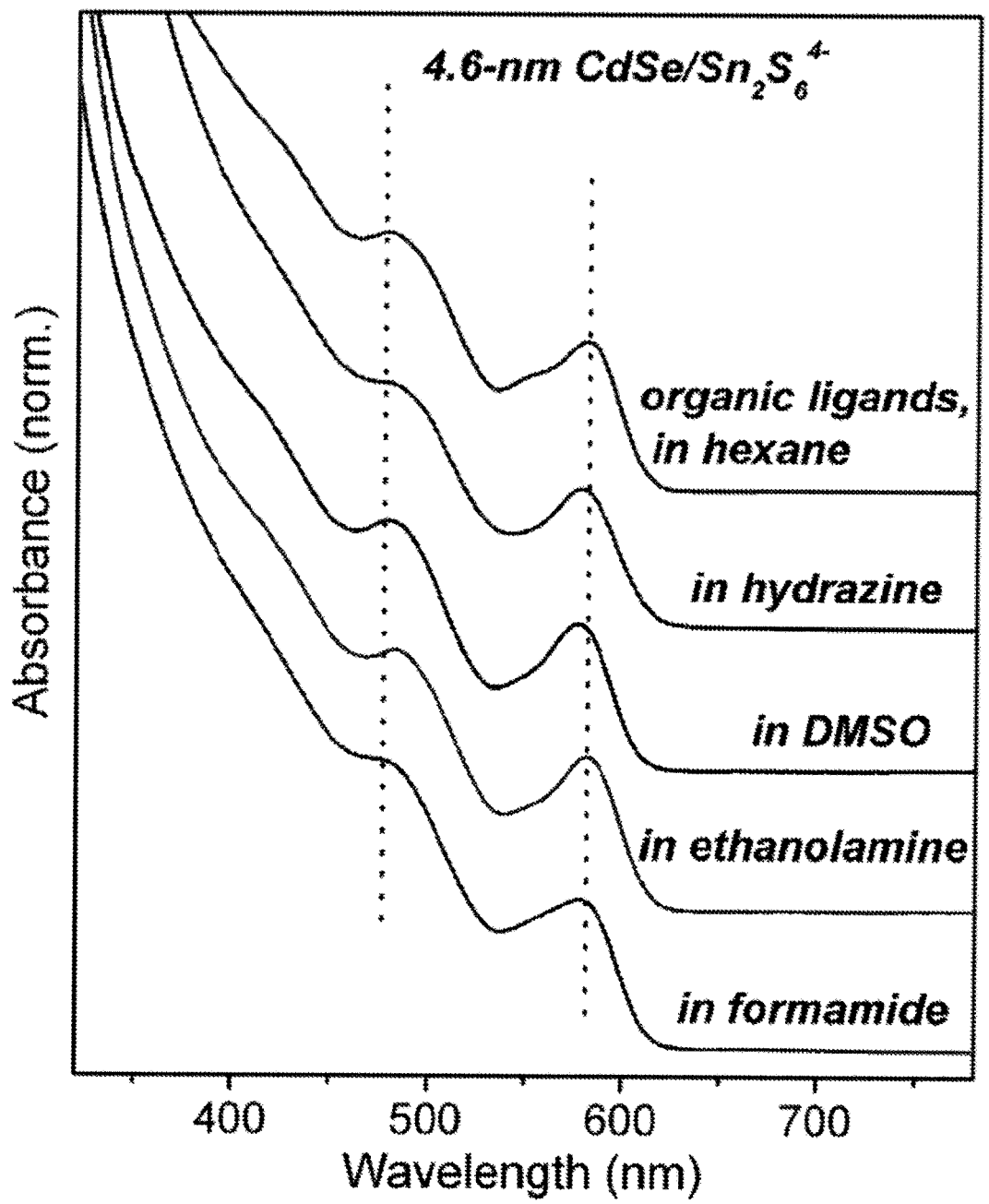

FIG. 10 is a plot comparing the optical absorbance spectra of 4.6 nm $CdSe.Sn_2Se_6$ in various solvents to the optical spectrum of 4.6 nm CdSe.(organic capping agent) in hexane. The $CdSe.Sn_2Se_6$ spectra were obtained for samples in hydrazine, dimethylsulfoxide, ethanolamine, and formamide.

Figure 11:
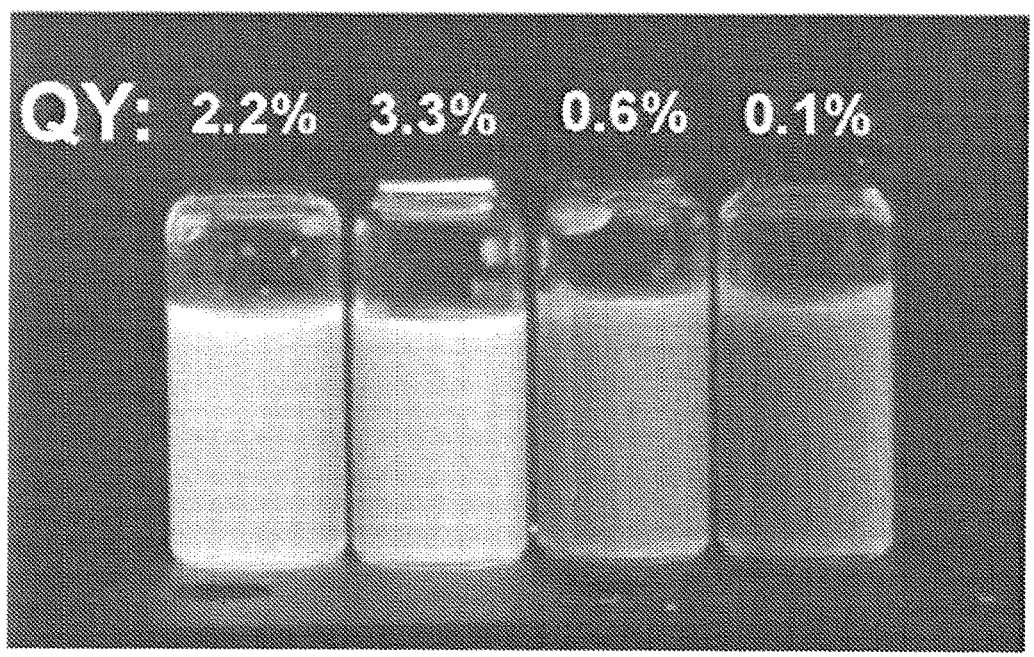

FIG. 11 is a photograph of 4.6 nm $CdSe.Sn_2Se_6$ in dimethylsulfoxide (DMSO), ethanolamine (EA), formamide (FA) and water (from left to right) under UV lamp excitation. The room temperature photoluminescence quantum yields (QY) are shown to illustrate the effect of solvent on the luminescent properties of semiconductor nanocrystals capped with inorganic capping agents.

Figure 12:
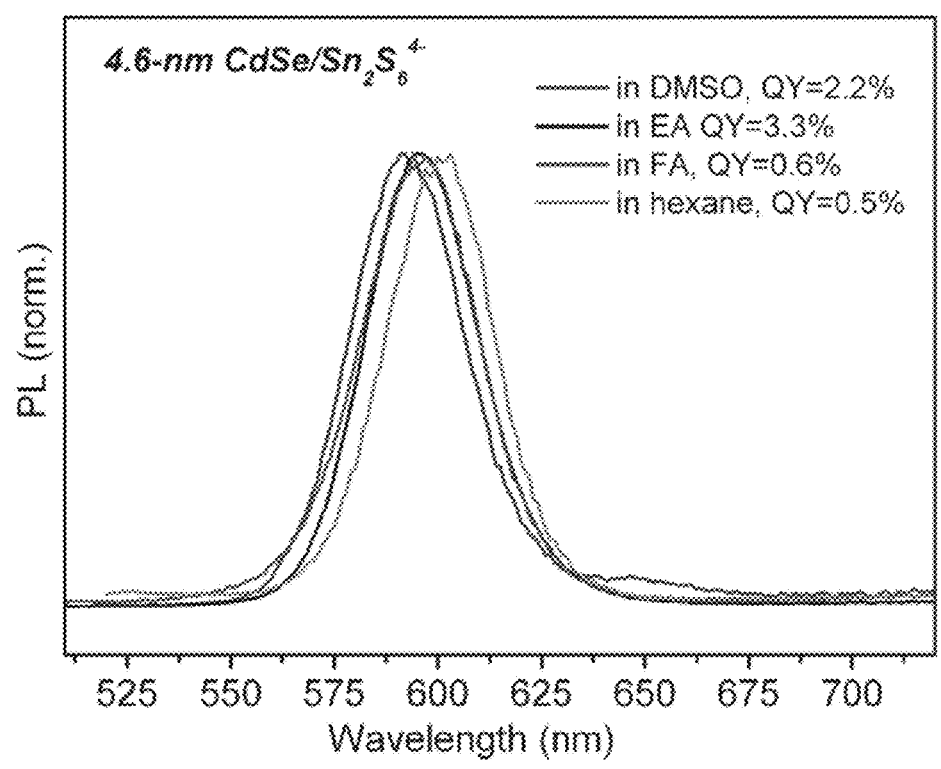
Figure 12:
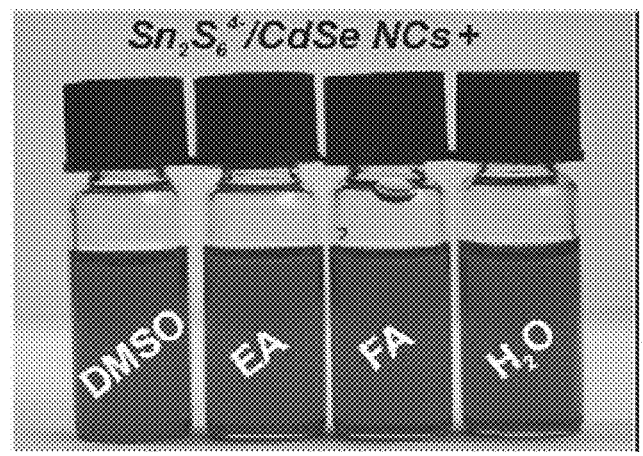

FIG. 12 is a plot of the photoluminescence spectra of 4.6 nm $CdSe.Sn_2Se_6$ in dimethylsulfoxide (DMSO), ethanolamine (EA), formamide (FA), and of 4.6 nm CdSe..(organic capping agent) in hexane, and photograph of 4.6 nm CdSe.Sn$_2$Se$_6$ in dimethylsulfoxide (DMSO), ethanolamine (EA), formamide (FA) and water (from left to right) under white light.

Figure 13:
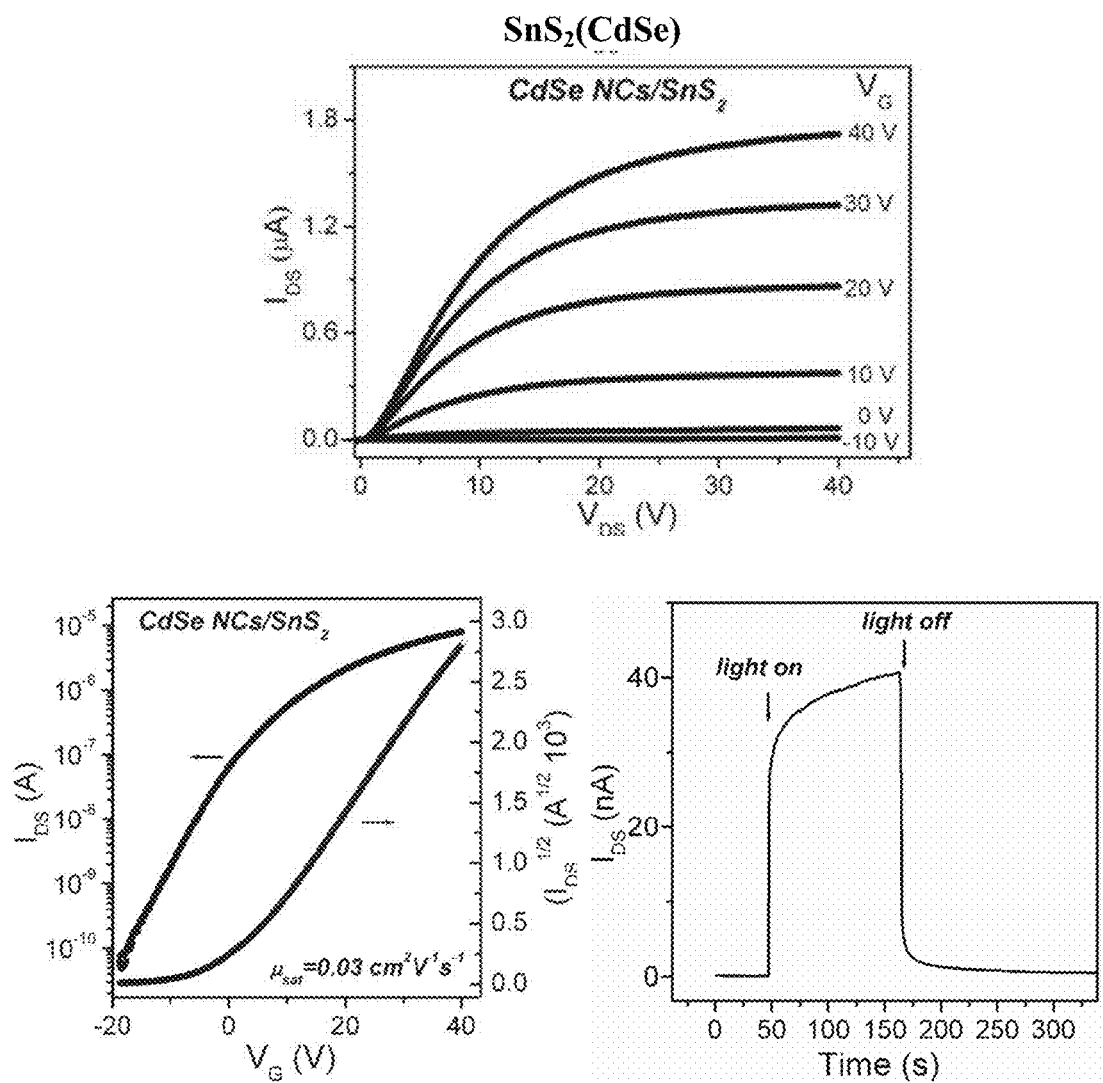

FIG. 13 is plots of (top) drain current I$_{DS}$ versus drain-source voltage V$_{DS}$ for a nanocrystal FET with a channel composed of 4.5 nm CdSe.Sn$_2$Se$_6$ and annealed at 200° C. (L=10-μm, W=3800-μm, 110 nm-thick SiO$_2$ gate dielectric); (left) the transfer characteristics for an FET with a channel assembled of CdSe.SnS$_2$: plot of drain current I$_{DS}$ vs. gate voltage V$_G$ at a constant source-drain voltage V$_{DS}$=40 V, field-effect mobility in the saturation regime was calculated from the slope of I$_{DS}$ ½ vs. VG; and (right) the effect of broad band light illumination (AM1.5 solar spectrum, ~20 mW cm$^{-2}$ light intensity) on the current flowing through a film of 5.5 nm CdSe.Sn$_2$Se$_6$ after the film was annealed at 200° C.

Figure 14:
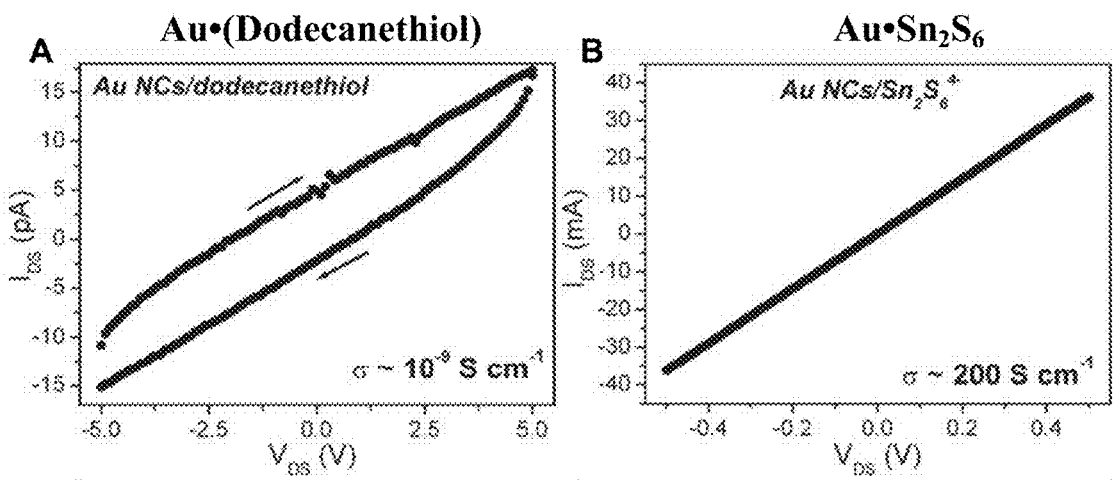

FIG. 14 is a comparison of I$_{DS}$-V$_{DS}$ scans for thin films made from 5 nm Au.(dodecanethiol), left (A), and 5 nm Au.Sn$_2$S$_6$, right (B).

Figure 15:
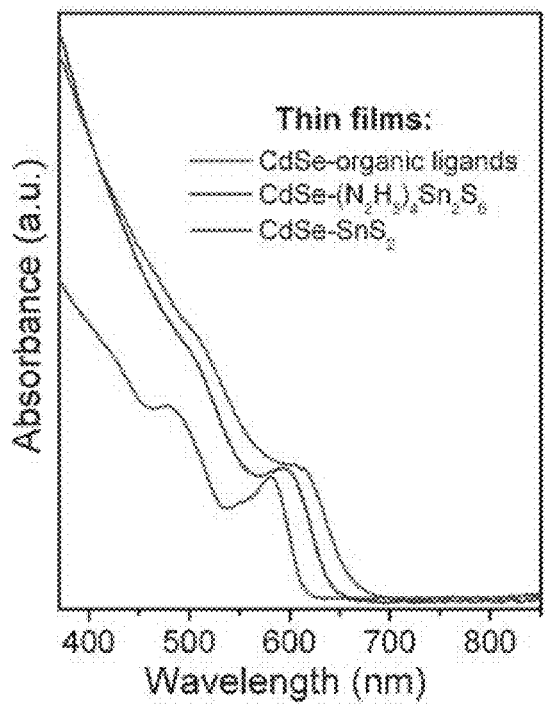

FIG. 15 is a plot of the optical absorbance spectra of thin films of CdSe.(organic capping agent), CdSe.Sn$_2$Se$_6$, and CdSe.SnSe$_2$ (made by annealing CdSe.Sn$_2$Se$_6$) showing insignificant changes in the absorption spectra.

Figure 16:
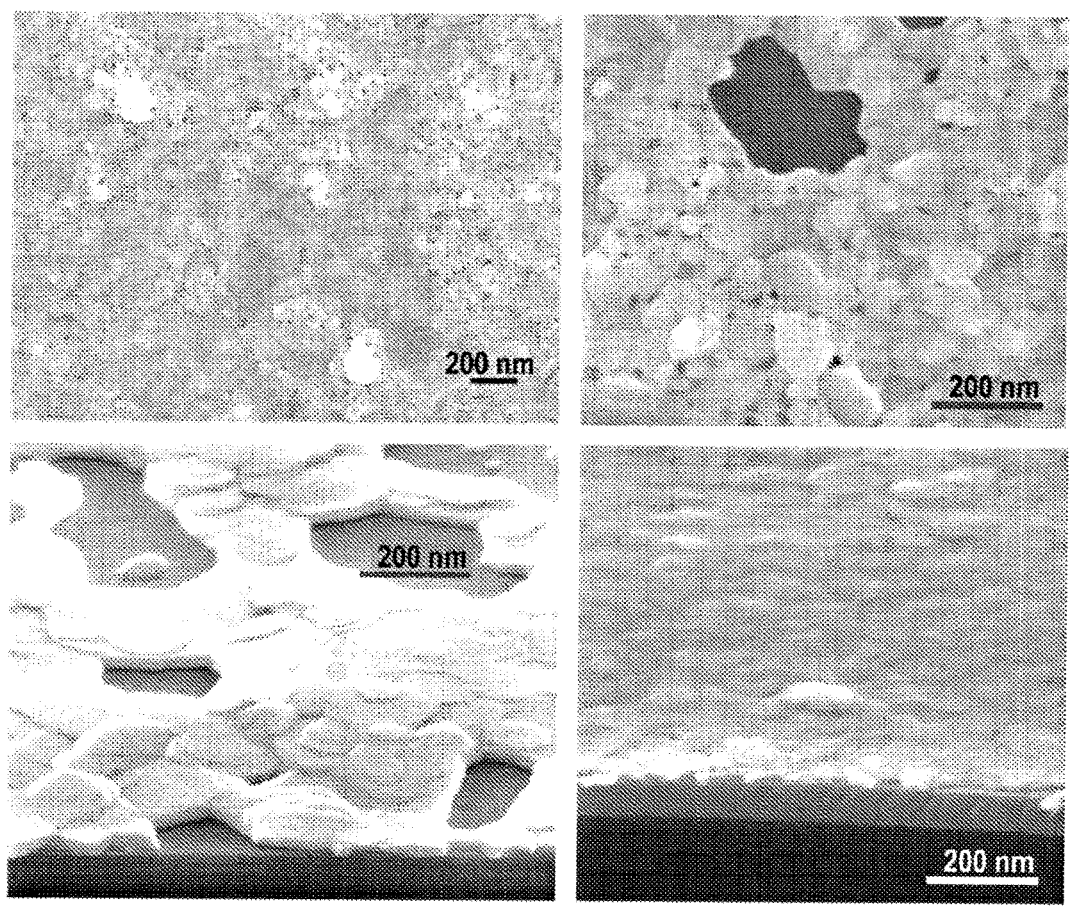

FIG. 16 is a composites of SEM images at different magnifications of a product formed by the annealing Bi$_2$S$_3$.Sb$_2$Te$_4$, where the product has an approximate formula BiSbTe$_3$.

Figure 17:
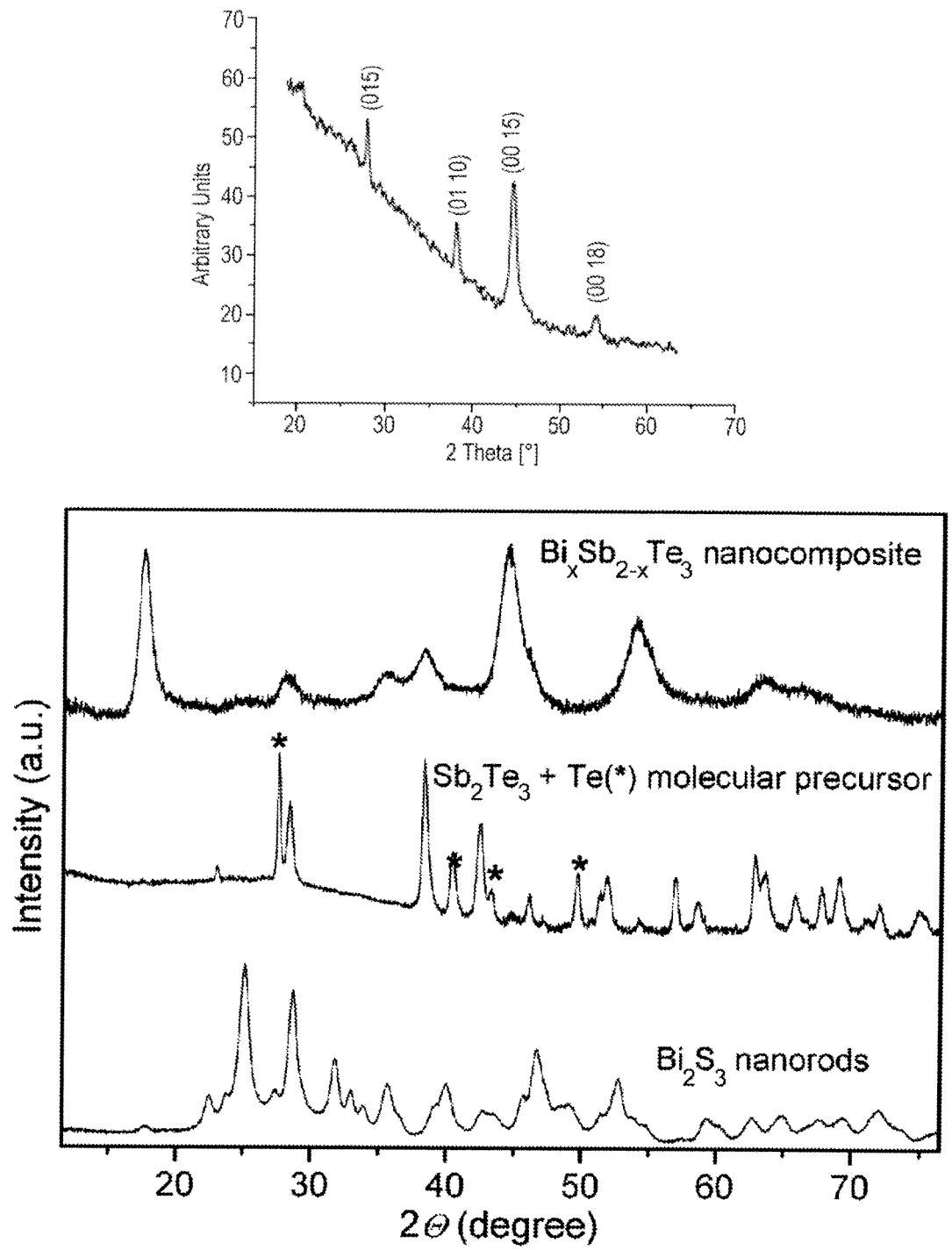

FIG. 17 is a (top) powder X-ray diffraction (XRD) pattern of a product formed by annealing Bi$_2$S$_3$.Sb$_2$Te$_4$, where the product has an approximate formula BiSbTe$_3$; and (bottom) a comparison of powder XRD patterns showing: top, the XRD pattern of a Bi$_{1.3}$Sb$_{0.7}$Te$_3$ nanocomposite formed by annealing Bi$_2$S$_3$.Sb$_2$Te$_4$; middle, the XRD pattern of annealed inorganic capping agent Sb$_2$Te$_4$, and bottom, the XRD patterns for the annealed Bi$_2$S$_3$.(oleic-acid) nanorods. All samples were annealed at 180° C. Note that the average grain size in the annealed Bi$_{1.3}$Sb$_{0.7}$Te$_3$ nanocomposite is smaller than that of the Bi$_2$S$_3$.(oleic-acid) nanorods.

Figure 18:
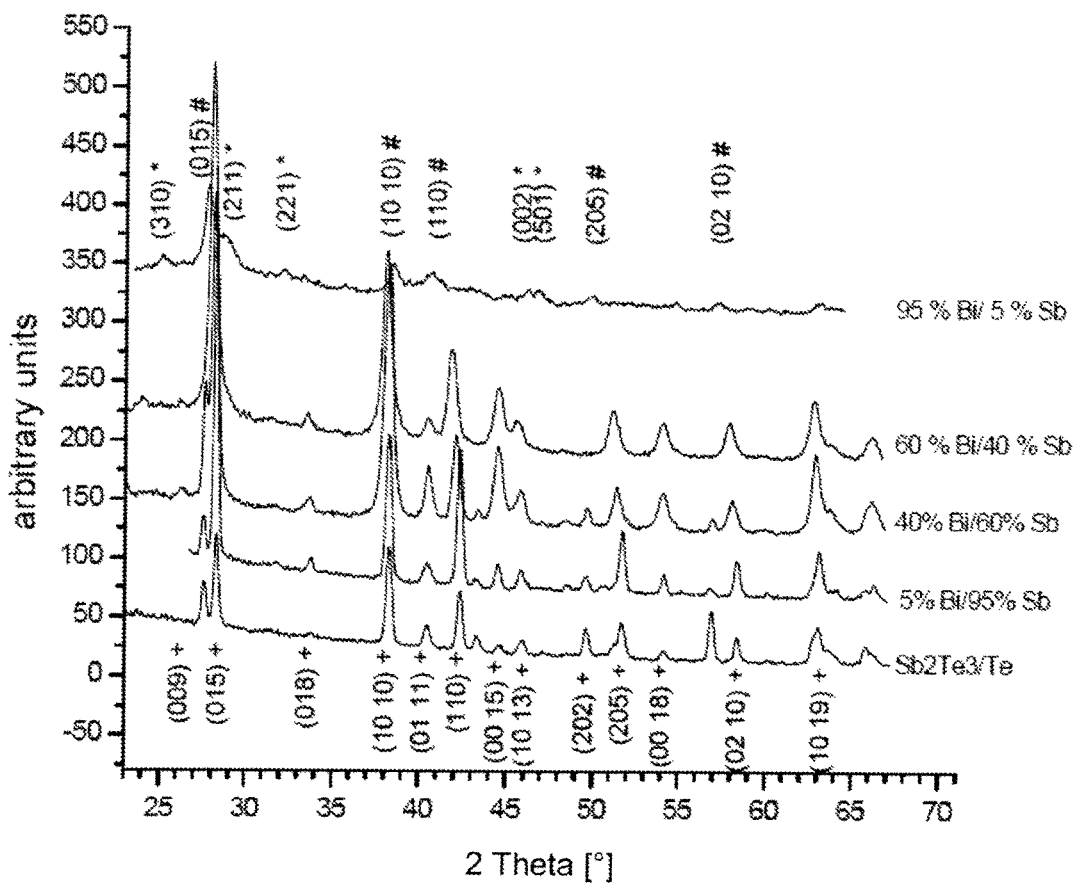

FIG. 18 is a plot comparing the powder XRD patterns showing the XRD patterns of Bi$_{2-x}$Sb$_x$Te$_3$ nanocomposites formed by annealing Bi$_2$S$_3$.Sb$_2$Te$_4$ at different Bi:Sb ratios. All samples were annealed to 350° C. Peak marking corresponds to: "+": rhombohedral Sb$_2$Te$_3$ (JCPDS No. 71-393, R$_3$m); "*": orthorhombic Bi$_2$S$_3$ (JCPDS No. 17-0320, Pbnm); "#": rhombohedral Bi$_2$Te$_3$ (ICDD No. 08-0021, R$_3$m (166))

Figure 19:
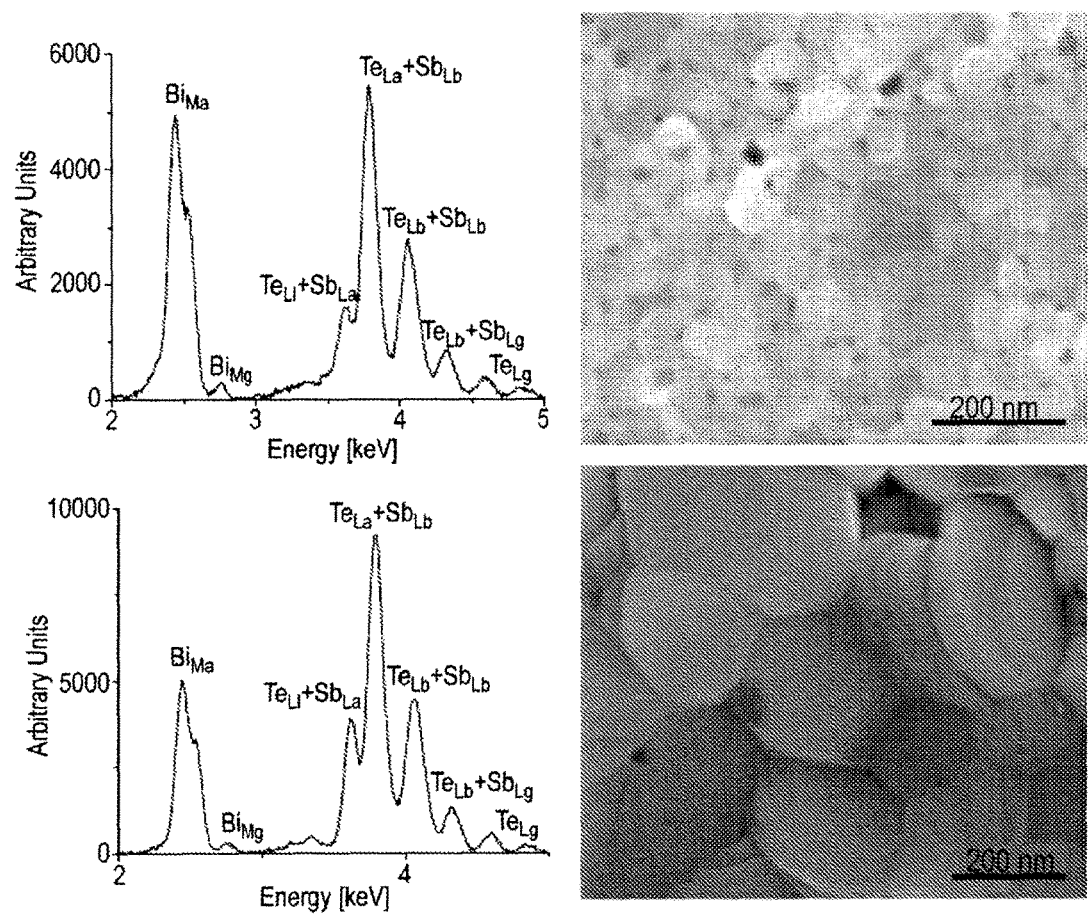

FIG. 19 is a plot comparing EDS spectra and TEM images of two Bi$_{2-x}$Sb$_x$Te$_3$ nanocomposites formed by annealing Bi$_2$S$_3$Sb$_2$Te$_4$ at high (top) and low (bottom) Bi:Sb ratios. Notably, a high Bi:Sb ratio provides very small crystalline domains while the small Bi:Sb ratio provides significantly larger crystalline domains. The EDS spectra show that the ratio of Bi:Sb persists from the colloidal particle to the colloidal material, Bi$_{2-x}$Sb$_x$Te$_3$ nanocomposite.

Figure 20:
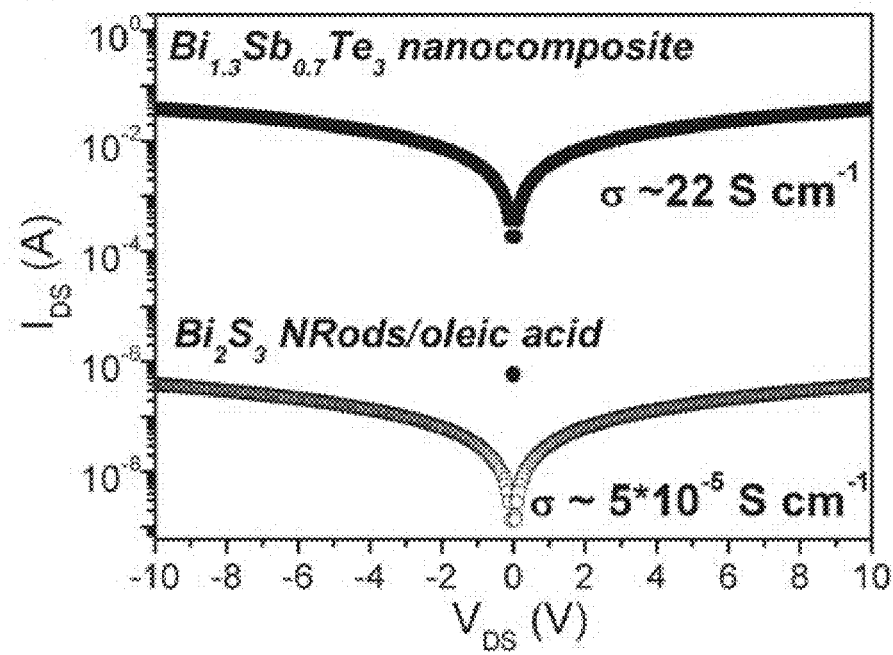

FIG. 20 is a plot comparing, top, the I-V scan of a Bi$_{1.3}$Sb$_{0.7}$Te$_3$ nanocomposite film (filled circles) prepared from ~6×25 nm (nanorod) Bi$_2$S$_3$.Sb$_2$Te$_4$ by spin-casting and annealing (180° C.) and, bottom, the I-V scan of the film of ~6×25 nm (nanorod) Bi$_2$S$_3$.(oleic-acid) (annealed at 180° C.).

Figure 21:
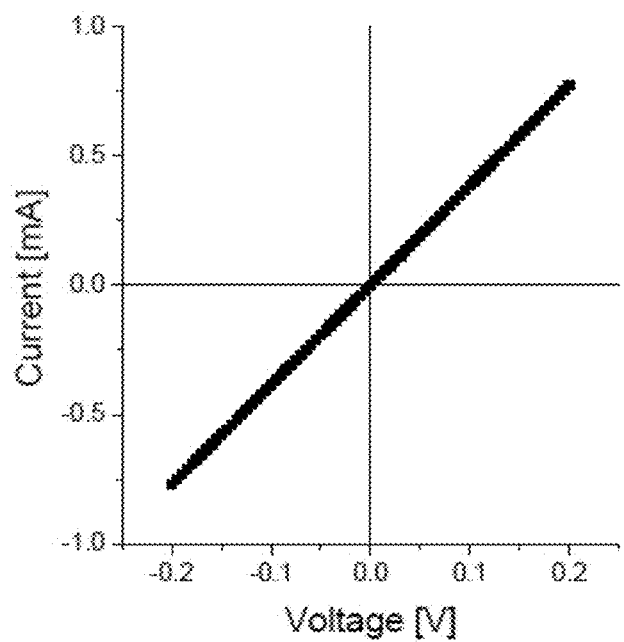

FIG. 21 is a plot of the current across a Bi$_{2-x}$Sb$_x$Te$_3$ nanocomposite film showing ohmic behavior and high conductivity.

Figure 22:
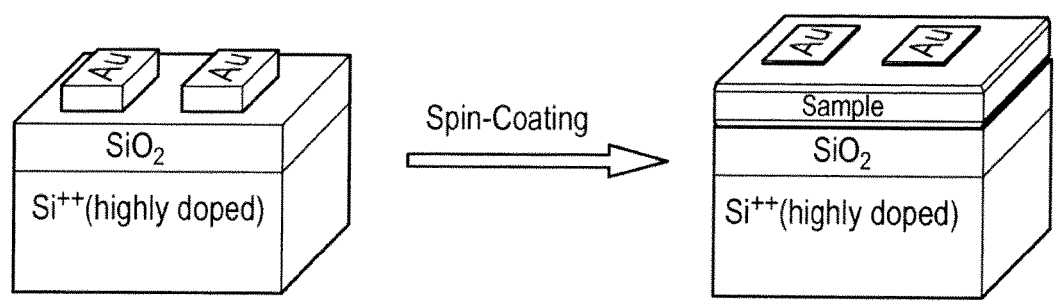

FIG. 22 is an illustration of the fabrication of a device by coating a sample with the described nanocomposites.

Figure 23:
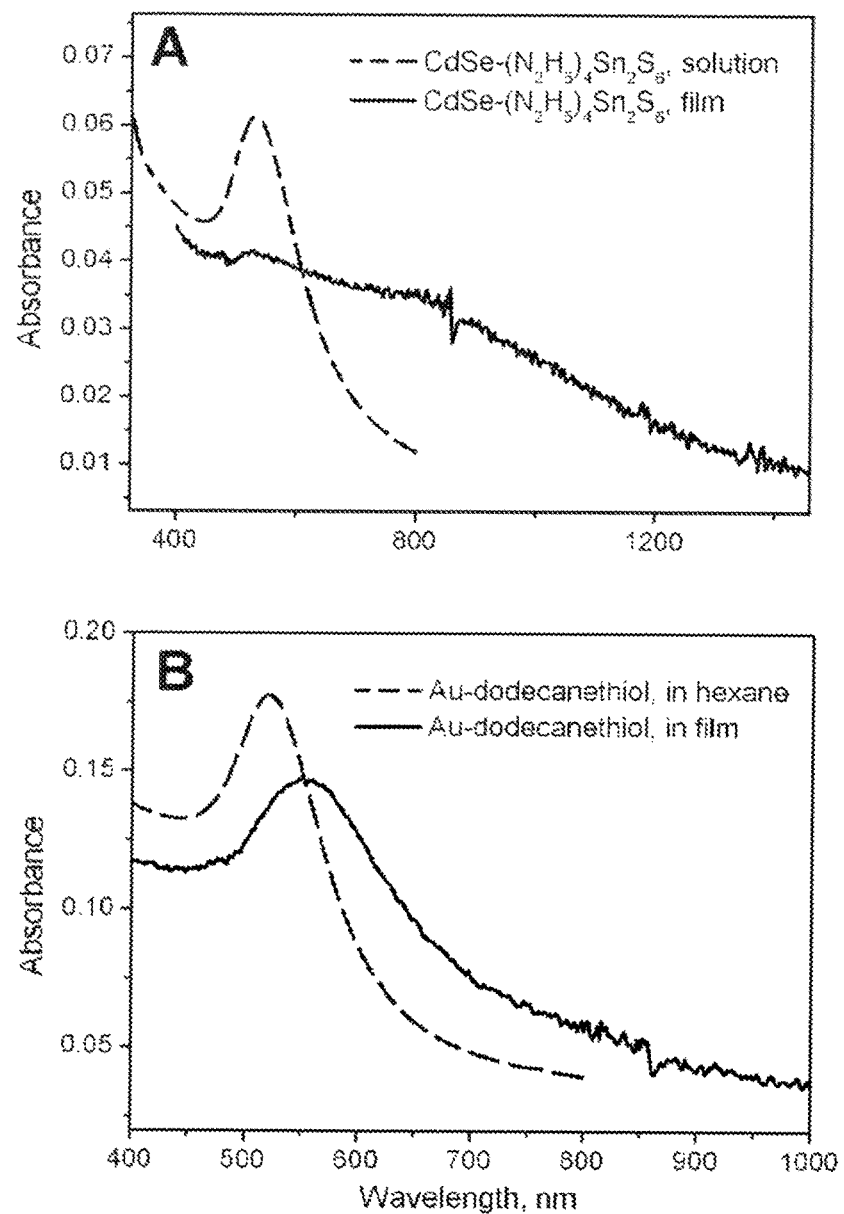

FIG. 23 illustrates plots of the absorbance versus wavelength, more specifically the absorption spectra for ~5 nm Au nanoparticles stabilized with (N$_2$H$_4$)$_5$Sn$_2$S$_6$ (A) and with dodecanethiol (B), in solutions and in thin films, where the film absorption was measured using an integrating sphere.

Figure 24:
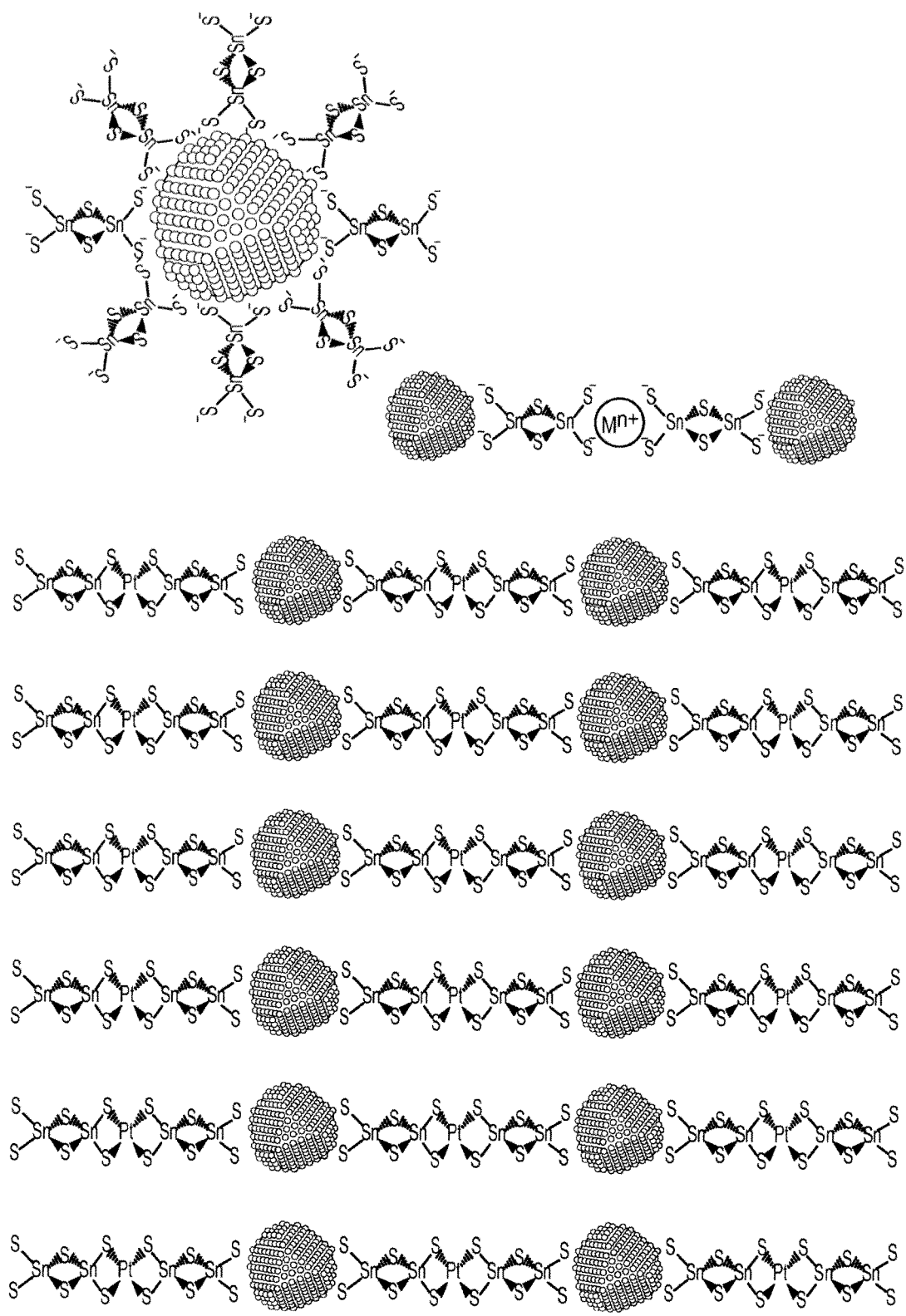

FIG. 24 is illustrations of a nanocrystal coated with an inorganic capping agent (Sn$_2$S$_6^{4-}$); the linking/bridging of two nanocrystals, individually coated with an inorganic capping agent (Sn$_2$S$_6^{4-}$), by a metal cation (M$^{n+}$); and the linking/bridging of a plurality of coated nanocrystals, individually coated with an inorganic capping agent (Sn$_2$S$_6^{4-}$), by metal cations (Pt$^{x+}$), thereby forming a chain or wire. The illustration additionally shows one type of regular stacking of the chain in two dimensional space.

Figure 25:
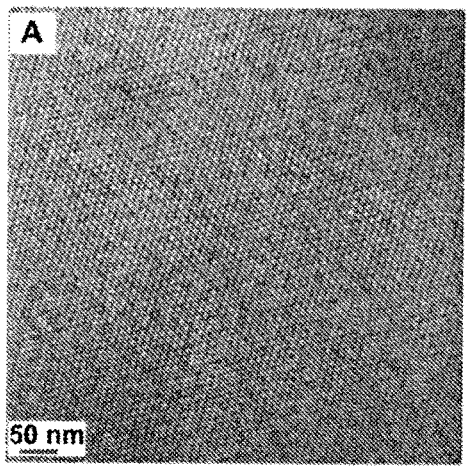
Figure 25:
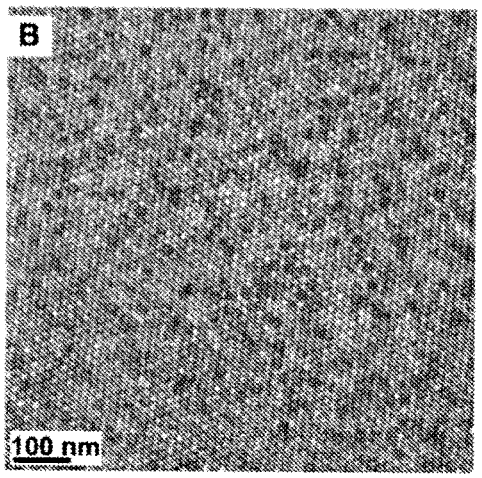
Figure 25:
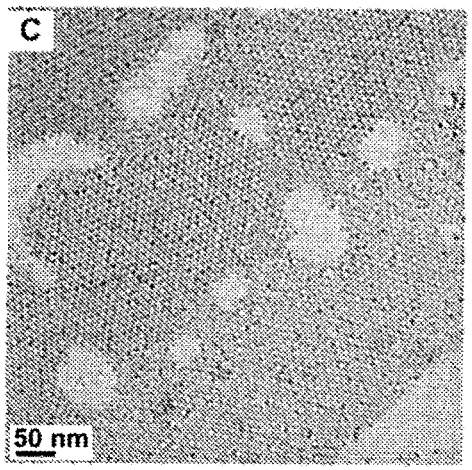
Figure 25:
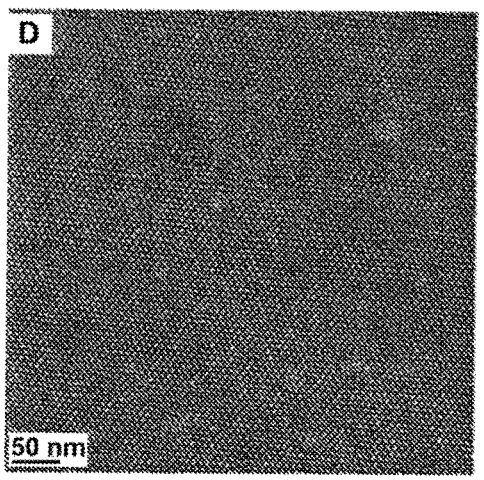
Figure 25:
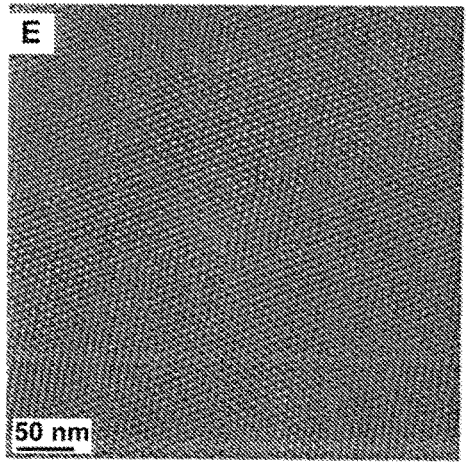
Figure 25:
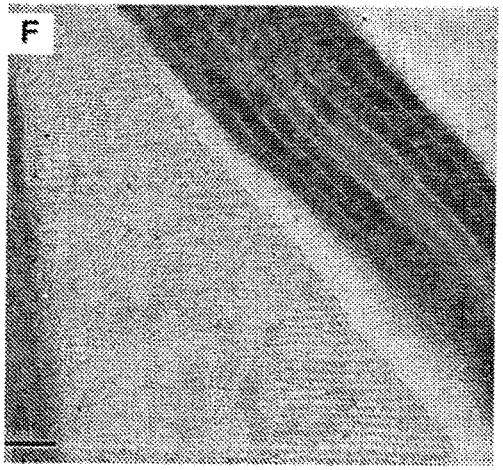

FIG. 25 is TEM images of inorganic capped nanoparticles that are ion paired with the dimethylbisdodecylammonium cation (N(CH$_3$)$_2$(C$_{12}$H$_{25}$)$_2^+$; DDAB): (A) PbS—AsS$_3^{3-}$; (B) CdSe—AsS$_3^{3-}$; (C) PbSe—AsS$_3^{3-}$; (D) Au—AsS$_3^{3-}$; (E) Pd—AsS$_3^{3-}$; (F) CdS rods-AsS$_3^{3-}$.

Figure 26:
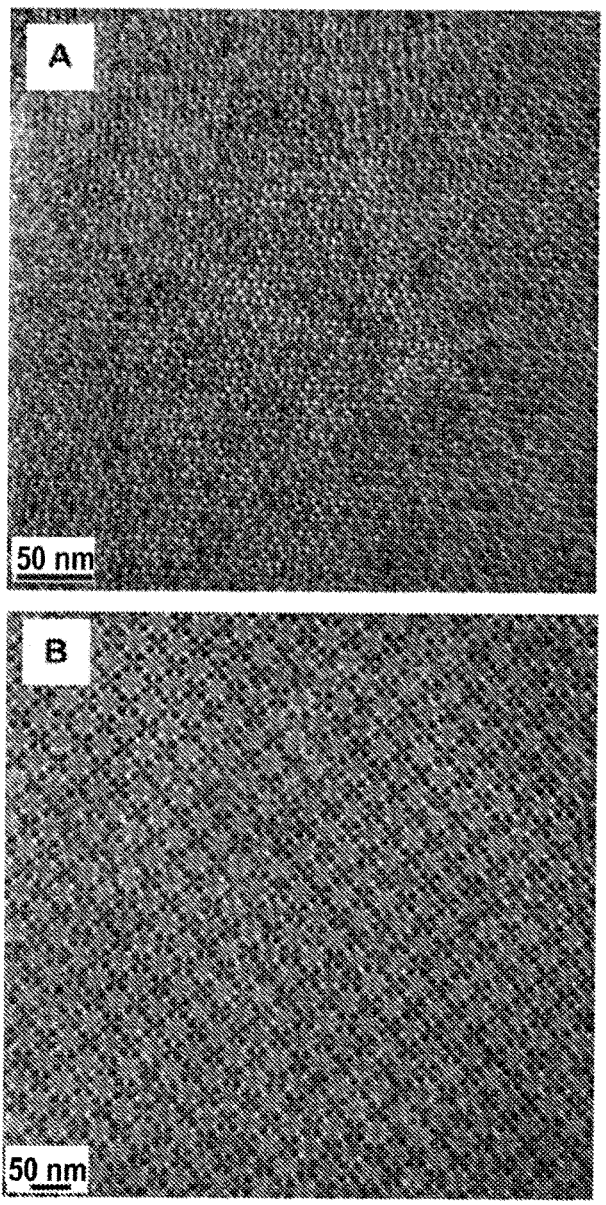
Figure 26:
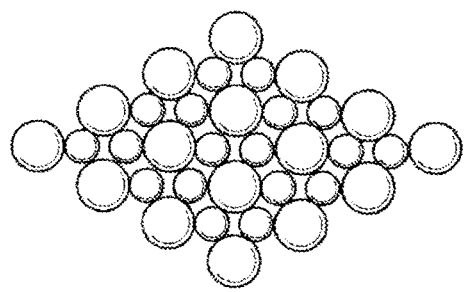
Figure 26:
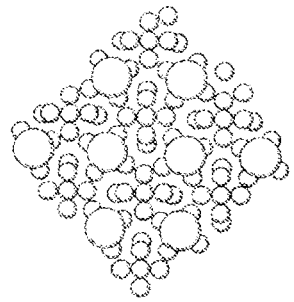

FIG. 26 is TEM images and composite drawings of colloidal materials that comprise two different inorganic capped nanoparticles: (A) CdSe and Au nanocrystals and (B) PbS and Au nanocrystals.

Figure 27:
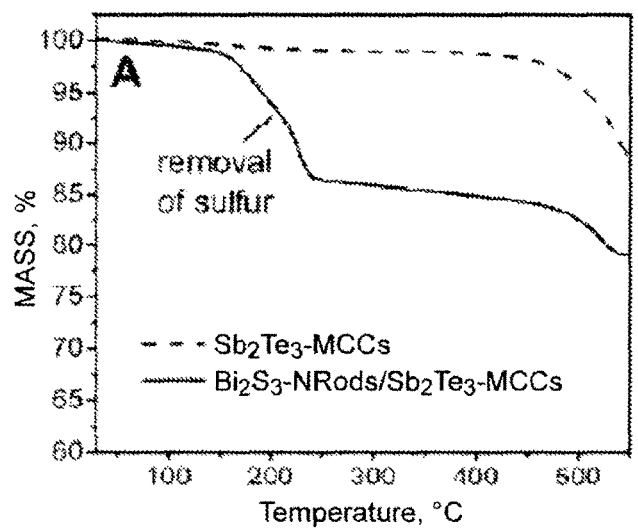

FIG. 27 is TGA scans for Bi$_2$S$_3$.Sb$_2$Te$_3$ dried sample showing the release of S in the course of solid-state chemical transformation toward (Bi$_{0.6}$Sb$_{0.4}$)$_2$Te$_3$ phase.

Figure 28:
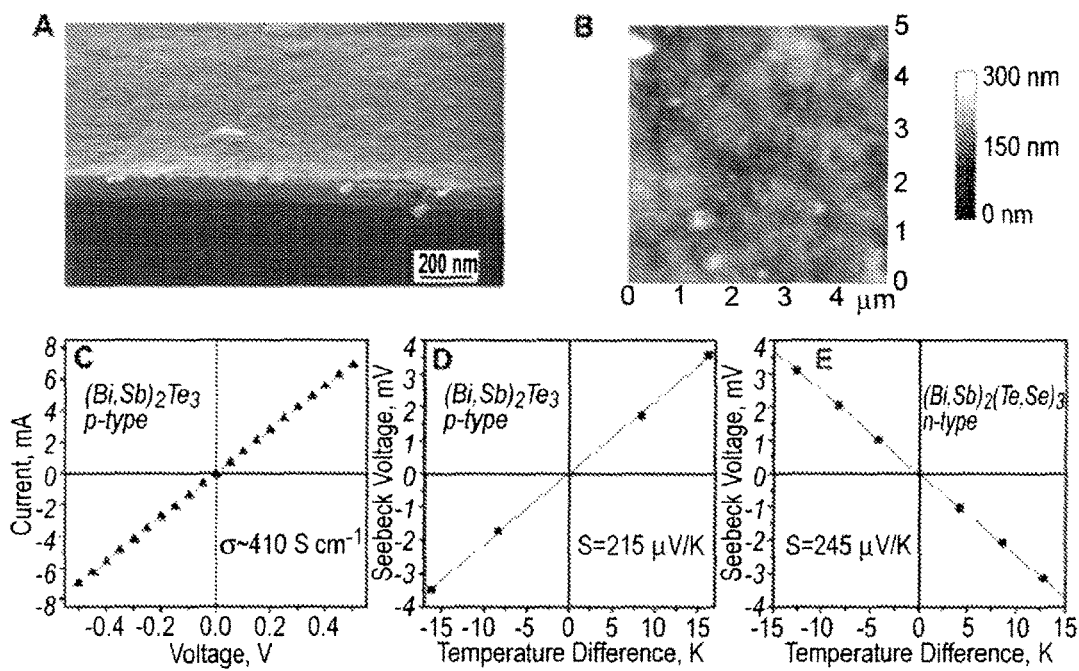

FIG. 28 is a composite of (A) cross-sectional SEM image of a ~20 nm thick (Bi$_{0.5}$Sb$_{0.5}$)$_2$Te$_3$ film prepared by spin-casting. (B) Tapping-mode AFM image of 0.3-μm thick (Bi$_{0.5}$Sb$_{0.5}$)$_2$Te$_3$ films prepared by drop-casting. (C) I-V curve and (D) a plot of Seebeck voltage vs. temperature difference for a representative sample of a p-type (Bi,Sb)$_2$Te$_3$ spray-cast film. (E) Plot of Seebeck voltage vs. temperature difference for an n-type (Bi,Sb)$_2$(Te$_{0.9}$Se$_{0.1}$)$_3$ drop-cast film (~10 molar % of Sb$_2$Se$_3$).

Figure 29:
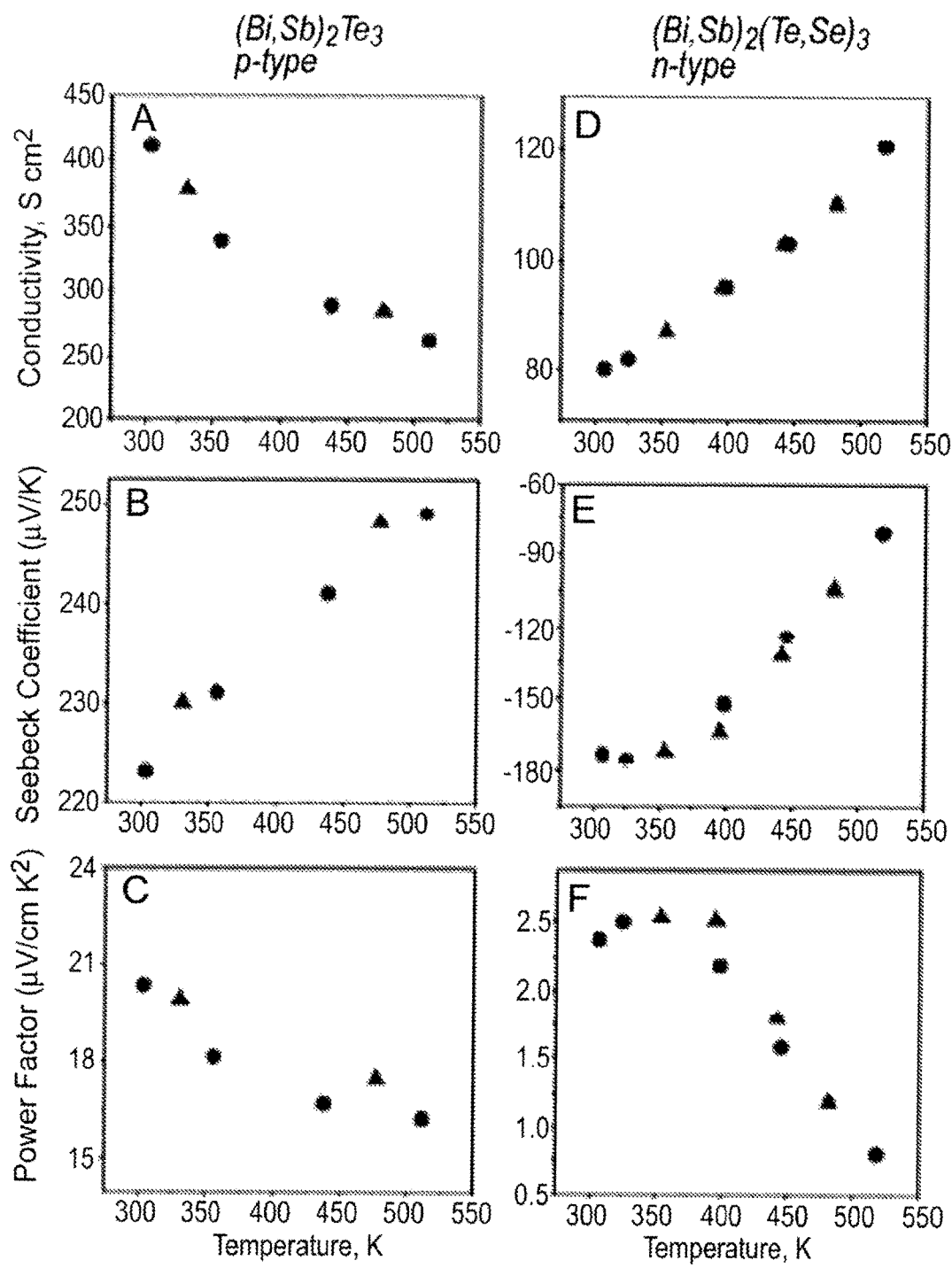

FIG. 29 is plots of the temperature dependence of the electrical conductivity σ (A, D), Seebeck coefficient S (B, D) and power factor S2σ (C, F), for p-type (Bi,Sb)$_2$Te$_3$ (A, B, C) and n-type (Bi,Sb)$_2$(Te$_{0.9}$Se$_{0.1}$)$_3$ (D, E, F). Circles correspond to the forward temperature scan, whereas the triangles represent data points measured during sample cooling.

Figure 30:
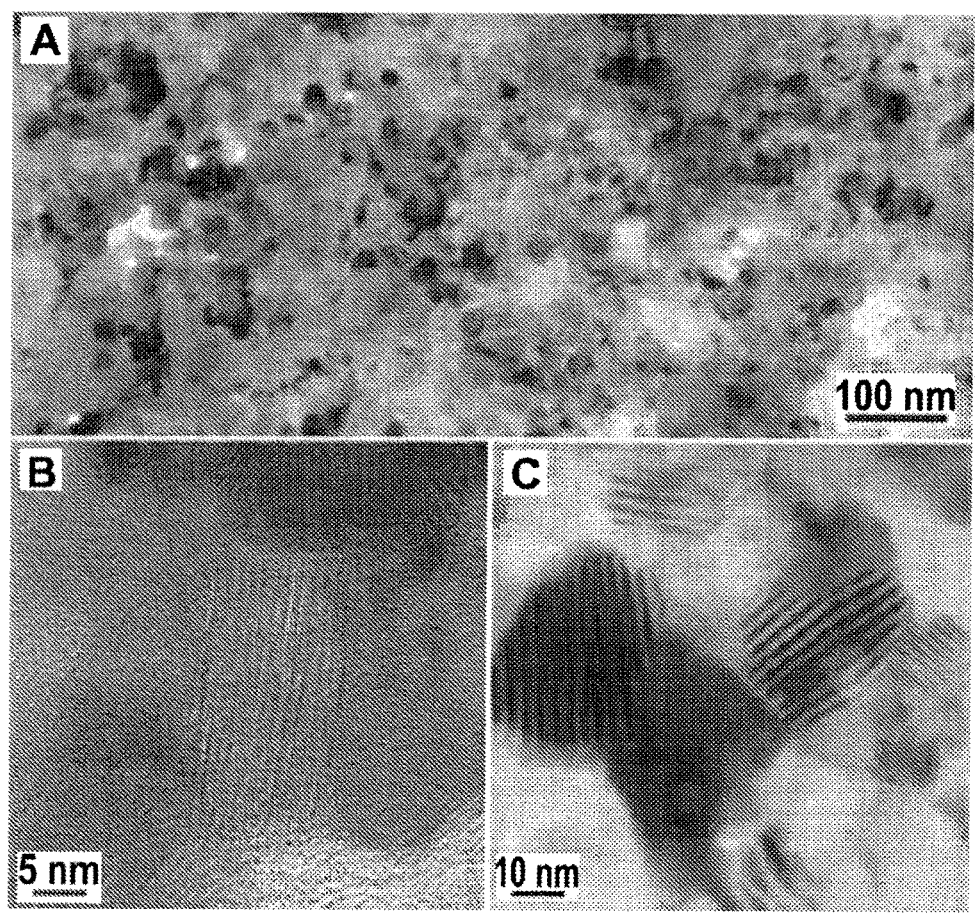

FIG. 30 is (A) low- and (B, C) high-resolution TEM images for a nanostructured [(Bi,Sb)$_2$Te$_3$](PbTe) composite prepared by combining PbTe.Sb$_2$Te$_3$ with "(Bi,Sb)$_2$Te$_3$" ink in 1:4 molar ratio followed by the annealing at 300° C. More fringes on panel (C) arise from the electron beam diffraction on vertically stacked crystallites.

Figure 31:
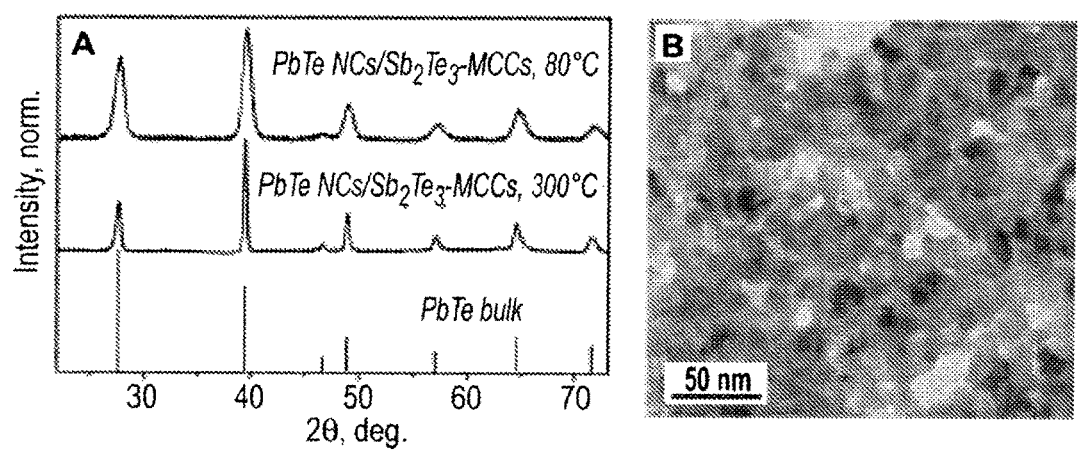

FIG. 31 is (A) XRD patterns for PbTe.Sb$_2$Te$_3$, annealed at various temperatures. The absence of detectable Sb$_2$Te$_3$ peaks points to the very small content of this phase. (B) TEM images for the same sample deposited onto TEM grid and annealed at 300° C.

Figure 32:
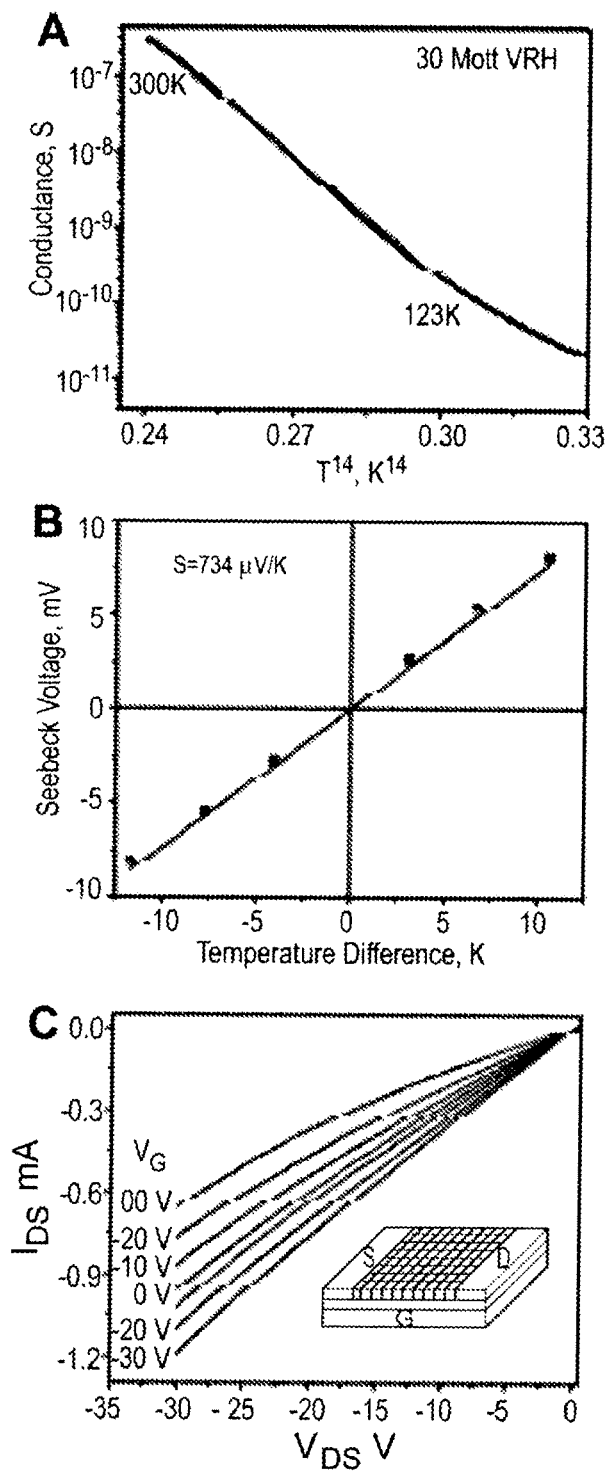

FIG. 32 is Electrical characterization of PbTe.Sb$_2$Te$_3$. (A) Plot of the low-field conductance (G) vs. T-¼ in the 84-300 K temperature range, (B) Plot of Seebeck voltage vs. temperature difference, (C) Plot of drain current I$_{DS}$ vs. source-drain voltage V$_{DS}$ as a function of gate voltage V$_G$ for a NC-based FET (L=10 μm, W=3800 μm, with a 100-nm thick SiO$_2$ gate oxide, Au drain and source electrodes, and highly doped Si as the back gate electrode).

Figure 33:
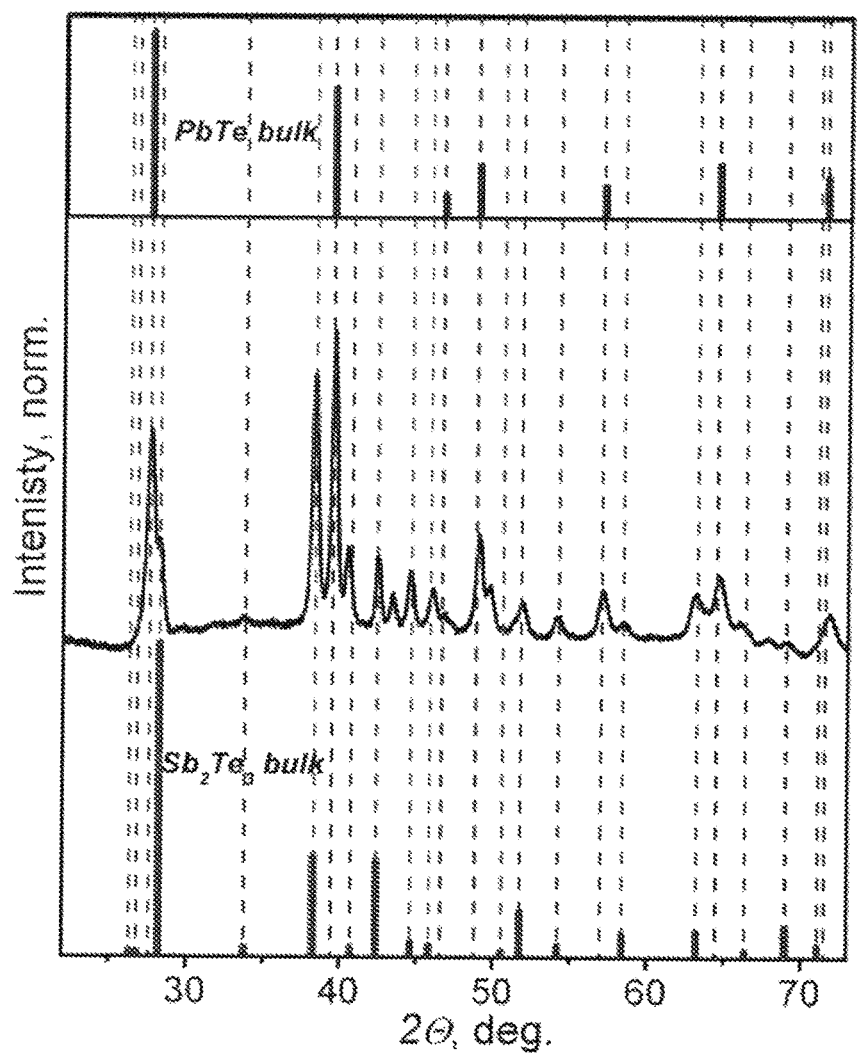

FIG. 33. is XRD pattern for biphase PbTe/Sb$_2$Te$_3$ composite prepared by annealing PbS.Sb$_2$Te$_3$ at 300° C.

Figure 34:
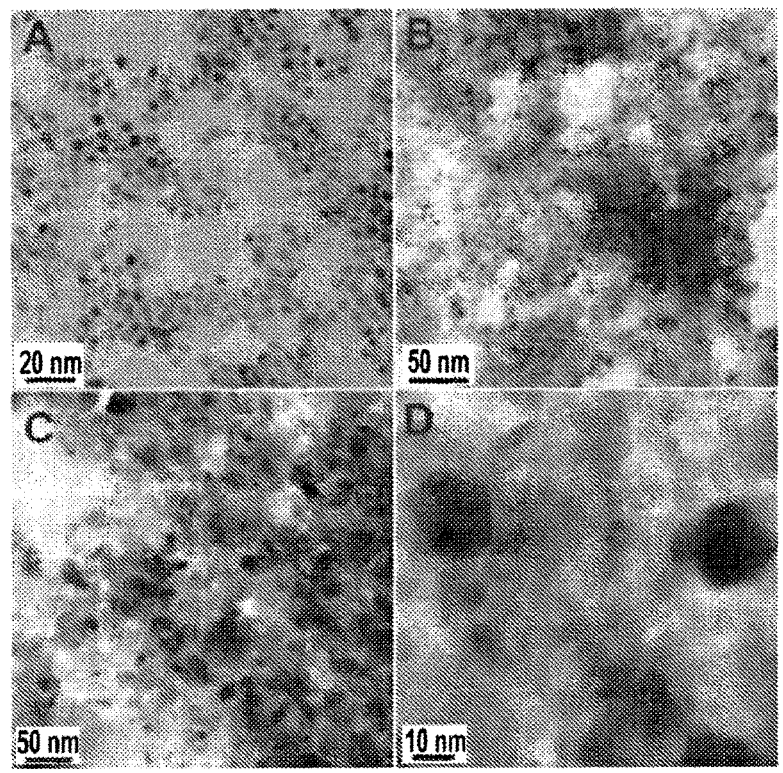

FIG. 34 is TEM images of (A) 5-nm Au.Sb$_2$Te$_3$, (B) composite prepared by adding Au.Sb$_2$Te$_3$ to "BiSbTe ink" (dried at 80° C.), showing homogeneous distribution of particles. (C) and (D) Low- and high-resolution TEM images of the same Au/BiSbTe composite annealed at 300°

C. (D) illustrated the presence of small and discrete Au inclusions in the annealed sample in addition to large Au precipitates seen from (C).

Figure 35:
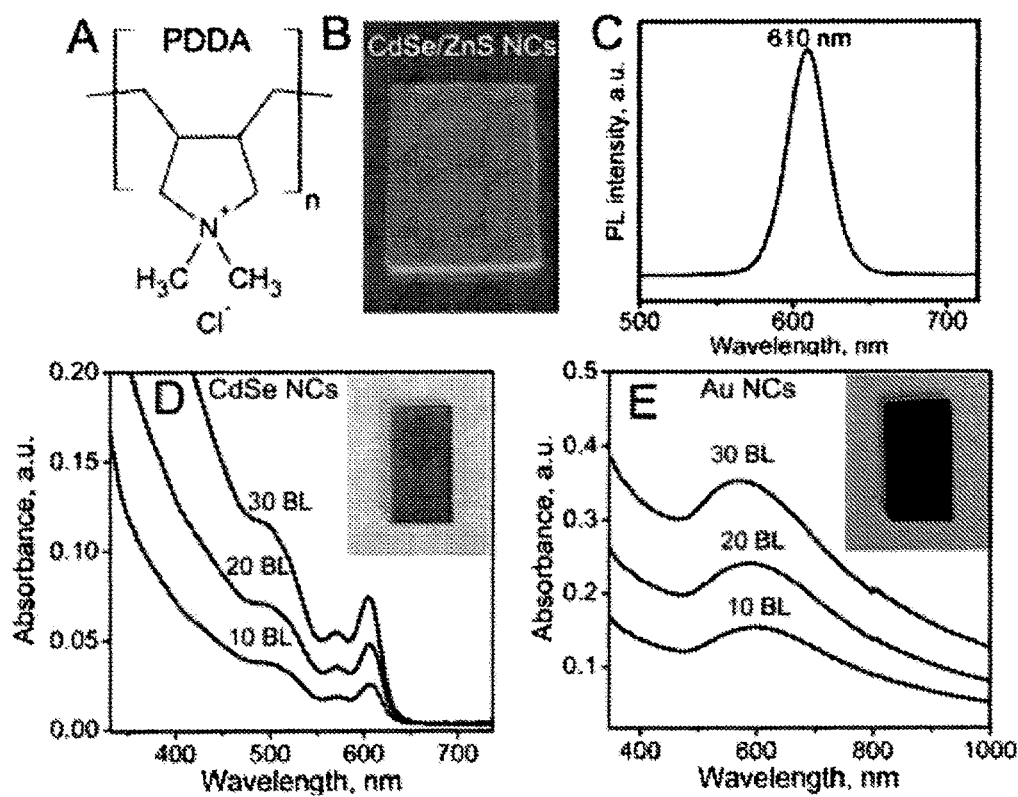

FIG. 35 is (A) chemical structure of PDDA; (B) a photograph of {[(CdSe/ZnS).$SnS_4$]/PDDA}×20 film, assembled from aqueous solutions, taken under UV irradiation. (C) PL spectrum of the film shown in (B). (D) Absorption spectra of (CdSe.$SnS_4$/PDDA)×n films (n is number of bilayers), assembled from aqueous solutions. (E) Absorption spectra of (Au.$Sn_2S_6$/PDDA)×n films, assembled from formamide solutions.

Figure 36:
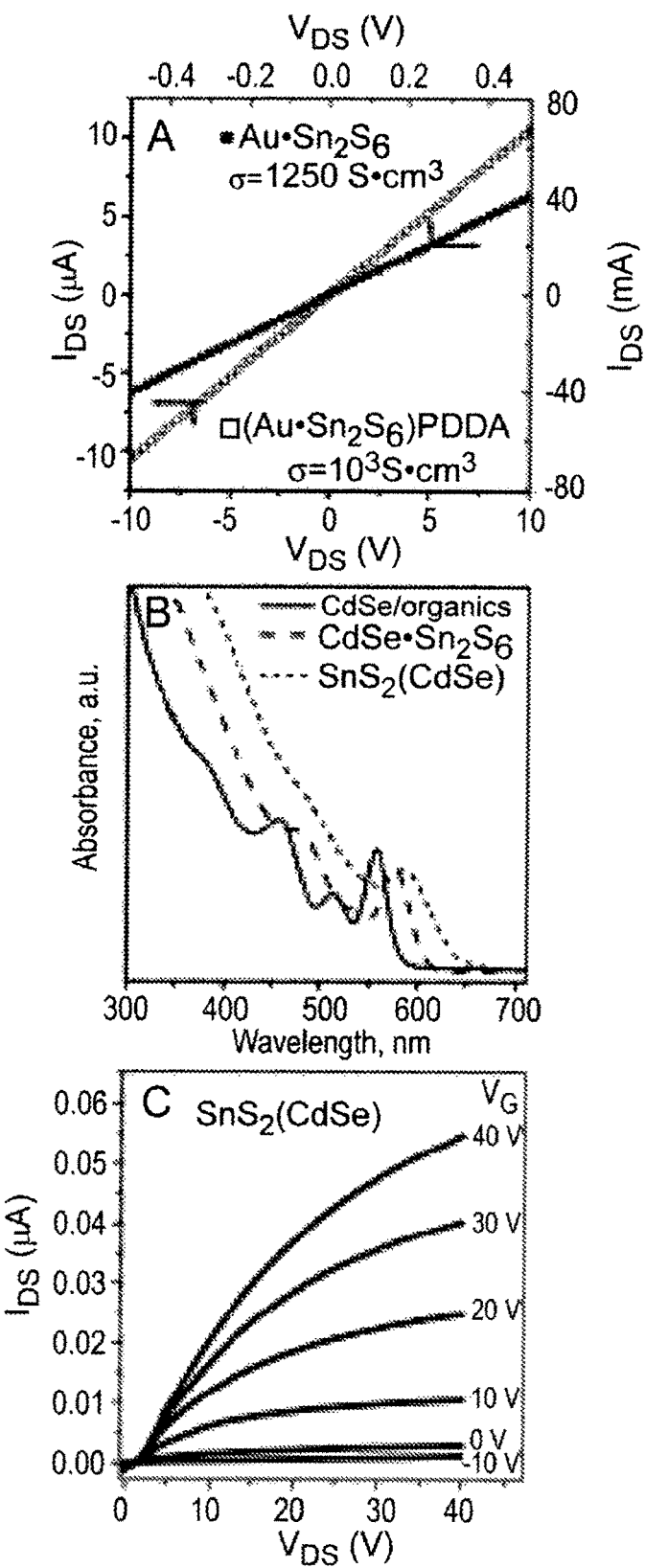

FIG. 36 is (A) I-V curves for thin films assembled from 5 nm Au.$Sn_2S_6$ (films were made from formamide solutions at 80° C.) and for LBL films composed of the same Au.$Sn_2S_6$ nanocrystals and PDDA. (B) Optical absorption spectra for thin films made from 4.2-nm CdSe nanocrystals capped with original organic ligands (solid line) and with $Sn_2S_6^{4-}$ before (dash) and after annealing at 200° C. (short dash). (C) Plot of the drain current ID versus drain-source voltage VDS for a nanocrystal FET with a channel composed of 4.2-nm CdSe.$Sn_2S_6$ and annealed at 200° C. (channel length is 5 μm, width 7800 μm, 110-nm-thick $SiO_2$ gate dielectric).

Figure 37:
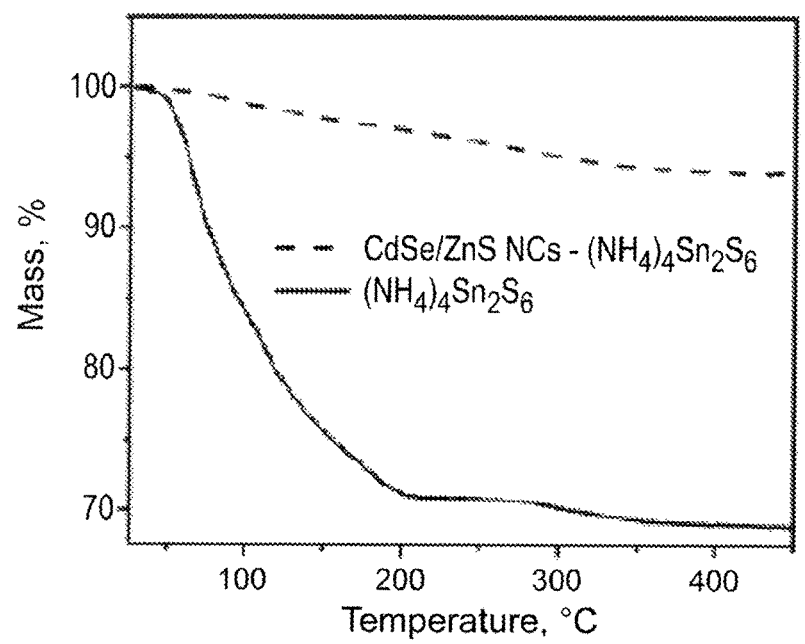

FIG. 37 is TGA scans for solid $(NH_4)_4Sn_2S_6$ and for CdSe/ZnS.$Sn_2S_6$.

Figure 38:
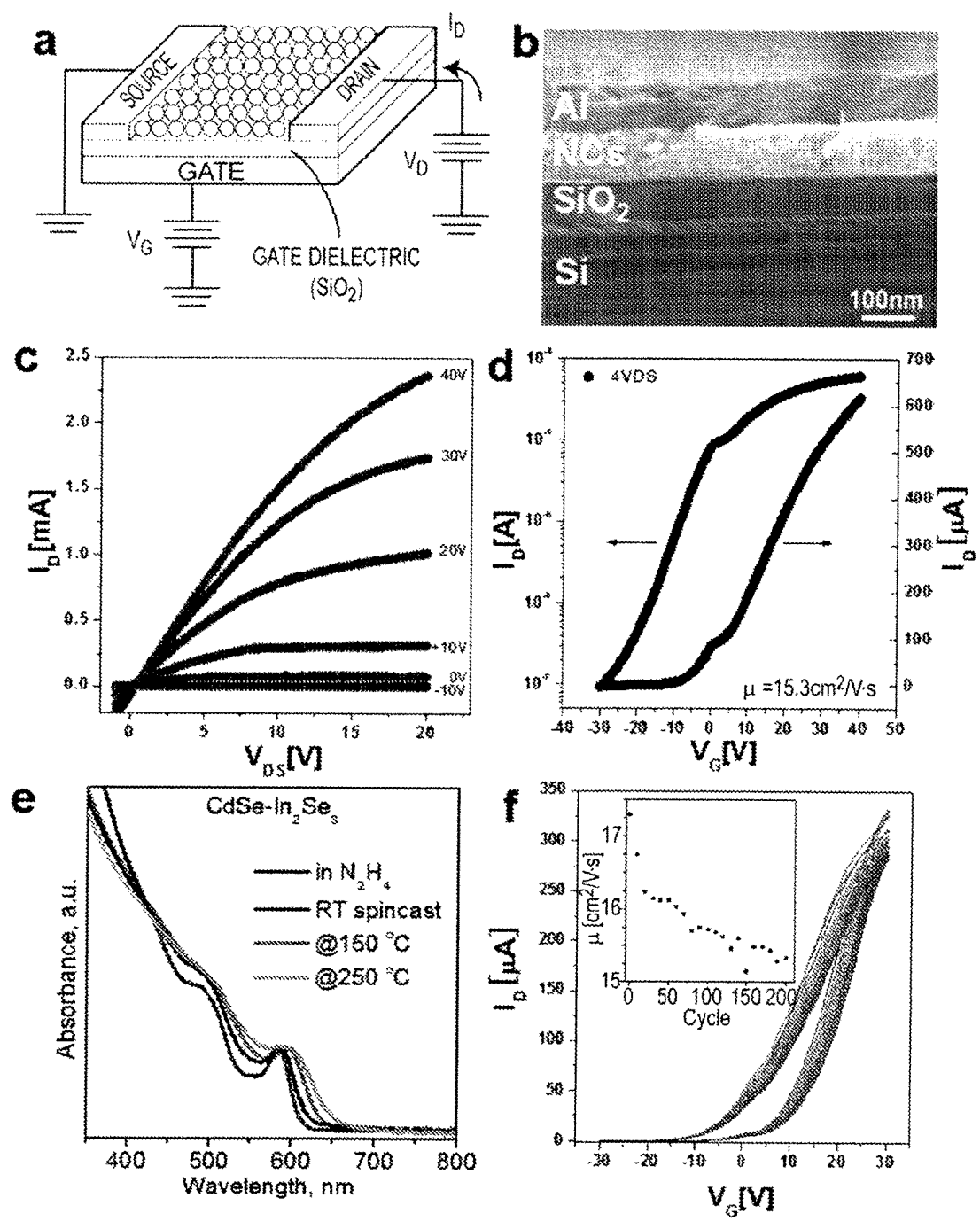

FIG. 38 is data corresponding to gated n-type charge transport in CdSe.$In_2Se_3$ materials. (a) Schematics of a field-effect transistor with a channel assembled from CdSe.$In_2Se_3$. (b) Cross-section SEM image of selected FET devices. (c) Drain current $I_D$ plotted versus drain-source voltage $V_{DS}$, as a function of gate voltage $V_G$ for an array of 4.6 nm CdSe.$In_2Se_3$. L=50 μm, W=460 μm. (d) Plot of $I_D$ vs. $V_G$ at constant $V_{DS}$=4V used to calculate transconductance and linear field-effect mobility in the array of 4.6 nm CdSe.$In_2Se_3$. (e) Absorption spectra collected using an integrating sphere for thin films assembled from CdSe.$In_2Se_4$ before and after annealing at different temperature. (f) Plots of $I_D$ vs. $V_G$ at constant $V_{DS}$=2V as function of operation cycles for n-channel FET assembled from 4.6 nm CdSe.$In_2Se_3$ (L=111 μm, W=1500 μm). The operation of device repeated to 200 cycles.

Figure 39:
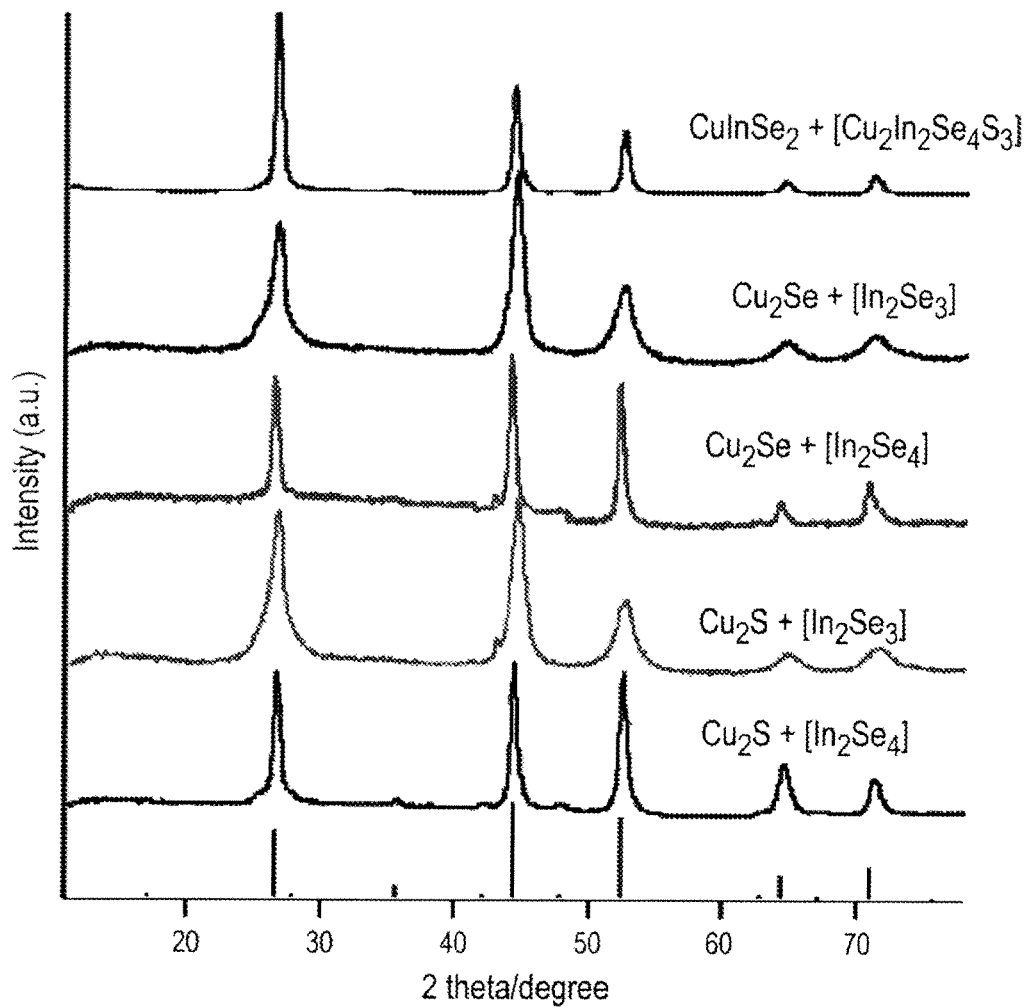

FIG. 39 is a comparison powder XRD patterns of annealed copper indium materials, showing the synthesis of a copper indium selenide from sulfur or selenium containing starting materials.

Figure 40:
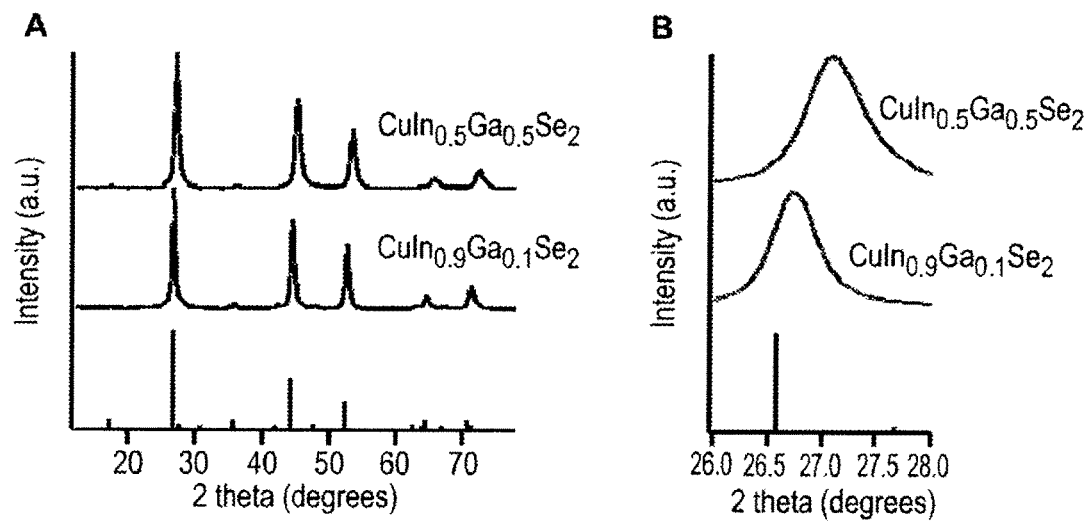

FIG. 40 is a comparison of powder XRD patterns to the line index for Cu(In,Ga)$Se_2$, showing the product from the thermal processing of $Cu_2Se$.($In_2Se_4$;$Ga_2Se_3$) at two different In to Ga ratios.

Figure 41:
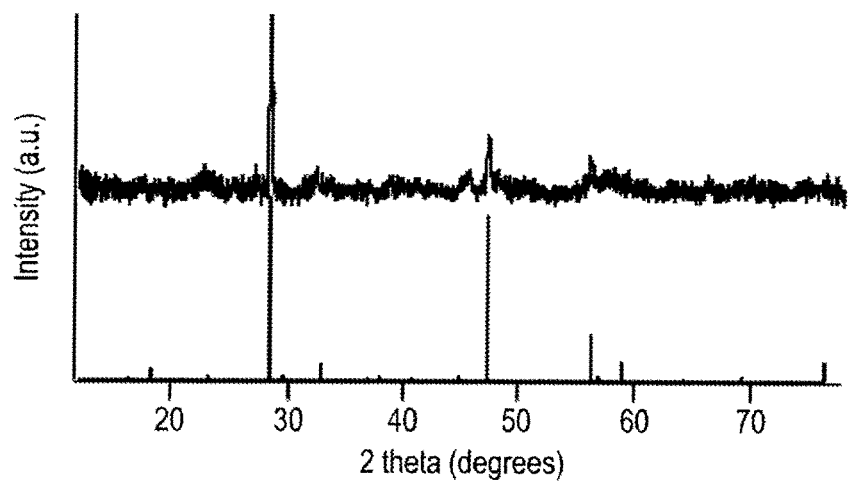

FIG. 41 is a comparison of the powder XRD pattern of the product from the thermal processing of a mixture of $Cu_2Se$.$Sn_2S_6$ and ZnS.$Sn_2S_6$ and the diffraction patter for CZTS ($Cu_2ZnSnS_4$; JCPDS no. 26-0575).

While the disclosed compositions and methods are susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF THE INVENTION

The compositions and methods described herein generally relate to new colloidal particles (inorganic capped nanomaterials) and materials, composites, made from these nanometer scale particles. The colloidal particles can be facilely produced from single or multi-component mixtures of nanoparticles and the materials can be produced therefrom. These new colloidal particles, materials and the methods, described herein, may reduce the time, expense, and uncertainty in the manufacture of advanced materials.

Figure 1:
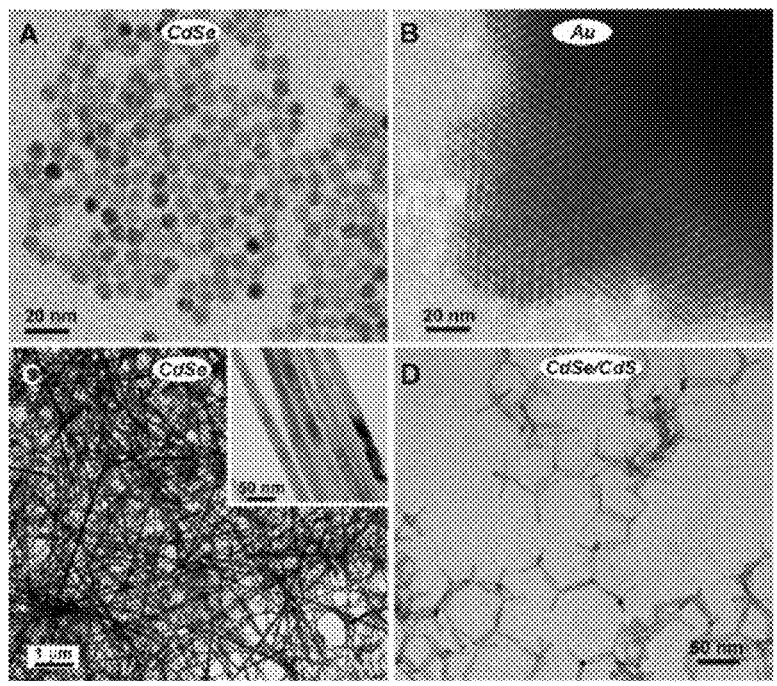

Colloidal particles, from which the herein described materials can be produced, are discrete particles and are generally suspendable in at least one solvent. The colloidal particles are isolable, that is the colloidal particles can be isolated from reagents used in the manufacture of the colloidal particles. One characteristic of many isolable colloidal particles is that the colloidal particles can be deposited from a solution and then resuspended or redissolved in the same or a different solvent. Often colloidal particles have sizes ranging from the nanometer scale to the micron scale and can exist as mixtures with broad size ranges. Nanoparticles are those particles where at least the cross-sections of the particle in two dimensions are between about 1 and about 1000 nanometers (nm). Nanoparticles can be produced in a large variety of morphologies and sizes all of which are applicable herein. Nonlimiting examples of the morphologies of nanoparticles include, nanocrystals, nanorods, nanoplates, nanowires, dumbbell-like nanoparticles, and dendritic nanomaterials. See FIG. 1. Within each morphology there is an additional large variety of shapes available, for example nanocrystals can be produced in spheres, cubes, tetrahedra, octahedra, icosahedra, prisms, cylinders, wires, branched and hyperbranched morphologies and the like. The morphology and the size of the nanoparticles do not inhibit the general method for making colloidal materials described herein; specifically the selection of morphology and size of the nanoparticle allows for the tuning and control of the properties of the colloidal material, as will become clear.

Non-limiting examples of nanoparticles applicable herein include: AlN, AlP, AlAs, Ag, Au, Bi, $Bi_2S_3$, $Bi_2Se_3$, $Bi_2Te_3$, CdS, CdSe, CdTe, Co, CoPt, $CoPt_3$, Cu, $Cu_2S$, $Cu_2Se$, $CuInSe_2$, $CuIn_{(1-x)}Ga_x(S,Se)_2$, $Cu_2ZnSn(S,Se)_4$, Fe, FeO, $Fe_2O_3$, $Fe_3O_4$, FePt, GaN, GaP, GaAs, GaSb, GaSe, Ge, HgS, HgSe, HgTe, InN, InP, InSb, InAs, Ni, PbS, PbSe, PbTe, Pd, Pt, Ru, Rh, Si, Sn, ZnS, ZnSe, ZnTe, and mixtures thereof. Examples of applicable nanoparticles include core/shell nanoparticles like Au/PbS, Au/PbSe, Au/PbTe, Ag/PbS, Ag/PbSe, Ag/PbTe, Pt/PbS, Pt/PbSe, Pt/PbTe, Au/CdS, Au/CdSe, Au/CdTe, Ag/CdS, Ag/CdSe, Ag/CdTe, Pt/CdS, Pt/CdSe, Pt/CdTe, Au/FeO, Au/$Fe_2O_3$, Au/$Fe_3O_4$, Pt/FeO, Pt/$Fe_2O_3$, Pt/$Fe_3O_4$, FePt/PbS, FePt/PbSe, FePt/PbTe, FePt/CdS, FePt/CdSe, FePt/CdTe, CdSe/CdS, CdSe/ZnS, InP/CdSe, InP/ZnS, InP/ZnSe, InAs/CdSe, and InAs/ZnSe; nanorods like CdSe, core/shell nanorods like CdSe/CdS; nano-tetrapods like CdTe, and core/shell nano-tetrapods like CdSe/CdS.

Often nanoparticles are synthesized in such a manner that the resulting nanoparticle is capped, or coated, in a stabilizing organic material, an organic capping agent. One typical example of an organic capping agent is trioctylphosphine oxide (TOPO), used in the manufacture of CdSe. The TOPO capping agent prevents the agglomeration of the nanoparticle during and after the synthesis of the particle, additionally the long organic chains radiating from the capping agent on the surface of the nanoparticle assist in the suspension and/or solubility of the nanoparticle in a solvent. A second type of organic capping agent is a organic thiol, often used in the manufacture of silver or gold nanoparticles. These organic thiols range from simple long chain alkane thiols, like dodecane thiol, to complex monothiols. The long organic chain of the organic thiol capping agent, as with the TOPO capping agent, assists in the suspension and/or solubility of the capped nanoparticle. Other known capping agents include long-chain aliphatic amines, long-chain aliphatic phosphines, long-chain aliphatic carboxylic acids, long-chain aliphatic phosphonic acids and mixtures thereof.

Figure 2:
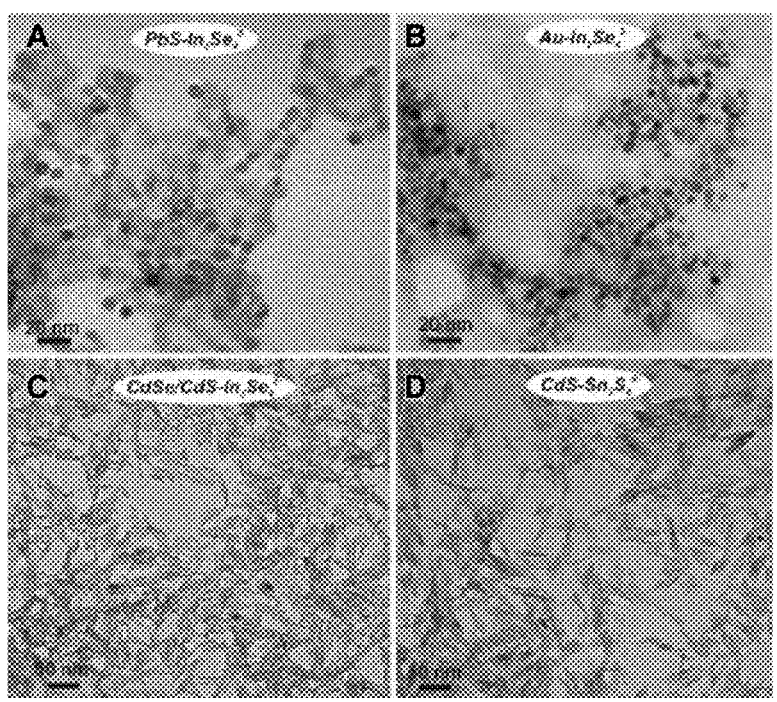
Figure 3:
Figure 4:
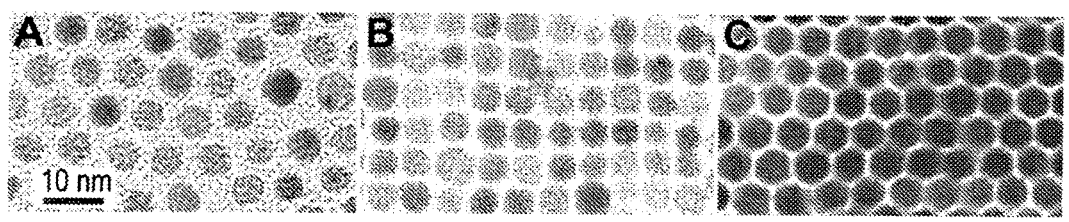

The present disclosure provides techniques for replacement of the organic capping agents with inorganic capping agents. As used herein, inorganic capping agents are those soluble reagents free of organic functionality that displace organic capping agents from nanoparticles and, preferably, wherein the inorganic capped nanoparticle is dispersible, that is suspendable and/or soluble. Inorganic capping agents comprises metals selected from transition metals, lanthanides, actinides, main group metals, metalloids, and mixtures thereof. Inorganic capping agents further comprise soluble metal chalcogenides and/or metal carbonyl chalcogenides. One aspect of the technique of replacing the organic capping agents with inorganic capping agents is the complete, or substantially complete, displacement of the organic capping agents from the nanoparticle and replacement with the inorganic capping agent. See FIG. 2.

Inorganic capping agents can be neutral or ionic, can be discrete species, linear or branched chains, or two-dimensional sheets. Ionic inorganic capping agents are commonly referred to as salts, a pairing of a cation and an anion, and the portion of the salt specifically referred to as an inorganic capping agent is the ion that displaces the organic capping agent and caps the nanoparticle. Often an inorganic ion is paired with an ion that has organic functionality; the paired ion that does not displace organic capping agents is referred to herein as a counter ion. The counter ion can affect the solubility and reactivity of the inorganic capping agent as well as the inorganic capped nanomaterial but the great variability of counter ions allows for their facile replacement and a balance of desired properties.

The inorganic capping agents described herein are often designated by formulations derived from a variety of analytical techniques, including elemental analysis, mass spectroscopy, and NMR. These designations may or may not accurately describe the molecular compositions of these inorganic capping agents in a solution and further do not prescribe to them a specific structure. It is believed that at least some of the herein described inorganic capping agents exhibit variable solution structure equilibria, possibly dependent on temperature, concentration, purity, and other factors.

In one embodiment the inorganic capping agents are Zintl ions. As used herein, Zintl ions refers to homopolyatomic anions and heteropolyatomic anions that have intermetallic bonds between the same or different metals of the main group, transition metals, lanthanides, and/or actinides. Non-limiting examples of Zintl ions include: $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $Bi_7^{3-}$, $GaTe^{2-}$, $Ge_2^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^-$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_4^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $Sn_2S_6^{4-}$, $Sn_2Se_6^{4-}$, $Sn_2Te_6^{4-}$, $Sn_2Bi_2^{2-}$, $Sn_8Sb^{3-}$, $Te_2^{2-}$, $Te_3^{2-}$, $Te_4^{2-}$, $Tl_2Te_2^{2-}$, $TlSn_8^{3-}$, $TlSn_8^{5-}$, $TlSn_9^{3-}$, $TlTe_2^{2-}$, mixed metal $SnS_4Mn_2^{5-}$, and the like. The positively charged counter ions can be alkali metal ions, ammonium, hydrazinium, tetraalkylammmonium, and the like.

Another embodiment of applicable inorganic capping agents include, for example, molecular compounds derived from $CuInSe_2$, $CuIn_xGa_{1-x}Se_2$, $Ga_2Se_3$, $In_2Se_3$, $In_2Te_3$, $Sb_2S_3$, $Sb_2Se_3$, $Sb_2Te_3$, and ZnTe, the inorganic complexes disclosed in Roof, L. C., Kolis, J. W. Chem. Rev. 1993, 93, 1037-80 and incorporated herein by reference, and the inorganic complexes disclosed in Corbett, J. D. Chem. Rev. 1985, 85, 383-97 and incorporated herein by reference. For many of these molecular compounds the exact stoichiometry in a solution has not yet been adequately established, this does not preclude the use herein.

Further embodiments include non-stoichiometric Zintl ions and inorganic capping agents derived from molecular compounds. These include, for example, inorganic capping agents derived from molecular compounds wherein excess chalcogenide is added. One example is an inorganic capping agent derived from $Sb_2Te_3$ with excess tellurium, $[Sb_2Te_3$:Te]. Analysis of $Sb_2Te_3$:Te indicates a solution composition that contains $SbTe_3^{3-}$, $Sb_2Te_5^{4-}$, and $Sb_2Te_7^{4-}$ by ESI-MS and a stoichiometry of $Sb_2Te_7^{4-}$ by elemental analysis.

Still further, these inorganic capping agents include mixtures of Zintl ions and molecular compounds.

These inorganic capping agents further include transition metal chalcogenides. Examples of transition metal chalcogenides include the tetrasulfides and tetraselenides of vanadium, niobium, tantalum, molybdenum, tungsten, and rhenium, and the tetratellurides of niobium, tantalum, and tungsten. These transition metal chalcogenides further include the monometallic and polymetallic polysulfides, polyselenides, and mixtures thereof, e.g., $MoS(Se_4)_2^{2-}$, $Mo_2S_6^{2-}$, and the like.

Inorganic capped nanoparticles differ from core/shell nanoparticles. Core/shell nanoparticles are those particles where one nanocrystal has an outer crystalline layer with a different chemical formula. Core/shell nanoparticle compositions are commonly designated through the simple notation of (core composition)/(shell composition), for example CdSe/CdS has a CdSe core and a CdS shell. The crystalline layer, the shell, generally forms over the entire nanocrystal but as used herein core/shell nanoparticles refers to those nanoparticles where at least one surface of the nanocrystal is coated with a crystalline layer. While the inorganic capping agents may form ordered arrays on the surface of a nanocrystal these arrays differ from a core/shell crystalline layer, in part because the thickness of the array is dependent on the size of the inorganic capping agent not the concentration of reagent provided or the growth time of the layer.

The disclosed colloidal particles (inorganic capped nanoparticles) are soluble and/or suspendable in a solvent. Typically, the purification of chemicals requires some isolation procedure and for inorganic materials this procedure is often the precipitation of the inorganic product. The precipitation of inorganic products permits one of ordinary skill to wash the inorganic product of impurities and/or unreacted materials. The isolation of the precipitated inorganic products then allows for the selective application of those materials.

Moreover, the disclosed colloidal particles are isolable and dispersible, soluble or suspendable, in a variety of solvents. Manufacturing techniques, environmental and/or work-place rules often require the application of certain solvents. Colloidal materials dispersible in a variety of solvents are applicable for a broader use than those colloidal materials that require specific, toxic, environmentally hazardous, or costly solvents.

Solvents applicable herein include but are not limited to: 1,3-butanediol, acetonitrile, ammonia, benzonitrile, butanol, dimethylacetamide, dimethylamine, dimethylethylenediamine, dimethylformamide, dimethylsulfoxide, dioxane, ethanol, ethanolamine, ethylenediamine, ethyleneglycol, formamide, glycerol, methanol, methoxyethanol, methylamine, methylformamide, methylpyrrolidinone, pyridine, tetramethylethylenediamine, triethylamine, trimethylamine, trimethylethylenediamine, water, and mixtures thereof.

The above-described colloidal particles can be made by mixing the nanoparticle in form of powder, suspension or a colloidal solution with the inorganic capping agent in accordance with the techniques described herein. The mixing of the nanoparticle with the inorganic capping agent causes a reaction of the nanoparticle with the inorganic capping agent and rapidly produces insoluble and intractable materials. Herein a mixture of immiscible solvents is used to control the reaction of the nanoparticle with the inorganic capping agent. Immiscible solvents facilitate a rapid and complete exchange of the organic capping agents with the inorganic capping agents.

Generally, the inorganic capping agent is dissolved in a polar solvent, a first solvent, while the nanoparticle is dissolved in an immiscible, generally non-polar, solvent, a second solvent. These two solutions are then combined in a single vessel. Non-limiting examples of polar solvents include 1,3-butanediol, acetonitrile, ammonia, benzonitrile, butanol, dimethylacetamide, dimethylamine, dimethylethylenediamine, dimethylformamide, dimethylsulfoxide, dioxane, ethanol, ethanolamine, ethylenediamine, ethyleneglycol, formamide, glycerol, methanol, methoxyethanol, methylamine, methylformamide, methylpyrrolidinone, pyridine, tetramethylethylenediamine, triethylamine, trimethylamine, trimethylethylenediamine, water, and mixtures thereof. Non-limiting examples of non-polar solvents include pentane, pentanes, cyclopentane, hexane, hexanes, cyclohexane, heptane, octane, isooctane, nonane, decane, dodecane, hexadecane, benzene, 2,2,4-trimethylpentane, toluene, petroleum ether, ethyl acetate, diisopropyl ether, diethyl ether, carbon tetrachloride, carbon disulfide, and mixtures thereof; provided that the non-polar solvent is immiscible with the polar solvent. Other immiscible solvent systems that are applicable include aqueous-fluorous, organic-fluorous, and those using ionic liquids.

Without wishing to be bound by theory, it is thought that the nanoparticle reacts with the inorganic capping agent at or near the solvent boundary, the region where the two solvents meet, and a portion of the organic capping agent is exchanged/replaced with the inorganic capping agent. That is, the inorganic capping agent displaces an organic capping agent from a surface of the nanoparticle and the inorganic capping agent binds to the surface of the nanoparticle. Without wishing to be bound by theory, it is thought that this process continues until an equilibrium is established between the inorganic capping agent on a nanoparticle and the free inorganic capping agent. Preferably, the equilibrium favors the inorganic capping agent on a nanoparticle, although other equilibria are applicable for making mixed colloidal particles. The herein described immiscible solvent method of forming nanoparticles capped with inorganic capping agents has the added benefit of providing for the extraction of the organic capping agents from the inorganic capped nanocrystals.

The extraction of the organic capping agent can provide a solution of an inorganic capped nanocrystal that is substantially free of the organic capping agent. Herein, substantially free means the relative concentration of the organic capping agent to the nanoparticle in the solution of the inorganic capped nanocrystal is less than 10%, 5%, 4%, 3%, 2%, 1%, 0.5%, and/or 0.1% of the concentration in a solution of the organic capped nanocrystal. One means for determining if a solution is substantially free of the organic capping agent is IR spectroscopy and the observation of the absence of C—H stretching frequencies.

Figure 7:
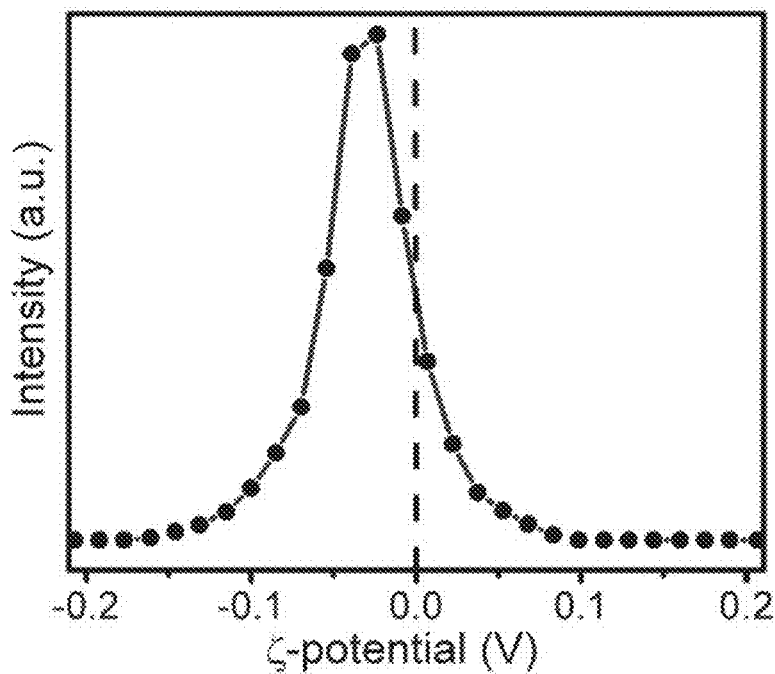
FIG. 7 is a plot of the ζ-potential measured for 5 nm $Au.Sn_2S_6$ showing a negative surface charge for the nanocrystal.
Figure 8:
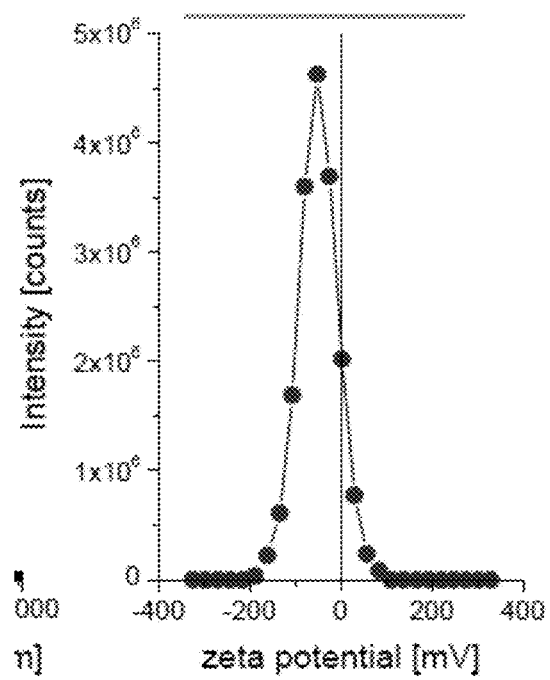
FIG. 8 is a plot of the ζ-potential measured for 5 nm $CdSe.Sn_2S_6$ showing a negative surface charge for the nanocrystal.

The benefit of this method can be easily understood through a non-limiting example of a CdSe nanoparticle and a $Sn_2Se_6^{2-}$ inorganic capping agent—a more detailed example is presented below. Typically, as-made CdSe is coated by a layer of organic capping agents and is soluble in non-polar solvents like hexane. The inorganic capping agent, $Sn_2Se_6^{2-}$, is soluble in polar solvents like dimethylsulfoxide (DMSO). DMSO and hexane are appreciably immiscible. Therefore, a hexane solution of CdSe rests above a DMSO solution of $Sn_2Se_6^{2-}$. Within a short time after combining the two solutions, the color of the hexane solution, due to the CdSe, will fade and the DMSO layer will become colored. Without wishing to be bound by theory, it is thought that this occurs because the organic capping agents are displaced by the inorganic capping agents and the resulting surface charged nanoparticle is then soluble in the polar DMSO solution. See, for example, FIGS. 7 and 8 which show a negative ζ-potential for $Sn_2S_6^{4-}$ capped Au and for $Sn_2S_6^{4-}$ capped CdSe nanocrystals indicative of a negative surface charge on the nanocrystals. Commonly, the uncharged organic capping agent is preferably soluble in the non-polar solvent and is thereby physically separated from the nanocrystals, affording the opportunity to remove all of the organic capping agent from the inorganic capped nanocrystal. This facile method of making inorganic capped nanoparticles allows for the selective precipitation of these colloidal particles, the selective precipitation of excess inorganic capping agent, or the direct use of the colloidal particle solution in the manufacture of films, crystals, or devices.

Examples of colloidal particles include $Au.AsS_3$, $Au.Sn_2S_6$, $Au.SnS_4$, $Au.Sn_2Se_6$, $Au.In_2Se_4$, $Bi_2S_3.Sb_2Te_5$, $Bi_2S_3.Sb_2Te_7$, $Bi_2Se_3.Sb_2Te_5$, $Bi_2Se_3.Sb_2Te_7$, $CdSe.Sn_2S_6$, $CdSe.Sn_2Te_6$, $CdSe.In_2Se_4$, $CdSe.Ge_2S_6$, $CdSe.Ge_2Se_3$, $CdSe.HgSe_2$, $CdSe.ZnTe$, $CdSe.Sb_2S_3$, $CdSe.SbSe_4$, $CdSe.Sb_2Te_7$, $CdSe.In_2Te_3$, $CdTe.Sn_2S_6$, $CdTe.Sn_2Te_6$, $CdTe.In_2Se_4$, $Au/PbS.Sn_2S_6$, $Au/PbSe.Sn_2S_6$, $Au/PbTe.Sn_2S_6$, $Au/CdS.Sn_2S_6$, $Au/CdSe.Sn_2S_6$, $Au/CdTe.Sn_2S_6$, $FePt/PbS.Sn_2S_6$, $FePt/PbSe.Sn_2S_6$, $FePt/PbTe.Sn_2S_6$, $FePt/CdS.Sn_2S_6$, $FePt/CdSe.Sn_2S_6$, $FePt/CdTe.Sn_2S_6$, $Au/PbS.SnS_4$, $Au/PbSe.SnS_4$, $Au/PbTe.SnS_4$, $Au/CdS.SnS_4$, $Au/CdSe.SnS_4$, $Au/CdTe.SnS_4$, $FePt/PbS.SnS_4$, $FePt/PbSe.SnS_4$, $FePt/PbTe.SnS_4$, $FePt/CdS.SnS_4$, $FePt/CdSe.SnS_4$, $FePt/CdTe.SnS_4$, $Au/PbS.In_2Se_4$, $Au/PbSe.In_2Se_4$, $Au/PbTe.In_2Se_4$, $Au/CdS.In_2Se_4$, $Au/CdSe.In_2Se_4$, $Au/CdTe.In_2Se_4$, $FePt/PbS.In_2Se_4$ $FePt/PbSe.In_2Se_4$, $FePt/PbTe.In_2Se_4$, $FePt/CdS.In_2Se_4$, $FePt/CdSe.In_2Se_4$, $FePt/CdTe.In_2Se_4$, $CdSe/CdS.Sn_2S_6$, $CdSe/CdS.SnS_4$, $CdSe/ZnS.SnS_4$, $CdSe/CdS.Ge_2S_6$, $CdSe/CdS.In_2Se_4$, $CdSe/ZnS.In_2Se_4$, $Cu.In_2Se_4$, $Cu_2Se.Sn_2S_6$, $Pd.AsS_3$, $PbS.SnS_4$, $PbS.Sn_2S_6$, $PbS.Sn_2Se_6$, $PbS.In_2Se_4$, $PbS.Sn_2Te_6$, $PbS.AsS_3$, $ZnSe.Sn_2S_6$, $ZnSe.SnS_4$, $ZnS.Sn_2S_6$, and $ZnS.SnS_4$. See for example, FIGS. 1-4. As used herein the denotation $Au.Sn_2S_6$ refers to a Au nanocrystal capped with a $Sn_2S_6$ inorganic capping agent. Charges on the inorganic capping agent are omitted for clarity. This nomenclature [nanocrystal].[inorganic capping agent] is used throughout this description. The specific percentages of nanoparticle and inorganic capping agent vary between the colloidal particles. For example, in one implementation, the energy dispersive X-ray (EDX) spectrum of a sample of $CdSe.Sn_2Se_6$ shows a composition that corresponds to approximately 95% CdSe nanocrystals and about 5% $Sn_2Se_6$. See FIG. 5. In another implementation, the EDX spectrum of $AuSn_2Se_6$ shows a composition that corresponds to approximately 90% Au nanocrystals and 10%

Figure 5:
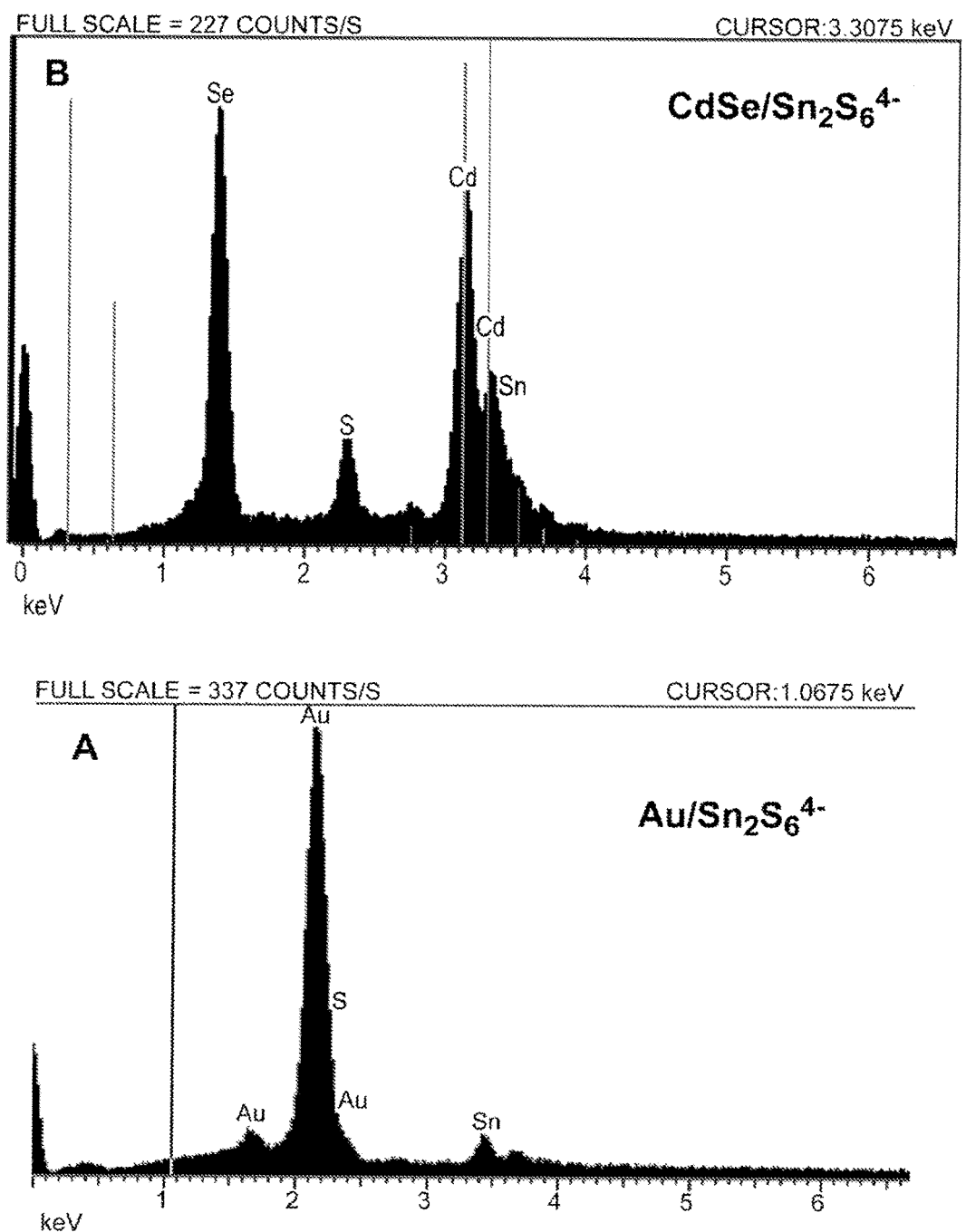

$Sn_2Se_6$. See FIG. 5. Without being bound to theory, the different percentages of $Sn_2Se_6$ observed in the samples in FIG. 5 are believed to correlate with the thio-affinity of the nanocrystal surface and surface area.

Figure 6:
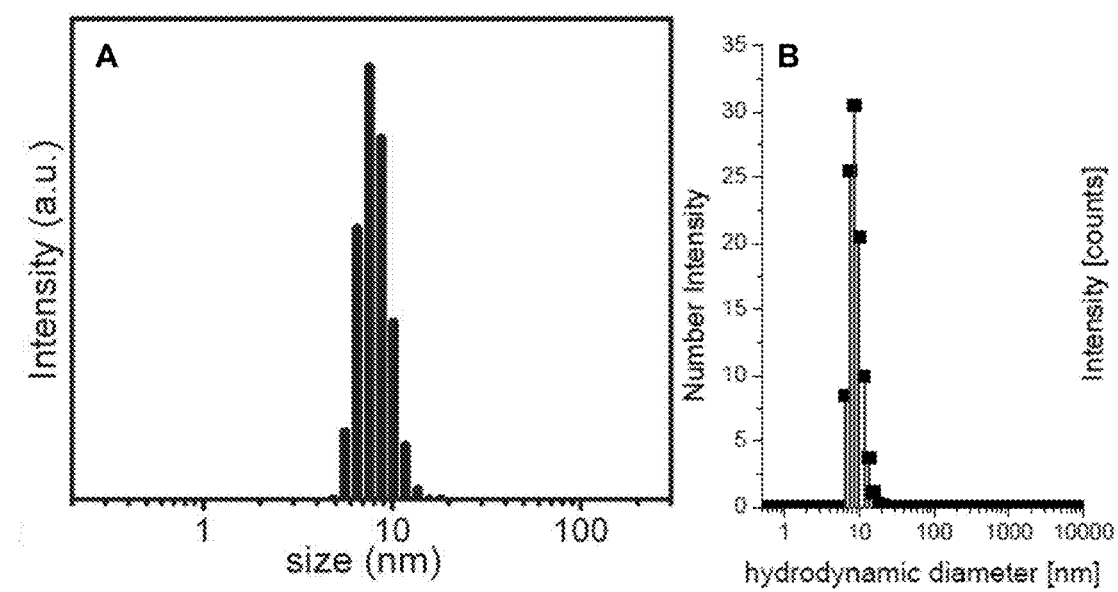
FIG. 6 is size-histograms of 5 nm $Au.Sn_2S_6$ (A, left) and 6 nm $CdSe.Sn_2S_6$ (B, right) nanocrystals obtained by dynamic light scattering showing a single-particle population (i.e., no aggregation) in a colloidal solution.

The described method does not affect the extent of aggregation of the colloidal particles. For example, dynamic light scattering shows that a sample of 5 nm Au nanoparticles coated with the inorganic capping agent $Sn_2S_6$ ($Au.Sn_2S_6$) can have an average hydrodynamic colloidal particle size of about 8 nm and show no aggregation. See FIG. 6. Similarly, a sample of 6 nm CdSe nanoparticles coated with the inorganic capping agent $Sn_2S_6$ ($CdSe.Sn_2S_6$) has an average colloidal particle size of about 8 nm and shows no aggregation. See FIG. 6.

Likewise, the described method does not affect the optical absorbance of the capped nanoparticles. FIG. 9 shows a white light photograph of colloidal particles prepared from 3.6 nm CdSe nanocrystals. The color of the samples (indicative of the electronic characteristics of the nanocrystal) did not significantly change when the CdSe is capped with different inorganic capping agents. Similarly, a single inorganic capping agent, here $Sn_2S_6^{4-}$, can cap a wide variety of nanoparticles, see e.g., FIG. 9. FIG. 10 shows that the herein described colloidal particles are stable and soluble in a variety of solvents and that the electronic characteristics of the underlying nanoparticle are neither changed by the presence of the inorganic capping agent nor the solvent. Had the electronic characteristics of the nanoparticle been affected by the solvent then the optical absorption of the nanoparticle would have changed. See also FIG. 12.

Furthermore, the photoluminescence of the nanoparticle is preserved when capped with an inorganic capping agent. FIG. 11 shows photoluminescence under UV excitation and lists quantum yields from a sample of $CdSeSn_2S_6$ in different solvents. See FIG. 12 for a white light photograph of the same samples. Similarly, FIG. 12 includes a series of plots of the photoluminescence of a sample of $CdSe.Sn_2S_6$ in different solvents showing that the emission maximum does not significantly change between solvents.

Moreover, the above described method can be adapted to make a wide variety of colloidal particles. Adaptations of the method include adding two different inorganic capping agents to a single nanoparticle (e.g., $Au.(Sn_2S_6;In_2Se_4)$; $Cu_2Se.(In_2Se_4;Ga_2Se_3)$), adding two different nanoparticles to a single inorganic capping agent (e.g., $(Au;CdSe).Sn_2S_6$; $(Cu_2Se;ZnS).Sn_2S_6$), adding two different nanoparticles to two different inorganic capping agents (e.g., $(Au;CdSe).(Sn_2S_6;In_2Se_4)$), and/or additional multiplicities.

The sequential addition of inorganic capping agents to a nanoparticle is available under the disclosed method. Depending, for example, upon concentration, nucleophilicity, capping agent to nanoparticle bond strength, and crystal face dependent capping agent to nanoparticle bond strength, the inorganic capping of the nanoparticle can be manipulated to yield other combinations. For example, assume that a nanoparticle has two faces, face A and face B, and that the bond strength of the organic capping agent to face A is twice that of the bond strength to face B. The organic capping agents on face B would be preferentially exchanged when employing the herein described methodology. Isolation and reaction of this intermediate species, having organic and inorganic capping agents, with a second inorganic capping agent would produce a colloidal particle with a first inorganic capping agent on face B and a second inorganic capping agent on face A. Alternatively, the preferential binding of inorganic capping agents to specific nanoparticle faces can yield the same result from a single mixture of multiple inorganic capping agents.

Another aspect of the disclosed method is the possibility of a chemical reactivity between inorganic capping agents. For example, a first inorganic capping agent bound to the surface of a nanocrystal and reactive with a second inorganic capping agent can directionally react with the second inorganic capping agent. This methodology provides for the synthesis of colloidal particles that could not be selectively made from a solution of nanoparticle and inorganic capping agents. The interaction of the first inorganic capping agent with the nanoparticle controls both the direction and scope of the reactivity of the first inorganic capping agent with the second inorganic capping agent. Furthermore, this methodology controls what part of the new inorganic capping agent binds to the nanocrystal. Presumably, the result of the addition of a combined-inorganic capping agent capping to a nanocrystal by other methods would produce a random arrangement of the combined-inorganic capping agent on the nanocrystal.

Yet another method of making colloidal particles involves the mixing of a nanoparticle in a non-polar organic solvent with a purified colloidal particle in a polar organic solvent. In this example, the colloidal particle in the polar solvent is the inorganic capping agent. These methodologies can form colloidal particle capped nanoparticles and other variations on the herein described capping architecture.

Still another aspect of the current disclosure is the bridging of colloidal particles with metal ion complexing agents. See FIG. 24. Herein bridging means that one or more metal ions individually bind, ionically or covalently, binding sites on the exterior of a plurality of colloidal particles. Preferably, binding sites are parts of the inorganic capping agent that is disposed perpendicular to a surface on the nanoparticle. Understanding that the bridging between two colloidal particles can involve a plurality of metal ions, for descriptive purposes the binding of a single metal ion between two colloidal particles is exemplified herein. As described above, inorganic capping agents include anionic and neutral capping agents. When, for example, anionic inorganic capping agents are bound to the surface of a nanoparticle, the anionic charge associated with the inorganic capping agent remains (providing a theoretical basis for electrostatic repulsion between colloidal particles having anionic inorganic capping agents). The addition of a cationic ion, preferably a cationic metal ion, still more preferably a polycationic (wherein the charge on the metal ion is greater than 1) metal ion to the colloidal particle can produce a colloidal particle with the cationic ion bound to a surface of the colloidal particle, specifically to the inorganic capping agent. Additionally, the cationic ion can bind to the surface of a second colloidal particle thereby bridging between the two colloidal particles. Preferably, the cationic ion is a transition metal ion, a main group ion, a lanthanide ion, or an actinide ion. More preferably, the cationic ion is selected from those ions that can impart advanced electronic, magnetic (e.g., $Mn^{2+}$, $Co^{2+}$), or photophysical properties on the bridged colloidal particles. Still more preferably the cation ion is $Pt^{2+}$, $Zn^{2+}$, $Cd^{2+}$, $Mn^{2+}$, $Mn^{3+}$, $Eu^{2+}$, $Fe^{2+}$, $Fe^{3+}$, $Co^{2+}$, $Ge^{4+}$, $Cu^{2+}$, $Cu^+$, $Pb^{2+}$, $Bi^{3+}$, $Sb^{3+}$, $In^{3+}$, $Ga^{3+}$, $Au^+$, $Au^{3+}$, $Ag^+$, $Sn^{2+}$, $Sn^{4+}$, or $Hg^{2+}$. A descriptive drawing of the bridging of a colloidal particle with a cation ion is shown in FIG. 24. When the addition of the cationic ion to the colloidal particle is conducted on a scale wherein there is a multiplicity of colloidal particles, the binding and bridging of the colloidal particles is termed a polycondensation reaction. Herein, a controlled polycondensation reaction yields colloidal materials. Moreover, the selection of cationic ion and polycondensation reaction conditions allows for control of the three-dimensional structure of the colloidal material. Without being bound by theory, these polycondensation reactions are envisioned as behaving analogously to molecular self-assembled three-dimensional arrays.

Another aspect of the current disclosure is the isolation of the colloidal particles as colloidal materials. As used herein, colloidal materials are samples of the herein described colloidal particle in a solid form. The form can be ordered or disordered. The nanoparticle may have a crystalline, that is, ordered internal structure but the precipitation of the colloidal particles may produce a random (disordered) arrangement of particles. Alternatively, the controlled dissolution or spontaneous self-assembly of the colloidal particles can yield ordered arrays of particles.

The careful deposition of thin layers of colloidal arrays can yield ordered arrays dependent on the packing of the colloidal particle in three dimensional space. As non-limiting examples, the deposition of colloidal particles of nanocrystals that are roughly spherical has yielded hexagonal close-packed arrays of colloidal particles or cubic close-packed arrays of colloidal particles. See FIGS. 3, 4, 25, and 26. Such selective deposition of colloidal particles has advanced materials applications for which the selection of the nanoparticle and the ordering of the three dimensional array can change, for example, the physical, magnetic, optical and/or electronic characteristics of the material.

Nanocrystals of different size and functionality (e.g. noble metals, semiconductors, oxides, magnetic alloys) can be induced to self-assemble into ordered binary superlattices retaining the size tunable properties of their constituents. A variety of binary superlattices can be built from monodisperse PbS, PbSe, CoPt$_3$, Fe$_2$O$_3$, Au, Ag, Pd and the like nanocrystals, mixing and matching these nanoscale building blocks to yield multifunctional nanocomposites. See, for example, FIG. 26. Superlattices with AB, AB$_2$, AB$_3$, AB$_4$, AB$_5$, AB$_6$ and AB$_{13}$ stoichiometry with cubic, hexagonal, tetragonal and orthorhombic symmetries can be formed. Assemblies with the same stoichiometry can be produced in several polymorphous forms by tailoring the particle size and deposition conditions. Binary superlattices can be isostructural with NaCl, CuAu, CsCl, AlB$_2$, MgZn$_2$, MgNi$_2$, Cu$_3$Au, Fe$_4$C, CaCu$_5$, CaB$_6$, NaZn$_{13}$ and cub-AB$_{13}$ and other compounds emphasizing the parallels between nanoparticle assembly and atomic scale crystal growth.

The deposition of layers of the colloidal particles to make colloidal material thin films is another aspect of the current disclosure. See FIG. 35. Depending on the desired application or the available resources, multiple film deposition methodologies are available. One method that is applicable to form colloidal material thin films is a reverse Langmuir-Blodgett technique. Herein the insolubility of the colloidal particle in nonpolar solvents permits the monolayer deposition of films of the colloidal particle on a substrate. Multiple application of the Langmuir-Blodgett technique can be employed to grow multilayer films of the colloidal particle or mixed layer films of colloidal particles.

A second applicable technique for the deposition of layers of the colloidal particles to make colloidal material thin films is spin coating. Here a solution of the colloidal particle is applied to a substrate and the substrate and solution are rapidly rotated to leave a thin layer of the solution on the substrate, this solution is then dried leaving the colloidal material thin film. Herein, the use of multiple solvents described above provide control in the manufacture of these films. The wetting of the substrate by the colloidal particle solution is an important factor in achieving uniform thin films and the ability to apply the colloidal particle in a variety of different solvents enhances the commercial applicability of this technique. One method to achieve uniform wetting of the substrate surface is to match the surface free energy of the substrate with the surface tension of the liquid (colloidal particle solution). Theoretically, the perfect wetting of a substrate by a colloidal particle solution would yield a uniform colloidal material thin film on the substrate.

Additional techniques for the deposition of layers of the colloidal particles to make colloidal material thin films include doctor blading, spin coating, spray coating, spray pyrolysis, dipping/dip-coating, sputtering, printing, inkjet printing, stamping and the like and combinations of spray coating, spray pyrolysis dipping, sputtering, printing and the like with spin coating.

In another embodiment, colloidal material can be produced through the bridging of the colloidal particles with complexing agents thereby forming complexed colloidal particles and/or complexed colloidal materials; a distinction that is dependent, in part, on the amount of complexing agent employed. By way of an illustrative example, in one embodiment, complexed colloidal particles can be formed by the addition of a complexing agent to a colloidal particle. Examples of complexed colloidal particles include but are not limited to combinations of a cationic ion-complexing agent and an anionic colloidal particle. The herein described colloidal particle can complex with, for example, transition metal cations, transition metal cation complexes, main group cations, and the like. Examples of complexing agents include chromium, manganese, iron, cobalt, nickel, copper, zinc, ruthenium, rhodium, palladium, silver, cadmium, osmium, iridium, platinum, gold, and mercury cations, e.g., Pt$^{2+}$, Zn$^{2+}$, Cd$^{2+}$, Mn$^{2+}$, Mn$^{3+}$, Eu$^{2+}$, Fe$^{2+}$, Fe$^{3+}$, Co$^{2+}$, Ge$^{4+}$, Cu$^{2+}$, Cu$^+$, Pb$^{2+}$, Bi$^{3+}$, Sb$^{3+}$, In$^{3+}$, Ga$^{3+}$, Au$^+$, Au$^{3+}$, Ag$^+$, Sn$^{2+}$, Sn$^{4+}$, and Hg$^{2+}$. With sufficient complexing agent the resultant material, complexed colloidal material, can be insoluble and described as a polymeric material. See FIG. 24.

In another embodiment, the complexed colloidal material is formed by the alternating addition of a substrate to a solution of colloidal particles and to a solution of complexing agent. In this embodiment, the substrate, preferably, has a sufficient affinity for the first material, whether colloidal particles or complexing agents, such that a layer of the first material uniformly deposits on the surface of the substrate. Examples of substrates wherein the colloidal particle could be the first material include but are not limited to mono or multilayers of copper, silver, gold, nickel, palladium, platinum, alloys, and amalgams thereof. Generally for complexed colloidal materials, when a colloidal particle has sulfur, selenium, and or tellurium atoms on the exposed surface (the outermost surface of the colloidal particle) thiophilic substrates can be employed. Herein, thiophilic means having a thermodynamic preference for binding to sulfur, selenium, and/or tellurium. Examples of thiophilic substrates include monolayers, multilayers, or bulk amounts of silver, gold, and other known thiophilic substrates.

Another substrate applicable when the first material is a neutral or anionic colloidal particle is a positively charged substrate. Substrates made from glass, sapphire, quartz, silicon, or other solid materials can be manipulated to have a positive charge through many known methods. For example, the chemical treatment of a substrate with an amine functionalized siloxane can produce a positively charged surface on the substrate.

Still another embodiment of complexed colloidal materials includes the combination of cationic polymers with the colloidal particle. For example, an alternating dip coating process can be employed to build layers of a cationic polymer and a colloidal particle. See FIG. 35. As with the embodiments described above, the first material added to a substrate can be either a cationic polymer or a colloidal particle. Known methods to form films of polymers on substrates are applicable herein and often a substrate is first coated with the polymer. Examples of polymers include the polyquaternium polymers, e.g., poly(diallyldimethylammonium) chloride (polyquaternium-6 (CAS#: 26062-79-3); PDDA) and polyethyleneimine (PEI). The alternating dip coating can include repetitively, dipping a substrate in a first solution, rinsing the substrate, dipping the substrate in a second solution, and rinsing the substrate. Non-limiting examples of Layer-by-Layer assemblies made by this method include 10, 20, and 30 layer films of $CdSe/ZnS.SnS_4$ and PDDA, and 10, 20, and 30 layer films of $Au.SnS_4$ and PDDA. A substrate prior to any dipping can preferentially bind the colloidal particle thereby the first solution is a solution having the colloidal particle dispersed therein. Additional combination procedures are available, for example first spin coating a substrate with a solution of a colloidal particle then dipping the substrate in a solution of a cationic ion and then repeating.

Complexed colloidal materials can further yield ordered arrays. See FIGS. 25-26. For example the complexing agent can be a non-polymeric material. One applicable type is cationic amines ($NR^1R^2R^3R^{4+}$) and phosphines ($PR^1R^2R^3R^{4+}$) with aliphatic substituents, for example, where at least one R group has a $C_6$, $C_7$, $C_8$, $C_9$, $C_{10}$, $C_{11}$, $C_{12}$, $C_{13}$, $C_{14}$, $C_{15}$, $C_{16}$, $C_{18}$, $C_{20}$, $C_{22}$, $C_{24}$, $C_{26}$, $C_{28}$, $C_{30}$, or $C_{40}$ alkyl chain. One operative example is the dimethylbisdodecylammonium cation $(N(CH_3)_2(C_{12}H_{25})_2^+)$. The addition of the cationic amine or phosphine can be by a biphasic transfer of the colloidal particle form a polar solvent into a non-polar solvent. One operative example includes the dissolution of a dodecylammonium $Sn_2S_6$ salt in a non-polar solvent and the dissolution of $CdSe.Sn_2S_6$ in a polar solvent. The cation exchange can transfer the colloidal particle into the non-polar solvent.

Another technique wherein the ability to select the solvent in which the colloidal material is dissolved and from which it is deposited is ink-jet deposition. Ink-jet deposition often requires the ability to adjust liquid surface tensions to applicable ranges. One easy method for adjusting the surface tension of a liquid containing colloidal particles is the blending or mixing of a multiplicity of solvents.

Yet another application of the present disclosure is the deposition of colloidal particles to make non-thin film solids. Herein, the described colloidal particles are deposited by bulk techniques to yield three dimensional solids. Known bulk deposition techniques include pressing of powders, growth of three-dimensional ordered arrays, painting, printing, and the like, e.g., the hot pressing of colloidal materials to yield colloidal matrices and/or alloys.

Examples of colloidal materials that have been formed through the present techniques include $Au.Sn_2S_6$, $Au.Sn_2Se_6$, $Au.In_2Se_4$, $Au.AsS_3$, $Pd.AsS_3$, $CdSe.Sn_2S_6$, $CdSe.SnS_4$, $CdSe.SnTe_4$, $CdSe.Sn_2Te_6$, $CdSe.In_2Se_4$, $CdSe.Ge_2S_6$, $CdSe.Ge_2Se_3$, $CdSe.HgSe_2$, $CdSe.ZnTe$, $CdSe.Sb_2S_3$, $CdSe.SbSe_4$, $CdSe.Sb_2Te_7$, $CdSe.In_2Te_3$, $CdSe/CdS.Sn_2S_6$, $CdSe/CdS.Ge_2S_6$, $CdSe/CdS.In_2Se_4$, $CdSe/CdS.Sn_2S_6$, $CdSe/ZnS.Sn_2S_6$, $Bi_2Se_3.Sb_2Te_4$, $PbS.AsS_3$, $PbS.SnS_4$, $PbS.Sn_2S_6$, $PbS.Sn_2Se_6$, $PbS.In_2Se_4$, $PbS.Sn_2Te_6$, $PbS.AsS_3$, $PbTe.SnTe_4$, $FePt.Sn_2S_6$, and the like. As used herein the notation for the colloidal materials is the same as the notation for the colloidal particles because the colloidal materials described herein are solid state samples including the herein described colloidal particles.

Still another aspect of the techniques described above for the production or deposition of colloidal materials is the production or deposition of mixed, colloidal particle, solids. These hetero-colloidal materials comprise a plurality of colloidal particles in the resulting solid material. Similar to the disclosure above, multiple techniques can be used to produce hetero-colloidal materials. Non-limiting examples include, mixing of colloidal particles in a solvent followed by deposition of a hetero-colloidal material, alternating deposition of colloidal material films to produce a layered hetero-colloidal material, multispray coating of a substrate, and blending of colloidal material solids followed by pressing into a cohesive material.

One example of the hetero-colloidal materials described herein is a binary superlattice. Binary superlattices are those organized structures wherein the three-dimensional packing of two different nanoparticles produces an ordered structure. Multiple physical and chemical characteristics can facilitate the production of binary superlattices, for example, nanoparticle size, nanoparticle shape, and nanoparticle Coulombic potential. This assembly of two different colloidal particles into a binary superlattice is a general and inexpensive method to produce multiple hetero-colloidal materials with precise control of the chemical composition and physical properties. See FIG. 26.

Yet another aspect of the current disclosure is the thermal treatment of the herein described colloidal materials. As discussed above, many of the inorganic capping agents are precursors to inorganic materials (matrices) and low-temperature thermal treatment of these inorganic capping agents provides a gentle method to produce crystalline films from these materials. The thermal treatment of colloidal materials yields, for example, ordered arrays of nanoparticles within an inorganic matrix, hetero-alloys, or alloys. In at least one embodiment herein, the thermal treatment of the colloidal material includes heating to a temperature less than about 350, 300, 250, 200, and/or 180° C.

Still another aspect of the current disclosure is a low mass/volume loss on thermal treatment. The herein described colloidal materials lose less than about 20%, 15%, 10%, and/or 5% of their mass, as determined by thermogravimetric analysis (TGA), upon a thermal treatment up to about 400 and/or 450° C. For example, $CdSe/ZnS.Sn_2S_6$ loses about 5% of its mass upon heating to about 450° C., whereas the $(NH_4)_4Sn_2S_6$ used as the inorganic capping agent for the colloidal particle loses about 30% of its mass over the same temperature range. See FIG. 37.

As used herein, colloidal matrices are arrays of nanoparticles within an inorganic matrix. Generally, the inorganic matrix separates the nanoparticles. The inorganic matrix can be a glass, a solid, or a crystalline material. Additionally, in ordered arrays, the order of the array of nanoparticles can be short range or long range. Very dilute samples of nanoparticles in the inorganic matrix are expected to have lower relative ordering than concentrated samples wherein the nanoparticles may be ordered prior to and preferably after the formation of the inorganic matrix.

Colloidal matrices can be homo-colloidal matrices or hetero-colloidal matrices and can be produced as thin films, films, coatings, and/or solids. A homo-colloidal matrix is a colloidal matrix having one species of nanoparticle and an inorganic matrix derived from a single inorganic capping agent. Non-limiting examples of homo-colloidal matrices include $SnS_2(Au)$, $SnS_2(CdSe)$, $SnS_2(CdSe/CdS)$, and $SnS_2(PbS)$. See FIGS. 13-15. As used herein the denotation $SnS_2(Au)$ refers to Au nanocrystals in a matrix having the approximate formula $SnS_2$. A hetero-colloidal matrix is a colloidal matrix having, for example, a multiplicity of nanoparticle species in an inorganic matrix derived from a single inorganic capping agent, or one species of nanoparticle in an inorganic matrix derived from a multiplicity of inorganic capping agents. One example of the latter hetero-colloidal matrix is the matrix produced by thermally treating a mixture of $CdSe.Sn_2S_6$ and $CdSe/CdS.Sn_2S_6$, denoted $SnS_2(CdSe;CdSe/CdS)$.

Additional embodiments of hetero-colloidal matrices include those formed by selective deposition of colloidal materials in confined spatial arrangements followed by thermal treatment to form the inorganic matrix. The layered, structured, or patterned deposition of a plurality of colloidal materials followed by thermal treatment to form an inorganic matrix can create solid-state architectures that are not available by other known methodologies. One illustrative example of the present embodiment is the patterned deposition of $CdSe.Sn_2S_6$ nanoparticles followed by the patterned deposition of $Au.Sn_2S_6$. The thermal treatment of this illustrative example can produce three distinct material regions within a single inorganic matrix derived from $Sn_2S_6^{4-}$, that is, this patterned colloidal matrix will include regions of matrix encapsulated CdSe nanoparticles, regions containing a matrix encapsulated mixture of CdSe and Au nanoparticles, and regions of matrix encapsulated Au nanoparticles.

The colloidal matrices can be produced in thin films, films, coatings, solids and/or mixed solids. Moreover, the colloidal matrices can be produced in bulk, layered, structured, or patterned arrangements on a substrate. Additionally, the procedure described herein can yield colloidal matrices that effectively preserve the electronic characteristics of the nanoparticle after thermal treatment. FIG. 15 shows the optical absorbance spectrum of thin films of an organic capped CdSe (CdSe.(organic capping agent(s))), an inorganic capped CdSe ($CdSe.Sn_2S_6$), and a CdSe colloidal matrix ($SnS_2(CdSe)$). The absorption at approximately 600 nm is apparent in all samples and is characteristic of the presence of the CdSe nanocrystal.

Another embodiment of the materials and methods disclosed herein is an alloy made from a nanoparticle and an inorganic capping agent. Alloys are continuous homogeneous phases of a composition and herein alloys are produced by the thermal treatment of the disclosed colloidal particles. Similar to the colloidal matrices, the formulation of the alloy is dependent on the nanoparticle and inorganic capping agent. Unlike the colloidal matrices, the formation of the alloy involves the destructive reaction of the inorganic capping agent, and/or optionally additional reagent(s), with the nanoparticle, herein a destructive reaction means the nanoparticle loses at least one aspect of its defining physical characteristic, examples include size, shape, photoactivity, formulation, and the like. Non-limiting examples include the formation of a $Cd_xSn_ySe$, alloy from $CdSe.Sn_2S_6$ colloidal particles; the formation of a $CuInSe_2$ alloy from any one of the following colloidal particles: $Cu_2Se.In_2Se_3$, $Cu_2Se.In_2Se_4$, $Cu_2S.In_2Se_3$, and/or $Cu_2S.In_2Se_4$, the formation of a $CuZnSnS_4$ alloy from a mixture of $Cu_2S.Sn_2S_6$ and $ZnS.Sn_2S_6$; and the formation of $Cu_2In_{1-x}Ga_xSe_2$ (e.g., $Cu_2In_{0.5}Ga_{0.5}Se_2$ and $Cu_2In_{0.9}Ga_{0.1}Se_2$) alloy from $Cu_2Se.$ ($In_2Se_4;Ga_2Se_3$). See FIGS. 40A&B.

Generally, the formation of an alloy requires some atom mobility during the thermal treatment phase and processing conditions can and often do affect the formation of an alloy. The incomplete alloying of the disclosed materials, whether purposefully or serendipitously, yields a hetero-alloy. As used herein, hetero-alloys are solid state materials formed from the thermal treatment of a colloidal material that is characterized by a multiplicity of domains, wherein the domains may have different formulations and/or crystal structures and/or crystallinity. Whether a thermal treatment of a colloidal material forms an alloy or a hetero-alloy is often difficult to determine, but, without being bound by theory, it is believed that a lower temperature thermal treatment limits atom mobility and therefore prohibits the formation of a homogeneous phase (alloy).

Representative, non-limiting, examples of the formation of what are believed to be hetero-alloys are the thermal treatment of $Bi_2S_3.Sb_2Te_7$ nanorods to form a $Bi_{1.3}Sb_{0.7}Te_3$ hetero-alloy, see FIGS. 16-21 and 27-29.

The structure of the resulting alloy or hetero-alloy is dependent on the formulation of the colloidal particle. For example, a $Bi_{2-x}Sb_xTe_3$ alloy or hetero-alloy made from a colloidal material that has a high Bi:Sb ratio has a significantly smaller crystal domain than a $Bi_{2-x}Sb_xTe_3$ alloy or hetero-alloy made from a colloidal material that has a low Bi:Sb ratio. See FIG. 19. Not only do the two materials have different crystal domain sizes, EDS spectra indicate that the relative concentration of Bi in the latter sample is indeed lower than in the former. See FIG. 19. This comparative example indicates that multiple hetero-alloys can be produced from identical starting materials and that the relative composition of the alloy can be controlled by selective synthesis of the precursor colloidal material. See FIG. 18.

Often the differences between the materials herein described as colloidal matrices and as hetero-alloys are difficult to determine experimentally. Furthermore, the process for forming these materials may affect the nature of the resultant materials. While time and temperature are well known to affect the formation of alloys herein phase solubility can further affect the formation of a homogeneous phase. For example, PbTe is largely insoluble in $Sb_2Te_3$. See FIGS. 31-33. The resultant material from the thermal processing of $PbTe.Sb_2Te_3$ can be described as either a hetero-alloy or a colloidal matrix depending on the structure of the PbTe in the final material, still further the resultant material can be comprised of both a hetero-alloy and a colloidal matrix.

One reaction condition that may affect the characteristics of the resultant materials is the relative concentration of the nanoparticle. The dilution in the solid phase of the nanoparticle in an excess of the inorganic capping agent can lead to smaller nanoparticles in the resultant material. As the relative concentration of the nanoparticle increases, the inter-particle interactions can increase and the size and nature of the nanoparticle can change. See FIG. 34. At an extreme, the concentration of the nanoparticle can be sufficiently high that the resultant materials can be a phase corresponding to the composition (or reaction product) of the nanoparticle and optionally include phase corresponding to the composition of the inorganic capping agent. Without being bound to theory, it is believed that Ostwald ripening can affect the phases in the materials.

The reactive loss of a chalcogenide can further facilitate the formation of colloidal matrices, alloys, and/or hetero-alloys. When, for example, thermodynamics favor the formation of selenides or tellurides over sulfides the reactive loss of sulfur can facilitate the formation of selenium and/or tellurium based materials. This reactive loss of chalcogenide can be facilitated by the addition of an excess of a selenium or tellurium containing inorganic capping agent and/or through the addition of an excess of selenium or tellurium. Non-limiting examples include the thermal processing of $Cu_2S.In_2Se_3$ and/or $Cu_2S.In_2Se_4$ where selenium reacts to displace sulfur, see FIG. 39; and $Bi_2S_3.Sb_2Te_7$, $Bi_2S_3$.($Sb_2Te_3$:Te), $Bi_2S_3.Sb_xTe_y$, and/or $PbS.Sb_xTe_y$, wherein X is a value of either 1 or 2 and Y is a value from 3 to 10, where tellurium reacts to displace sulfur and yield telluride materials. This technique is remarkably facile and especially useful when the selenium or tellurium nanocrystals are inaccessible due to thermal, stability, or other limitations.

Similar to the disclosure above where multiple inorganic capping agents can be employed, selenides or tellurides can be doped into the formation of colloidal matrices, alloys or heteroalloys by reactive loss of a chalcogenide. In one embodiment, selenium can be doped into a reaction that provides a telluride colloidal matrix, alloy or heteroalloy by reactive loss of sulfur by the addition of an amount of selenide-containing inorganic capping agent to the colloidal material. In a similar embodiment, tellurium can be doped into a selenide colloidal matrix, alloy or heteroalloy by reactive loss of sulfur by the addition of an amount of telluride-containing inorganic capping agent to the colloidal material. By way of a non-limiting example, selenium can be doped into a tellurium containing alloy by the addition of an amount of the selenium-containing inorganic capping agent $Sb_2Se_3$ to the colloidal particle $Bi_2S_3.Sb_2Te$, or $Bi_2S_3$.($Sb_2Te_3$;$Sb_2Se_3$), the admixture can then be thermally processed to form an n-doped $Bi_{2-x}Sb_xTe_{3-y}Se_y$. See FIGS. 28-29.

The balancing of thermal stability against reactivity can yield materials where some nanocrystals react and others alloy. For example, mixing the processes of alloying and hetero-alloying ion capped $Bi_2S_3.Sb_2Te_3$ and $PbTe.Sb_2Te_3$ yields a $(PbTe)(Bi_{2-x}Sb_xTe_3)$ hetero-alloy. See FIG. 30. Similarly, the thermal processing of a colloidal material that comprises a mixture of $Au.Sb_2Te_3$ and $Bi_2S_3.Sb_2Te_3$ yields a $(Au)(Bi_{2-x},Sb_xTe_3)$ heteroalloy where discrete Au nanocrystals can be observed in the TEM images. See FIG. 34.

Typically, the colloidal materials, colloidal matrices, and alloys are fabricated by a deposition on a substrate. Suitable examples of substrates include but are not limited to silicon, amorphous hydrogenated silicon, silicon carbide, silicon dioxide, silicon nitride, aluminum oxide, aluminum nitride, carbon, hydrogenated carbon, gallium nitride, gallium arsenide, germanium, silicon-germanium, indium tin oxide, boron carbide, boron nitride, borosilicate, cerium oxide, tin oxide, zinc titanate, a glass, a metal, an organic semiconductor, a polymeric material or a combination thereof. Examples of organic semiconductors and/or polymeric materials include polycarbonates, poly(3-hexylthiophene), poly(p-phenylene vinylene), poly(9,9'-dioctylfluorene-co-benzothiadiazole) ("F8BT"), poly(9,9'-dioctylfluorene-co-bis-N,N'-(4-butylphenyl)-bis-N,N'-phenyl-1,4-phenylenediamine), poly(9,9'-dioctylfluorene-co-bis-N,N'-(4-butylphenyl)diphenylamine) ("TFB"), poly(4,4'-oxydiphenylene-pyromellitimide) ("Kapton"), polyethylene terephthalate (e.g., "Mylar"), poly(paraphenylene terephthalamide) (e.g., "Kevlar"), polyacetylenes, and the like. Furthermore, substrates can be planar or nonplanar.

Yet another embodiment of the materials and methods disclosed herein is the deposition of colloidal matrices, alloys, or hetero-alloys on a surface to form an advanced material, a printed circuit, a photovoltaic cell, a piezoelectric crystal, a thermoelectric layer, an optoelectronic layer, a light emitting diode, a ferroelectric layer, a thin film transistor, a floating gate memory device, a phase change layer, a sensor device, detectors of light, X-ray and gamma-radiation, an imaging device, and the like. See FIG. 22. The colloidal materials disclosed herein are applicable for the printing or deposition of colloidal matrices, alloys, or hetero-alloys through the application and, optionally, heating of the colloidal material on a substrate. Representative examples of the application of the disclosed colloidal materials include sputter deposition, electrostatic deposition, spray deposition, spin coating, inkjet deposition, laser printing (matrices), and the like. An alternative method of deposition is the electrochemical deposition of a colloidal matrix from a solution of a colloidal material.

The low temperature formation of the colloidal matrix, alloy, or hetero-alloy makes the disclosed methodology compatible with photolithographic patterning, for example, wherein a photolithographic applied substrate mask is removed after the thermal treatment of the colloidal material.

Another aspect of the disclosed materials and methods is the formation of materials that exhibit enhanced thermoelectric properties; that is the direct conversion of a thermal gradient to electrical energy. Thermoelectric energy conversion is an all-solid-state effect that converts thermal gradients directly to electrical energy without an electromechanical generator. The derived voltage and power, work, drains the heat from the location of the thermal gradient. Materials that display thermoelectric energy conversion are useful in heat pumps, power generators, and thermoelectric coolers. Thermoelectric devices have no moving parts and therefore have advantages in reliability, silent operation, high power density, and high efficiency for moderate power applications. In addition, thermoelectric materials can be used for cooling by driving current through the material.

The efficiency of thermoelectric generators is limited to a fraction of the generators' Carnot efficiency determined by the thermoelectric figure of merit, zT:

$$zT=T(S^2\sigma)/\kappa$$

where S is the thermoelectric power, the Seebeck coefficient of the material, $\sigma$ is the electrical conductivity of the material, $\kappa$ is the thermal conductivity of the material, and T is the absolute temperature. The higher zT, the more efficient the material is at converting heat to electricity. All current commercial thermoelectric materials have figures of merit of approximately 1.

The materials and methods described herein are applicable for the manufacture of high zT thermoelectric materials and devices. $Bi_{2-x}Sb_xTe_3$ is a thermoelectric material easily manufactured by the disclosed methods. Moreover, as theoretical studies suggest that an increase in the phonon scattering at the domain boundaries increases the thermoelectric figure of merit and the domain boundaries in the disclosed $Bi_{2-x}Sb_xTe_3$ material are dependent on the annealing process and the size of the nanoparticle, the thermoelectric figure of merit in the disclosed materials is tunable. Preferably, the thermoelectric figure of merit, zT, for the $Bi_{2-x}Sb_xTe_3$ material is greater than 0.7, 1, 1.5, 2, and/or 3.

EXAMPLES

The following examples are provided to illustrate the invention, but are not intended to limit the scope thereof.

Example 1

Aqueous $NH_4OH$ solution (8 mL, 28-30% of $NH_3$) was mixed with aqueous $(NH_4)_4Sn_2S_6$ (0.5 mL, ~0.1 M) or Na$_4$SnS$_4$ (0.3 mL, ~0.1 M). Hexane (6 mL) and toluene solution of 3-10 nm CdSe or 6.5-nm CdSe/ZnS NCs (1 mL, ~25 mg/mL) were added to the same vial and the mixture was vigorously stirred until the phase transfer of NCs from the organic phase into aqueous phase was completed. The aqueous phase was rinsed 3 times with hexane and filtered through a 0.45-μm PTFE filter. In order to separate the excess amount of inorganic capping agents, a minimal amount of acetonitrile was added to precipitate the colloidal particles. The colloidal particles were collected by centrifuging, redispersed in water and centrifuged/filtered to remove traces of insoluble materials, if any.

Example 2

5 mL formamide were mixed with 0.4 mL Na$_4$Sn$_2$S$_6$ in FA (0.05 M), hexane (5 mL) and 8-nm CdSe NCs in toluene (0.4 mL, 40 mg/mL) and stirred until the phase-transfer of CdSe NCs was completed. formamide phase was washed with hexane 3 times, filtered and mixed with acetonitrile (1:1 v/v) to precipitate colloidal particles. After centrifuging, colloidal particles were redissolved in 5 mL formamide. Similar procedure was also applied for 3-10 nm PbS, 5-nm Au and 4-nm FePt NCs. The reaction can be facilitated by heating solutions to 70° C.

Example 3

In a glovebox, 5 mL formamide (vacuum dried at 100° C.) was mixed with 0.5-1 mL K$_4$SnTe$_4$ in formamide (0.1 M), 6 mL anhydrous hexane, and the toluene solution of either CdSe, CdTe or PbTe NCs (1 mL, ~25 mg/mL) and stirred until the completion of transfer of NCs into the formamide phase. After the organic phase was discarded, the colloidal particle solution was rinsed 3 times with hexane, filtered, mixed with acetonitrille (1:5 v/v) to precipitate the colloidal particles and to remove excessive K$_4$SnTe$_4$. NCs were isolated by centrifuging and redispersed in formamide, DMSO, DMF or methanol.

Example 4

A solution of (N$_2$H$_5$)$_4$Sn$_2$S$_6$ in ethanolamine was diluted with DMSO. This DMSO solution was added to a hexane solution of CdSe nanocrystals. The mixture was vigorously stirred, while NH$_3$ was purged through the solution. The completion of the reaction, as determined by the transfer of color from the hexane to the DMSO, was complete within about 20 minutes. Then the hexane phase was removed, the DMSO solution was washed with hexane, and the product (CdSe.Sn$_2$S$_6$) isolated from the DMSO or used in situ.

Representative examples of Colloidal Particles that have been made by the methodology of Example 1 and illustrated in the following table:

| Nanoparticle | Inorganic Capping Agent | Comments |
| --- | --- | --- |
| Au nanocrystals | Sn$_2$S$_6^{4-}$, Sn$_2$Se$_6^{4-}$, AsS$_3^{3-}$, In$_2$Se$_4^{2-}$ | Form fcc superlattices, highly conductive. |
| CdSe quantum dots | Sn$_2$S$_6^{4-}$, Sn$_2$Te$_6^{4-}$, AsS$_3^{3-}$, In$_2$Se$_4^{2-}$, Ge$_2$S$_6^{4-}$, (N$_2$H$_4$)$_x$Ga$_2$Se$_3$, HgSe$_2^{2-}$, (N$_2$H$_4$)$_2$ZnTe, Sb$_2$S$_4^{2-}$, Sb$_2$Se$_4^{2-}$, Sb$_2$Te$_4^{4-}$, (N$_2$H$_4$)$_x$In$_2$Te$_3$ | Form short-range ordered assemblies, conductive, n-type transport, materials with distributed donor-acceptor junctions |
| CdSe/CdS core-shell nanocrystals | AsS$_3^{3-}$, Sn$_2$S$_6^{4-}$, Ge$_2$S$_6^{4-}$ | Strong excitonic photoluminescence in solution and films |
| CdSe/CdS nanorods | AsS$_3^{3-}$, Sn$_2$S$_6^{4-}$, In$_2$Se$_4^{2-}$ | Strong photoluminescence, Liquid crystalline nematic ordering |
| CdSe/CdS nano-tetrapods | Sn$_2$S$_6^{4-}$, In$_2$Se$_4^{2-}$ | Strong photoluminescence |
| CdSe nanowires | AsS$_3^{3-}$, Sn$_2$S$_6^{4-}$, In$_2$Se$_4^{2-}$ | N-conductive nematic phases |
| Bi$_2$S$_3$ nanorods | Sb$_2$Te$_4^{2-}$ | Highly conductive Bi$_2$Te$_3$/Sb$_2$Te$_3$ nanocomposites |
| PbS quantum dots | AsS$_3^{3-}$, Sn$_2$S$_6^{4-}$, Sn$_2$Se$_6^{4-}$, In$_2$Se$_4^{2-}$, Sn$_2$Te$_6^{4-}$, Sn$_2$Te$_7^{4-}$ | Conductive, p- and n-type transport |
| PbTe quantum dots | AsS$_3$, Sb$_2$Te$_7^{4-}$, Sn$_2$S$_6^{4-}$, Sn$_2$Se$_6^{4-}$, In$_2$Se$_4^{2-}$, SnTe$_4^{4-}$ | Conductive, p- and n-type transport |
| Pd nanocrystals | Sn$_2$S$_6^{4-}$, AsS$_3$ | |
| ZnS nanocrystals | Sn$_2$S$_6^{4-}$ | |
| Cu$_2$S nanocrystals | Sn$_2$S$_6^{4-}$, In$_2$Se$_4^{2-}$ | |
| Cu$_2$Se nanocrystals | Sn$_2$S$_6^{4-}$, In$_2$Se$_4^{2-}$ | |

Example 5

Under an inert atmosphere, a solution of (N$_2$H$_5$)$_4$Sb$_2$Te$_7$ in hydrazine was combined with a hexane solution of Bi$_2$S$_3$ nanorods. The mixture was stirred for approximately 3 hours and then the hexane layer was decanted from the mixture. The product solution, generally black in color, was washed four times with hexane, filtered, and then stored under an inert atmosphere.

Example 6

Employing the procedure in Example 5 a series of Bi$_2$S$_3$.Sb$_2$Te$_7$ samples can be prepared where the Bi to Sb ratio is changed. First a stock solution of Sb$_2$Te$_7^{4-}$ in hydrazine was prepared. The amount of the stock solution used depended on the desired ratio but for all samples the stock solution was combined with excess hydrazine to produce an approximately constant volume of the inorganic capping agent solution. Varying amounts of Bi$_2$S$_3$ nanorods were dissolved in a constant volume of hexane and then added to the inorganic capping agent solution according to Example 5. The following ratios of Bi to Sb were prepared: 5% Bi/95% Sb; 20% Bi/80% Sb; 40% Bi/60% Sb; 60% Bi/40% Sb; 95% Bi/5% Sb.

After washing and filtration, the samples were dried by evaporation of hydrazine under a stream of $N_2$. The silver-black solids were annealed at 350° C. under $N_2$ and the metallic powder analyzed. See FIGS. 16-20 and 27-29.

Example 7

A highly-doped silicon wafer with a 100 nm thick thermal silicon oxide gate dielectric was patterned with bottom Ti/Au electrodes on the silicon oxide by photolithography. This wafer was washed with acetone, isopropanol, and ethanol, then plasma cleaned in air for 30 min. Under inert atmosphere, the wafer was covered with several drops of the solution prepared in Example 5. The sample was allowed to stand for 20 min and then was spun according to the following series of steps: 1) spun at 450 rpm for 20 s; 2) spun at 900 rpm for 20 s; 3) spun up to 4000 rpm within 20 s; and then 4) spun at 4000 rpm for 20 s. The wafer, coated with a mirror-like film, was heated to 350° C. for 90 min to anneal the composite.

Substrates were freshly hydrophilized by 15-min treatment with oxygen plasma. The colloidal particle was then deposited by drop-casting at 80° C. or by spray-coating. The homogeneity and thickness of the drop-cast films were adjusted by controlling the volume and the concentration of colloidal particle in a solution. 1-10% v/v DMSO were usually added to $N_2H_4$ solutions to improve homogeneity of drop-cast films. For spray coating, glass substrates were placed on a hot plate at 100-200° C., while a $(Bi,Sb)_2Te_3$ NC-ink solution was applied at a sprayer pressure of 15-20 psi using $N_2$ as a carrier gas. The film thickness was adjusted by the number of applied spraying cycles, typically 5 to 80. As-deposited $(Bi,Sb)_2Te_3$ films were heated at 300° C./hour and annealed at 300° C. for 15 min, followed by slow cooling to room temperature.

Colloidal particles and more particularly colloidal matrices formed using techniques as described herein may be formed into various semiconductor materials and structures.

When two or more metallic or semiconducting nanoparticles are in close proximity to each other, their wavefunctions can couple together forming states delocalized over several nanocrystals or propagating throughout the entire nanocrystalline solid. The quantum mechanical coupling energy can be approximated as $$\beta \sim h\Gamma \sim \exp\{-(2m^*\Delta E/\hbar^2)^{1/2}\Delta x\},$$

where h is Planck's constant, $\Gamma$ is the tunneling rate between two nanocrystal neighbors, m* is the carrier effective mass, $\Delta E$ and $\Delta x$ are the height of the tunneling barrier and the shortest edge-to-edge distance between the nanocrystals, respectively. As a result, it was explored whether the present techniques could replace the bulky insulating hydrocarbon chains between nanocrystals with much smaller and more conductive inorganic capped nanoparticles to significantly facilitate electron sharing between colloidal particles. Specifically, the coupling between colloidal particles formed herein was analyzed by optical absorption and charge transport measurements. Thus, for 4.6 nm CdSe nanoparticles capped with conventional hydrocarbon ligands the absorption spectra of colloidal solutions and close-packed films are very similar to each other, indicative of strong localization of electron and hole wave functions on individual nanoparticles as shown in FIG. 13. In contrast, the excitonic features in close-packed films of CdSe nanoparticles capped with $Sn_2S_6^{4-}$ showed a pronounced 46 meV red shift compared to individual nanoparticles in solution, as shown in FIG. 15. Such a shift implies partial leakage of the wave functions into neighboring nanoparticles that relaxes the quantum confinement. Conversion of the $Sn_2S_6^{4-}$ ligands to $SnS_2$ at 180° C. lowers the barrier heights, $\Delta E$, leading to an additional 34 meV red shift of the optical transitions in the nanoparticle solid, while maintaining excitonic features and quantum confinement, as shown in FIG. 13. Similarly, Au nanoparticles capped with $Sn_2S_6^{4-}$ showed a pronounced plasmonic absorption peak around 535 nm in solution which completely disappeared in nanocrystal films (FIG. 23A), indicating strong delocalization of the electronic states. Note that all observed spectral changes were reversible—the plasmonic peak appeared again after redissolution of the nanoparticles film. The reference samples of dodecanethiol capped Au nanoparticles showed strong plasmonic absorption in solutions and in close-packed films (FIG. 23B).

To examine charge transport, highly doped Si wafers with a 110 nm thick layer of thermal oxide and lithographically patterned Ti/Au electrode structures were used. The Si substrate was used as the back gate electrode for field-effect transistor (FET) measurements. Close packed nanoparticle films were deposited on these substrates by spin-coating or dropcasting. The film thickness was measured using AFM profiles and cross-sectional SEM studies. The amount of the inorganic capping agent was kept below 10 wt %, sufficient to provide colloidal stabilization but insufficient to form any continuous conductive channels of phase-separated metal chalcogenide, as evidenced by XRD studies.

The original organic ligands rendered nanoparticle films highly insulating with conductivities ($\sigma$) on the order of $\sim 10^{-9}$ S cm$^{-1}$ for 5 nm Au nanocrystals (NCs) (FIG. 14) and less than $10^{-12}$ S cm$^{-1}$ for 5.5 nm CdSe nanoparticles. Replacing dodecanethiol ligands with $Sn_2S_6^{4-}$ increased the conductivity of Au NC solids by ~11 orders of magnitude approaching $\sigma \sim 200$ S cm$^{-1}$ (FIG. 14). After electrical measurements the film could be easily dissolved in hydrazine or $H_2O$. Comparison of TEM images before and after electrical measurements revealed no changes in nanoparticle size and shape, ruling out sintering as a possible reason for the observed very high conductivity. The TEM analysis revealed a strong decrease in the mean interparticle distance from ~1.6 nm for dodecanethiol-capped Au nanoparticles to less than 0.5 nm for $Sn_2S_6^{4-}$-capped Au particles (FIGS. 4A, 4B, and 4C).

In particular, inorganic capping agent-capping of colloidal particles is a promising approach to designing solution-processed inorganic semiconductors. FIGS. 13 and 36 show characteristics of a field-effect transistor with a channel assembled of 4.5 nm CdSe nanoparticles capped with $Sn_2S_6^{4-}$ and and annealed for a short time at 200° C. An n-type gate effect with current modulation $I_{on}/I_{off} \sim 10^5$ was observed along with an electron mobility $\mu \sim 3 \times 10^{-2}$ cm$^2$V$^{-1}$ s$^{-1}$ in the saturation regime. Compared to other CdSe nanoparticles, inorganic capping agent-capped CdSe NCs enabled appreciable performance of solid state FETs while retaining optical and electronic tunability provided by the quantum confinement. Furthermore, illumination of the inorganic capping agent-capped CdSe nanoparticles increased their conductivity by several orders of magnitude, as shown for $Sn_2Se_6^{4-}$-capped CdSe NCs (FIG. 13).

Close-packed films (colloidal materials) of colloidal particles can be deposited on highly doped Si wafers with 110 nm thick layer of thermal oxide and back-gate geometry by spin-coating and then aluminum electrodes are deposited on the film using a shadow mask. The total amount of inorganic capping agent in the colloidal materials was less than about 10 wt % of the colloidal materials; at this weight percentage the inorganic capping agent can provide colloidal stabilization but does not form a continuous conductive matrix of phase-separated metal chalcogenide (FIG. 38b). The deposited close-packed films can be annealed at 200° C. for about 0.5~1 hr. After annealing, the conductivity of films made from CdSe.In$_2$Se$_3$ dramatically increased. The current between source and drain electrodes (I$_D$) could be modulated by applying voltage to the gate terminal (V$_G$). I$_D$ increased with increasing V$_G$, typical for n-type conductivity through FET channel (FIGS. 38c,d). The field effect mobility ($\mu_{lin}$) estimated from the slope of I$_D$ vs V$_G$ plot (FIG. 38d) was significantly improved as 11.32~15.3 cm$^2$/Vs and the I$_{ON}$/I$_{OFF}$ ratio was ~1×10$^3$. With out being bound to theory, it is believed that the wave functions of the colloidal materials with physically-smaller inorganic capping agents can strongly couple and form short-range and/or long-range delocalized electronic structure. The quantum mechanical coupling energy can be approximated as $\beta \approx h\Gamma \approx \exp\{-2(2m^*\Delta E/\hbar^2)^{1/2}\Delta x\}$, where h is Planck's constant, $\Gamma$ is the tunneling rate between two nanocrystal neighbors, m* is the carrier effective mass, $\Delta E$ and $\Delta x$ are the height of tunneling barrier and the shortest edge-to-edge distance between the nanoparticles, respectively. Replacement of bulky insulating hydrocarbon chains with much smaller and more conductive inorganic capping agents theoretically reduces both the tunneling barrier and edge-to-edge distances and promotes favorable electronic communication between nanoparticles. Furthermore, conversion of the In$_2$Se$_4$$^{2-}$ inorganic capping agent to In$_2$Se$_3$ at 200° C. lowers the barrier heights, $\Delta E$, leading to an additional red shift of the optical transitions in the annealed material, while maintaining the excitonic features and quantum confinement (FIG. 38e).

In the previous examples, inorganic capping agents behaved as electronically transparent "glue" for nanoparticles. However, inorganic capping agents can also be used for creating composite materials where the properties of the inorganic capping agent and nanoparticle components complement each other. Thermal decomposition of the hydrazinium-based inorganic capping agents, for example, was shown to generate various chalcogenide phases with n- and p-type conductivity, and phase-change properties. For example, combining electron-conducting nanowires (e.g., CdS) with hole-conducting hosts (e.g., CuIn$_{1-x}$Ga$_x$Se$_2$) can form materials with distributed networks of p-n junctions. It is also possible to create new phases through solid-state reactions between nanoparticles and inorganic capping agents. As an example, a highly conductive Bi$_{2-x}$Sb$_x$Te$_3$ film was fabricated using Bi$_2$S$_3$ nanorods and a soluble Sb$_2$Te$_3$—N$_2$H$_4$ complex containing an excess of Te. Upon heating to 180° C., the inorganic capping agent decomposed into Sb$_2$Te$_3$ releasing free tellurium which immediately reacted with the Bi$_2$S$_3$ phase (Bi$_2$S$_3$+3Te→Bi$_2$Te$_3$+3S), leading to the formation of a nanocrystalline Bi$_{2-x}$Sb$_x$Te$_3$ composite phase (see, e.g., FIG. 22), presumably with Bi- and Sb-rich nanometer scale regions. The original Bi$_2$S$_3$ nanorods capped with oleic acid were highly insulating ($\sigma$~5×10$^{-10}$ S cm$^{-1}$). However, spin-coated films of inorganic capping agent-capped Bi$_2$S$_3$ nanorods dried at 60° C. showed conductivity of 0.074 S cm$^{-1}$, which increased to 22 S cm$^{-1}$ upon formation of a Bi$_{1.3}$Sb$_{0.7}$Te$_3$ nanocomposite at 180° C. (FIG. 28). A film of oleic-acid capped Bi$_2$S$_3$ nanorods annealed at 180° C. showed a much lower conductivity of $\sigma$~4×10$^{-5}$ S cm$^{-1}$. Solid solutions and quantum well superlattices of Bi$_2$Te$_3$ and Sb$_2$Te$_3$ are known as superior materials for thermoelectrics. Therefore, such materials can be formed into various thermoelectric materials.

Fresh solution of Bi$_2$S$_3$.Sb$_2$Te$_7$ nanorods in hydrazine (NC-inks) were used for solution deposition of uniform TE films. Spin-casting can generate smooth and continuous thin films (10-50 nm thick, FIG. 28A); however, thicker films are required for practical TE applications. Therefore, further comparative studies were conducted on either drop-cast and spray-coated samples fabricated on glass substrates. Both techniques readily produce 0.1-0.4 µm thick films, with low surface roughness of 10-50 nm (FIG. 28B). Sample compositions were adjusted to Bi$_{1.2}$Sb$_{0.8}$Te$_3$ with ±10% batch-to-batch variations. All samples were annealed at 300° C. I-V curves for each sample with gold electrodes showed high conductivity and excellent linearity over the entire range of applied voltages. The measured conductivities for drop-cast films spread in a broad range from 30 to 200 S cm$^{-1}$, depending upon the concentration of cracks and other structural defects. In contrast, spray-coated samples on average showed higher conductivities of 200-450 S cm$^{-1}$ at room temperature (FIG. 28C). Thermopower measurements revealed p-type conductivity and Seebeck coefficients of ~170-250 µV/K (FIG. 28D). Unlike electrical conductivity which is very sensitive to homogeneity of the sample, thermopower is an inherent material property and is reproducible within ±10% for the series of same-formulated samples. Our values of S are similar to the previously reported value (~210 µV/K) for the bulk (Bi,Sb)$_2$Te$_3$ generated by hot-pressing ball-milled nanopowders, and this is currently the best bismuth-telluride material with conductivity in excess of 1000 S cm$^{-1}$ and ZT=1.2 at room temperature. Our solution-processed samples compare quite favourably with the vacuum-deposited thin film Bi—Te materials, which are naturally less conductive than bulk materials. Representative literature examples include flash-evaporated n-type Bi—Te-based thin films ($\sigma$~540 S cm$^{-1}$), flash-evaporated Bi$_{0.6}$Sb$_{1.5}$Te$_3$ thin films ($\sigma$~550 S cm$^{-1}$), co-evaporated Bi$_2$Te$_3$ thin films ($\sigma$~166 S cm$^{-1}$, 770 S cm$^{-1}$), and sputtered Bi—Sb—Te thin films ($\sigma$~70-200 S cm$^{-1}$).

Example 8

Using the procedure in Example 4, formamide solutions of Cu$_2$Se.Sn$_2$S$_6$ and ZnS.Sn$_2$S$_6$ were prepared. These solutions were admixed at an approximate 2:1 atomic ratio for Cu to Zn and the amount of Sn$_2$S$_6$ was adjusted to an approximate 1:1 atomic ratio for Zn to Sn. The deposition solution was drop-cast onto a hydrophilized glass substrate. The cast colloidal material was then thermally processed at 600° C. for 2 h. The powder X-ray diffraction pattern of the as-made alloy matches the diffraction pattern for CZTS (JCPDS no. 26-0575), Cu$_2$ZnSnS$_4$. See FIG. 41. The composition of the as-made alloy is believed to contain selenium and have the approximate formula Cu$_2$ZnSn(S,Se)$_4$.

Example 9

Samples of platinum bridged CdSe.Sn$_2$Se$_6$ and platinum bridged CdSe.Sn$_2$S$_6$ were prepared by warming solutions of the respective colloidal particles in formamide to 80° C. To these solutions, solutions of K$_2$PtCl$_4$ in formamide were added. From these solutions the colloidal materials Pt[CdSe.Sn$_2$Se$_6$] and Pt[CdSe.Sn$_2$S$_6$] precipitated. The colloidal materials were then isolated and washed with a solvent, e.g., formamide and/or water, capable of removing any free ionic species.

Example 10

A hydrazine solution of In$_2$Se$_3$—Se (49 µL; 0.25M) was diluted with 1.5 mL N$_2$H$_4$ in a 6 mL vial. Then 1 mL of 5 mg/mL $Cu_2Se$ in toluene and 1 mL extra toluene were added to the vial. The two-phase mixture was vigorously stirred at room temperature for 4 hours. The upper (toluene) phase was discarded and the bottom (hydrazine) phase was washed 3 times with 2 mL toluene. Afterwards, 21 µL of a $Ga_2Se_3$ solution (0.25M in hydrazine) was added to the washed colloidal particle solution (here the In/Ga ratio is approximately 7/3). The deposition of the colloidal particles $\{Cu_2Se.[(In_2Se_4)_{0.7};(Ga_2Se_3)_{0.3}]\}$, evaporation of the solvent, and thermal annealing yielded pure copper indium-gallium selenide, as confirmed by XRD studies. See FIG. 40.

Example 11

Using the procedure of Example 10, a solution of $CuInSe_2.In_2Se_4$ is made from $CuInSe_2$ and $In_2Se_4^{2-}$. Deposition and thermal processing of the colloidal particles yields copper indium diselenide films where mass lost during thermal processing is less than about 5%, as determined by TGA.

The foregoing description is given for clearness of understanding only, and no unnecessary limitations should be understood therefrom, as modifications within the scope of the invention may be apparent to those having ordinary skill in the art.

What is claimed is:

1. A solution comprising a colloidal particle and a solvent, wherein the colloidal particle comprises an inorganic capping agent bound to a surface of a nanoparticle; wherein the inorganic capping agent comprises a Zintl ion and is substantially free of an organic capping agent, and the solution is substantially free of an organic capping agent.

2. The solution of claim 1, wherein the solvent is selected from a group consisting of water, dimethylsulfoxide, formamide, methylformamide, ethanolamine, dimethylformamide, benzonitrile, 1,3-butanediol, butanol, dimethylacetamide, dioxane, methoxyethanol, methylpyrrolidinone, pyridine, ethyleneglycol, glycerol, methanol, ethanol, triethylamine, dimethylamine, methylamine, ammonia, triethylamine, tetramethylethylenediamine, trimethylethylenediamine, dimethylethylenediamine, ethylenediamine, acetonitrile, and a mixture thereof.

3. The solution of claim 1, wherein the solvent is substantially free of hydrazine.

4. The solution of claim 1, wherein the inorganic capping agent is selected from a group consisting of a polyatomic anion, a soluble metal chalcogenide, a soluble polyatomic metal chalcogenide anion, and a mixture thereof.

5. The solution of claim 1, wherein the inorganic capping agent further comprises an ion selected from the group consisting of $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $Bi_7^{3-}$, $GaTe^{2-}$, $Ge_9^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_4^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $Sn_2S_6^{4-}$, $Sn_2Se_6^{4-}$, $Sn_2Te_6^{4-}$, $Sn_2Bi_2^{2-}$, $Sn_8Sb^{3-}$, $Te_2^{2-}$, $Te_3^{2-}$, $Te_4^{2-}$, $Tl_2Te_2^{2-}$, $TlSn_8^{3-}$, $TlSn_8^{5-}$, $TlSn_9^{3-}$, $TlTe_2^{2-}$, and a mixture thereof.

6. The solution of claim 1, wherein the inorganic capping agent further comprises a metal selected from the group consisting of a transition metal, a lanthanide, an actinide, a main group metal, a metalloid, and a mixture thereof.

7. The solution of claim 1, wherein the inorganic capping agent further comprises a soluble metal chalcogenide selected from the group consisting of molecular compounds derived from $CuInSe_2$, $CuIn_xGa_{1-x}Se_2$, $Ga_2Se_3$, $In_2Se_3$, $In_2Te_3$, $Sb_2S3$, $Sb_2Se_3$, $Sb_2Te_3$, ZnTe, and a mixture thereof.

8. The solution of claim 1, wherein the nanoparticle is selected from the group consisting of a nanocrystal, a nanorod, a nanowire, and a mixture thereof.

9. The solution of claim 1, wherein the nanoparticle is selected from a group consisting of AlN, AlP, AlAs, Ag, Au, Bi, $Bi_2S_3$, $Bi_2Se_3$, $Bi_2Te_3$, CdS, CdSe, CdTe, Co, CoPt, $CoPt_3$, Cu, $Cu_2S$, $Cu_2Se$, $CuInSe_2$, $CuIn_{(1-x)}Ga_x(S,Se)_2$, $Cu_2ZnSn(S,Se)_4$, Fe, FeO, $Fe_2O_3$, $Fe_3O_4$, FePt, GaN, GaP, GaAs, GaSb, GaSe, Ge, HgS, HgSe, HgTe, InN, InP, InSb, InAs, Ni, PbS, PbSe, PbTe, Pd, Pt, Ru, Rh, Si, Sn, ZnS, ZnSe, ZnTe, Au/PbS, Au/PbSe, Au/PbTe, Ag/PbS, Ag/PbSe, Ag/PbTe, Pt/PbS, Pt/PbSe, Pt/PbTe, Au/CdS, Au/CdSe, Au/CdTe, Ag/CdS, Ag/CdSe, Ag/CdTe, Pt/CdS, Pt/CdSe, Pt/CdTe, Au/FeO, $Au/Fe_2O_3$, $Au/Fe_3O_4$, Pt/FeO, $Pt/Fe_2O_3$, $Pt/Fe_3O_4$, FePt/PbS, FePt/PbSe, FePt/PbTe, FePt/CdS, FePt/CdSe, FePt/CdTe, CdSe/CdS, CdSe/ZnS, InP/CdSe, InP/ZnS, InP/ZnSe, InAs/CdSe, InAs/ZnSe, and a mixture thereof.

10. A method of making a colloidal particle comprising admixing a solution of an inorganic capping agent in a first solvent and a solution of a nanoparticle in a second solvent, wherein the second solvent is appreciably immiscible in the first solvent,
wherein the colloidal particle comprises the inorganic capping agent bound to a surface of the nanoparticle; and the inorganic capping agent comprises a Zintl ion and is substantially free of an organic capping agent.

11. The method of claim 10, wherein the first solvent and the second solvent are substantially free of hydrazine.

12. The method of claim 10 further comprising isolating the colloidal particle from the second solvent.

* * * * *